United States Patent
Ichihashi et al.

(10) Patent No.: US 10,907,094 B2
(45) Date of Patent: Feb. 2, 2021

(54) PYRROMETHENE-BORON COMPLEX, COLOR CONVERSION COMPOSITION, COLOR CONVERSION FILM, LIGHT SOURCE UNIT, DISPLAY, AND ILLUMINATION APPARATUS

(71) Applicant: Toray Industries, Inc., Tokyo (JP)

(72) Inventors: Yasunori Ichihashi, Otsu (JP); Kazuki Kobayashi, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 16/463,171

(22) PCT Filed: Nov. 21, 2017

(86) PCT No.: PCT/JP2017/041865
§ 371 (c)(1),
(2) Date: May 22, 2019

(87) PCT Pub. No.: WO2018/101129
PCT Pub. Date: Jun. 7, 2018

(65) Prior Publication Data
US 2019/0345380 A1 Nov. 14, 2019

(30) Foreign Application Priority Data

Nov. 30, 2016 (JP) .................................. 2016-232257
Jul. 28, 2017 (JP) .................................. 2017-146290

(51) Int. Cl.
| H01L 33/50 | (2010.01) |
| H01L 51/54 | (2006.01) |
| C09K 11/06 | (2006.01) |
| C07F 5/02 | (2006.01) |
| C09K 11/02 | (2006.01) |
| G09F 9/33 | (2006.01) |

(52) U.S. Cl.
CPC .............. C09K 11/06 (2013.01); C07F 5/022 (2013.01); C07F 5/027 (2013.01); C09K 11/02 (2013.01); H01L 33/502 (2013.01); C09K 2211/1007 (2013.01); C09K 2211/1018 (2013.01); G09F 9/33 (2013.01)

(58) Field of Classification Search
CPC .................................................... H01L 33/502
See application file for complete search history.

(56) References Cited

U.S. PATENT DOCUMENTS

| 4,916,711 | A | 4/1990 | Boyer et al. |
| 5,326,692 | A | 7/1994 | Brinkley et al. |
| 5,446,157 | A | 8/1995 | Morgan et al. |
| 6,106,999 | A | 8/2000 | Ogiso et al. |
| 2008/0076044 | A1 | 3/2008 | Mizukawa et al. |
| 2008/0254319 | A1* | 10/2008 | Hosokawa ............. C09K 11/06 428/704 |
| 2012/0037890 | A1* | 2/2012 | Okuda .................... C07F 5/022 257/40 |
| 2013/0252000 | A1* | 9/2013 | Takiff ...................... C07F 5/022 428/412 |
| 2016/0200970 | A1* | 7/2016 | Sakurai .................. A61B 90/39 252/478 |
| 2016/0272884 | A1 | 9/2016 | Kim et al. |
| 2017/0260212 | A1 | 9/2017 | Lee et al. |
| 2018/0134952 | A1 | 5/2018 | Ichinashi et al. |
| 2018/0186817 | A1 | 7/2018 | Lee et al. |
| 2018/0375058 | A1* | 12/2018 | Kawamura ......... H01L 51/5072 |

FOREIGN PATENT DOCUMENTS

| JP | 02196865 A | 8/1990 |
| JP | 08509471 A | 10/1996 |
| JP | 11043491 A | 2/1999 |
| JP | 11315268 A | 11/1999 |
| JP | 11352685 A | 12/1999 |
| JP | 11352686 A | 12/1999 |

(Continued)

OTHER PUBLICATIONS

Taiwanese Office Action for Taiwan Application No. 106141154, dated May 20, 2020, 5 pages.
Burghart et al., "3,5-Diaryl-4,4-difluoro-4-bora-3a,4a-diaza-s-indacene (BODIPY) Dyes: Synthesis, Spectroscopic, Electrochemical, and Structural Properties", J. Org. Chem., 1999, vol. 64, No. 21—pp. 7813-7819.
International Search Report and Written Opinion for International Application No. PCT/JP2017/041865, dated Dec. 12, 2017—7 pages.
Japanese Notification of Reasons for Refusal for Japanese Application No. 2017-561423, dated Apr. 25, 2018 with translation—6 pages.

(Continued)

Primary Examiner — Moazzam Hossain
(74) Attorney, Agent, or Firm — RatnerPrestia

(57) ABSTRACT

A pyrromethene-boron complex is a compound represented by general formula (1).

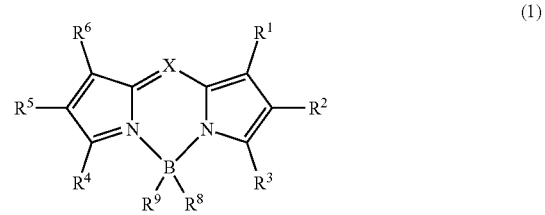

(1)

In general formula (1), X is C—$R^7$ or N. $R^1$ to $R^9$ are each a group selected from prescribed groups, where $R^2$ and $R^5$ are selected from among the groups other than a substituted or unsubstituted aryl group and a substituted or unsubstituted heteroaryl group. $R^2$ and $R^5$ are groups not containing a heteroaryl group with at least two condensed rings. At least one of $R^1$ to $R^6$ is a group containing a fluorine atom.

25 Claims, 2 Drawing Sheets

(56) References Cited

FOREIGN PATENT DOCUMENTS

| | | |
|---|---|---|
| JP | 2000208262 A | 7/2000 |
| JP | 2001164245 A | 6/2001 |
| JP | 2002317175 A | 10/2002 |
| JP | 2002348568 A | 12/2002 |
| JP | 2004002851 A | 1/2004 |
| JP | 2007273440 A | 10/2007 |
| JP | 2008083416 A | 4/2008 |
| JP | 2009031713 A | 2/2009 |
| JP | 2010018788 A | 1/2010 |
| JP | 2010159411 A | 7/2010 |
| JP | 2011241160 A | 12/2011 |
| JP | 2012022028 A | 2/2012 |
| JP | 2014136771 A | 7/2014 |
| JP | 6299870 B2 | 3/2018 |
| KR | 20170049360 A | 5/2017 |
| TW | 201708415 A | 3/2017 |
| WO | 2015022977 A1 | 2/2015 |
| WO | 2015064864 A1 | 5/2015 |
| WO | 2016108411 A1 | 7/2016 |
| WO | 2017073923 A1 | 5/2017 |

OTHER PUBLICATIONS

Kollmannsberger et al., "Electrogenerated Chemiluminescence and Proton-Dependent Switching of Fluorescence: Functionalized Difluoroboradiaza-s-indacenes", Angew. Chem., Int. Ed. Engl., vol. 36, 1997—pp. 1333-1335.

* cited by examiner

PYRROMETHENE-BORON COMPLEX, COLOR CONVERSION COMPOSITION, COLOR CONVERSION FILM, LIGHT SOURCE UNIT, DISPLAY, AND ILLUMINATION APPARATUS

CROSS REFERENCE TO RELATED APPLICATIONS

This is the U.S. National Phase application of International Application No. PCT/JP2017/041865, filed Nov. 21, 2017, which claims priority to Japanese Patent Application No. 2016-232257, filed Nov. 30, 2016 and Japanese Patent Application No. 2017-146290, filed Jul. 28, 2017, the disclosures of each of these applications being incorporated herein by reference in their entireties for all purposes.

FIELD OF THE INVENTION

The present invention relates to a pyrromethene-boron complex, a color conversion composition, a color conversion film, a light source unit, a display, and an illumination apparatus.

BACKGROUND OF THE INVENTION

The application of multi-coloring technology using a color conversion technique to a liquid crystal display, an organic electroluminescent display, an illumination apparatus, and the like is being actively studied. The term color conversion refers to the conversion of light emitted from a light-emitting body to light with a longer wavelength, e.g., the conversion of blue emission light to green emission light or red emission light. A composition having this color conversion function (hereinafter referred to as a "color conversion composition") can be made into a film and, for example, through combination with a blue light source, it is possible to extract the three primary colors of blue, green, and red from the blue light source, that is, to obtain white light. A white light source made by combining such a blue light source and a film having the color conversion function (hereinafter referred to as a "color conversion film") can be made into a light source, which can be combined with a liquid crystal drive section and a color filter to manufacture a full-color display. If there is no liquid crystal drive section, use without modification as a white light source is possible for applications such as an LED illumination, for example.

Among the problems of liquid crystal displays is the improvement of color reproducibility. For improving color reproducibility, narrowing a full width at half maximum of each of the blue, green and red emission spectra of the light source unit to enhance the color purity of the blue, green and red light is effective. As a unit to solve this problem, a technology has been proposed for using quantum dots from inorganic semiconductor particles as color conversion composition components (refer to Patent Literature 1, for example). While this technology using quantum dots certainly does narrow the full width at half maximum of each of the green and red light emission spectra, improving the color reproducibility, the quantum dots are susceptible to heat, moisture in air and oxygen and have inadequate durability.

A technology has also been proposed to use an organic light-emitting material in place of the quantum dots as the color conversion composition. Examples that have been disclosed of the use of an organic light-emitting material as a component of a color conversion composition include the use of a pyridine-phthalimide condensation product (refer to Patent Literature 2, for example) and the use of a coumarin derivative (refer to Patent Literature 3, for example). Disclosures to date of a red light emission material include the use of a perylene derivative (refer to Patent Literature 4, for example), the use of a rhodamine derivative (refer to Patent Literature 5, for example) and the use of a pyrromethene derivative (refer to Patent Literature 6 to 9, for example).

PATENT LITERATURE

Patent Literature 1: Japanese Patent Application Laid-open No. 2012-22028
Patent Literature 2: Japanese Patent Application Laid-open No. 2002-348568
Patent Literature 3: Japanese Patent Application Laid-open No. 2007-273440
Patent Literature 4: Japanese Patent Application Laid-open No. 2002-317175
Patent Literature 5: Japanese Patent Application Laid-open No. 2001-164245
Patent Literature 6: Japanese Patent Application Laid-open No. 2011-241160
Patent Literature 7: Japanese Patent Application Laid-open No. 2014-136771
Patent Literature 8: International Patent Application Laid-open No. 2016/108411
Patent Literature 9: Korean Patent Application Laid-open No. 2017/0049360

SUMMARY OF THE INVENTION

However, the use of these organic light-emitting materials to manufacture a color conversion composition is still inadequate from the perspective of improving color reproducibility, light emission efficiency and durability. In particular, the technology for providing both high light emission efficiency and high durability and the technology for providing both green emission light with high color-purity and high durability are inadequate.

The problem to be solved by the present invention is to provide an organic light-emitting material suitable as a color conversion material that can be used in a liquid crystal or other such display or an LED or other such illumination apparatus, and to achieve both improved color reproducibility and high durability.

To solve the problem described above and to achieve the object, A pyrromethene-boron complex according to the present invention is a compound represented by general formula (1),

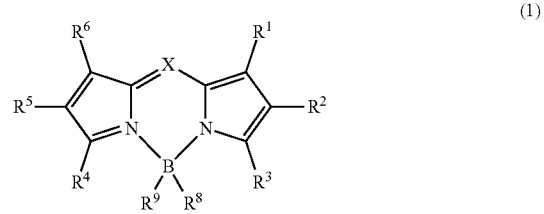

wherein in general formula (1), X is C—$R^7$ or N, $R^1$ to $R^7$ are each the same or different and are selected from among hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxy group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxy group, a substituted or unsubstituted oxycarbonyl group, a substituted or unsubstituted carbamoyl group, a substituted or unsubstituted ester group, a substituted or unsubstituted amide group, a substituted or unsubstituted acyl group, a substituted or unsubstituted sulfonyl group, a substituted or unsubstituted sulfonic acid ester group, a substituted or unsubstituted sulfonamide group, a nitro group, a substituted or unsubstituted silyl group, a substituted or unsubstituted siloxanyl group, a substituted or unsubstituted boryl group, and a substituted or unsubstituted phosphine oxide group, where $R^2$ and $R^5$ are selected from among the groups other than a substituted or unsubstituted aryl group and a substituted or unsubstituted heteroaryl group; $R^2$ and $R^5$ are groups not containing a heteroaryl group with at least two condensed rings; $R^8$ and $R^9$ are selected from among a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxy group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, and a cyano group; and at least one of $R^1$ to $R^6$ is a group containing a fluorine atom.

In the pyrromethene-boron complex according to the present invention, at least two of $R^1$ to $R^6$ in the general formula (1) are groups containing a fluorine atom.

In the pyrromethene-boron complex according to the present invention, at least one of $R^2$ and $R^5$ in the general formula (1) is a group containing a fluorine atom.

In the pyrromethene-boron complex according to the present invention, $R^2$ and $R^5$ in the general formula (1) are groups containing a fluorine atom.

In the pyrromethene-boron complex according to the present invention, the group containing the fluorine atom in the general formula (1) is a fluorine-containing acyl group, a fluorine-containing ester group, a fluorine-containing amide group, a fluorine-containing sulfonyl group, a fluorine-containing sulfonic acid ester group, or a fluorine-containing sulfonamide group.

In the pyrromethene-boron complex according to the present invention, the group containing the fluorine atom in the general formula (1) is a fluorine-containing ester group.

In the pyrromethene-boron complex according to the present invention, at least one of $R^1$, $R^3$, $R^4$, and $R^6$ in the general formula (1) is a substituted or unsubstituted alkyl group.

In the pyrromethene-boron complex according to the present invention, $R^7$ in the general formula (1) is a substituted or unsubstituted aryl group.

In the pyrromethene-boron complex according to the present invention, the compound represented by the general formula (1) is a compound represented by general formula (2),

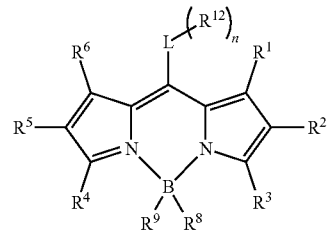

in general formula (2), $R^1$ to $R^6$, $R^8$, and $R^9$ are the same as in the general formula (1), $R^{12}$ is a substituted or unsubstituted aryl group or a substituted or unsubstituted heteroaryl group, L is a substituted or unsubstituted arylene group or a substituted or unsubstituted heteroarylene group, and n is an integer of 1 to 5.

In the pyrromethene-boron complex according to the present invention, either $R^8$ or $R^9$ in the general formula (1) is a cyano group.

In the pyrromethene-boron complex according to the present invention, the compound represented by general formula (1) exhibits a light emission with a peak wavelength observed in a region of 500 to 580 nm inclusive, in response to excitation light.

A color conversion composition according to the present invention is a color conversion composition that converts incident light to light with a longer wavelength than a wavelength of the incident light. The color conversion composition includes: the pyrromethene-boron complex according to any one of the above-mentioned inventions; and a binder resin.

The color conversion composition according to the present invention includes: a light-emitting material (a); and a light-emitting material (b), at least one of the light-emitting material (a) and the light-emitting material (b) being the pyrromethene-boron complex, the light-emitting material (a) being a light-emitting material emitting, in response to excitation light, light having a peak wavelength observed in a region of 500 to 580 nm inclusive, and the light-emitting material (b) being a light-emitting material emitting, in response to at least one of excitation by excitation light and light emission from the light-emitting material (a), light having a peak wavelength observed in a region of 580 to 750 nm inclusive.

In the color conversion composition according to the present invention, content $w_a$ of the light-emitting material (a) and content $w_b$ of the light-emitting material (b) have a relation $w_a \geq w_b$.

The color conversion composition according to the present invention further includes a solvent.

In the color conversion composition according to the present invention, the binder resin is a thermoplastic resin.

A color conversion film according to the present invention includes a layer containing the color conversion composition according to any one of the above-mentioned inventions or a cured product thereof.

The color conversion film according to the invention further includes a barrier film.

A light source unit according to the present invention includes: a light source; and the color conversion film according to the above-mentioned inventions.

In the light source unit according to the present invention, the light source is a light-emitting diode having a maximum light emission in a wavelength range of 430 to 500 nm inclusive.

A display according to the present invention includes the color conversion film according to any one of the above-mentioned inventions.

An illumination apparatus according to the present invention includes the color conversion film according to any one of the above-mentioned inventions.

The color conversion film using the pyrromethene-boron complex and color conversion composition according to the present invention achieves both light emission with high color purity and high durability and therefore exhibits the effect of making it possible to both improve color reproducibility and achieve high durability. The light source unit, the display, and the illumination apparatus according to the present invention use such a color conversion film and therefore exhibit the effect of making it possible to both improve color reproducibility and achieve high durability.

DETAILED DESCRIPTION OF EMBODIMENTS OF THE INVENTION

Figure 1:
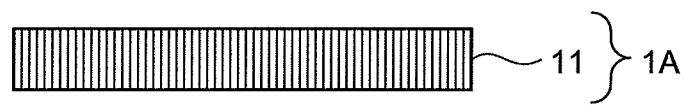
FIG. 1 is a schematic cross-section view illustrating a first example of the color conversion film according to the embodiments of the present invention.

Preferred embodiments of the pyrromethene-boron complex, the color conversion composition, the color conversion film, the light source unit, the display, and the illumination apparatus according to the present invention are described below in detail, but the present invention can be variously modified according to purpose and application without restriction to the embodiments.

<Pyrromethene-Boron Complex>

The pyrromethene-boron complex according to the embodiments of the present invention is described in detail. The pyrromethene-boron complex according to the embodiments of the present invention is a color conversion material composing a color conversion composition, a color conversion film or the like and is a compound represented by general formula (1).

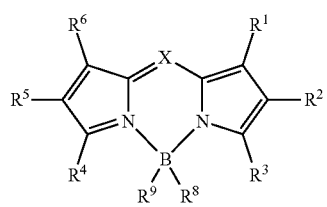

(1)

In general formula (1), X is C—$R^7$ or N. $R^1$ to $R^7$ may each be the same or different, and is selected from among hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxy group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxy group, a substituted or unsubstituted oxycarbonyl group, a substituted or unsubstituted carbamoyl group, a substituted or unsubstituted ester group, a substituted or unsubstituted amide group, a substituted or unsubstituted acyl group, a substituted or unsubstituted sulfonyl group, a substituted or unsubstituted sulfonic acid ester group, a substituted or unsubstituted sulfonamide group, a nitro group, a substituted or unsubstituted silyl group, a substituted or unsubstituted siloxanyl group, a substituted or unsubstituted boryl group, and a substituted or unsubstituted phosphine oxide group, where $R^2$ and $R^5$ are selected from among these groups other than a substituted or unsubstituted aryl group and a substituted or unsubstituted heteroaryl group. $R^2$ and $R^5$ are groups not containing a heteroaryl group with at least two condensed rings.

$R^8$ and $R^9$ are selected from among a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxy group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, and a cyano group. At least one of $R^1$ to $R^6$ is a group containing a fluorine atom.

The hydrogen in all of the abovementioned groups is optionally deuterium. The same applies to the compounds described below and partial structures thereof. In the below descriptions, the expression a substituted or unsubstituted aryl group having 6 to 40 carbon atoms, for example, refers to an aryl group have a total number of carbon atoms of 6 to 40, including the carbon atoms included in the substituent substituted in the aryl group. The same applies to other substituents with a stipulated carbon number.

When any of the abovementioned groups is substituted, the substituent is preferably an alkyl group, a cycloalkyl group, a heterocyclic group, an alkenyl group, a cycloalkenyl group, an alkynyl group, a hydroxy group, a thiol group, an alkoxy group, an alkyl thio group, an aryl ether group, an aryl thioether group, an aryl group, a heteroaryl group, a halogen, a cyano group, an aldehyde group, a carbonyl group, a carboxy group, an oxycarbonyl group, a carbamoyl group, an amino group, a nitro group, a silyl group, a siloxanyl group, a boryl group, or a phosphine oxide group, and more preferably a substituent that is specifically recited as preferable in the description of the individual substituent. The substituents are optionally further substituted with the substituents described above.

The term "unsubstituted" in the expression "substituted or unsubstituted" means that a hydrogen atom or a deuterium atom is substituted. The same applies to "substituted or unsubstituted" in the compounds described below and partial structures thereof.

Among all of the abovementioned groups, the alkyl group refers to a saturated aliphatic hydrocarbon group such as, for example, a methyl group, an ethyl group, a n-propyl group, an isopropyl group, a n-butyl group, a sec-butyl group, or a tert-butyl group, which is optionally substituted. In the case of substituted ones, the additional substituent is not particularly limited and includes, for example, an alkyl group, a halogen, an aryl group, a heteroaryl group and the like, and this is a common feature in the descriptions below. The carbon number of the alkyl group is not particularly limited but is preferably in the range of 1 to 20 inclusive and more preferably 1 to 8 inclusive from the perspectives of ease of acquisition and cost.

The term cycloalkyl group refers to a saturated alicyclic hydrocarbon group such as, for example, a cyclopropyl group, a cyclohexyl group, a norbornyl group, or an adamantyl group, which optionally has a substituent. The carbon number of the alkyl group moiety is not particularly limited but is preferably in the range of 3 to 20 inclusive.

The term heterocyclic group refers to an aliphatic ring having an atom other than carbon in the ring, such as a pyran ring, a piperidine ring, or cyclic amide, for example, which optionally has a substituent. The carbon number of the heterocyclic group is not particularly limited but is preferably in the range of 2 to 20 inclusive.

The term alkenyl group refers to an unsaturated aliphatic hydrocarbon group containing a double bond such as, for example, a vinyl group, an allyl group, or a butadienyl group, which optionally has a substituent. The carbon number of the alkenyl group is not particularly limited but is preferably in the range of 2 to 20 inclusive.

The term cycloalkenyl group refers to an unsaturated alicyclic hydrocarbon group containing a double bond such as, for example, a cyclopentenyl group, a cyclopentadienyl group, or a cyclohexenyl group, which optionally has a substituent.

The term alkynyl group refers to an unsaturated aliphatic hydrocarbon group containing a triple group such as, for example, an ethynyl group, which optionally has a substituent. The carbon number of the alkynyl group is not particularly limited but is preferably in the range of 2 to 20 inclusive.

The term alkoxy group refers to a functional group to which an aliphatic hydrocarbon group is bonded through an ether bond such as, for example, a methoxy group, an ethoxy group, or a propoxy group, and the aliphatic hydrocarbon group optionally has a substituent. The carbon number of the alkoxy group is not particularly limited but is preferably in the range of 1 to 20 inclusive.

The term alkyl thio group refers to an alkoxy group in which the oxygen atom in the ether bond has been substituted with a sulfur atom. The hydrocarbon group in the alkyl thio group optionally has a substituent. The carbon number of the alkyl thio group is not particularly limited but is preferably in the range of 1 to 20 inclusive.

The term aryl ether group refers to a functional group to which an aromatic hydrocarbon group is bonded through an ether bond such as, for example, a phenoxy group, and the aromatic hydrocarbon group optionally has a substituent. The carbon number of the aryl ether group is not particularly limited but is preferably in the range of 6 to 40 inclusive.

The term aryl thioether group refers to an aryl ether group in which the oxygen atom in the ether bond has been substituted with a sulfur atom. The aromatic hydrocarbon group in the aryl thioether group optionally has a substituent. The carbon number of the aryl thioether group is not particularly limited but is preferably in the range of 6 to 40 inclusive.

The term aryl group refers to an aromatic hydrocarbon group such as, for example, a phenyl group, a biphenyl group, a, terphenyl group, a naphthyl group, a fluorenyl group, a benzofluorenyl group, a dibenzofluorenyl group, a phenanthryl group, an anthracenyl group, a benzophenanthryl, a benzoanthracenyl group, a chrysenyl group, a pyrenyl group, a fluoranthenyl group, a triphenylenyl group, a benzofluoranthenyl group, a dibenzoanthracenyl group, a perylenyl group, or a helicenyl group. Among these, the phenyl group, the biphenyl group, the terphenyl group, the naphthyl group, the fluorenyl group, the phenanthryl group, the anthracenyl group, the pyrenyl group, the fluoranthenyl group, and the triphenylenyl group are preferable. The aryl group optionally has a substituent. The carbon number of the aryl group is not particularly limited but is preferably in the range of 6 to 40 inclusive and more preferably 6 to 30 inclusive.

If any of $R^1$ to $R^9$ is a substituted or unsubstituted aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, still more preferably a phenyl group, a biphenyl group, or a terphenyl group, and particularly preferably a phenyl group.

If any of the substituents is further substituted with an aryl group, the aryl group is preferably a phenyl group, a biphenyl group, a terphenyl group, a naphthyl group, a fluorenyl group, a phenanthryl group, or an anthracenyl group, more preferably a phenyl group, a biphenyl group, a terphenyl group, or a naphthyl group, and particularly preferably a phenyl group.

The term heteroaryl group refers to a cyclic aromatic group having one or more atoms other than carbon in the ring such as, for example, a pyridyl group, a furanyl group, a thienyl group, a quinolinyl group, an isoquinolinyl group, a pyrazinyl group, a pyrimidyl group, a pyridazinyl group, a triazinyl group, a naphthyridinyl group, a cinnolinyl group, a phthalazinyl group, a quinoxalinyl group, a quinazolinyl group, a benzofuranyl group, a benzothienyl group, an indolyl group, a dibenzofuranyl group, a dibenzothienyl group, a carbazolyl group, a benzocarbazolyl group, a carbolinyl group, an indolocarbazolyl group, a benzo furo carbazolyl group, a benzo thieno carbazolyl group, a dihydroindeno carbazolyl group, a benzo quinolinyl group, an acridinyl group, a dibenzo acridinyl group, a benzoimidazolyl group, an imidazopyridyl group, a benzoxazolyl group, a benzothiazolyl group, or a phenanthrolinyl group. The term naphthyridinyl group refers to any of a 1,5-naphthyridinyl group, a 1,6-naphthyridinyl group, a 1,7-naphthyridinyl group, a 1,8-naphthyridinyl group, a 2,6-naphthyridinyl group and a 2,7-naphthyridinyl group. The heteroaryl group optionally has a substituent. The carbon number of the heteroaryl group is not particularly limited but is preferably in the range of 2 to 40 inclusive and more preferably 2 to 30 inclusive.

If any of $R^1$ to $R^9$ is a substituted or unsubstituted heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzoimidazolyl group, an imidazopyridyl group, a benzoxazolyl group, a benzothiazolyl group, or a phenanthrolinyl group, more preferably a pyridyl group, a furanyl group, a thienyl group, or a quinolinyl group, and particularly preferably a pyridyl group.

If any of the substituents is further substituted with a heteroaryl group, the heteroaryl group is preferably a pyridyl group, a furanyl group, a thienyl group, a quinolinyl group, a pyrimidyl group, a triazinyl group, a benzofuranyl group, a benzothienyl group, an indolyl group, a dibenzofuranyl group, a dibenzothienyl group, a carbazolyl group, a benzoimidazolyl group, an imidazopyridyl group, a benzoxazolyl group, a benzothiazolyl group, or a phenanthrolinyl group, more preferably a pyridyl group, a furanyl group, a thienyl group, or a quinolinyl group, and particularly preferably a pyridyl group.

The term halogen refers to an atom selected from fluorine, chlorine, bromine, and iodine. Each of the carbonyl group, the carboxy group, the oxycarbonyl group and the carbamoyl group optionally has a substituent. Examples of the substituent include an alkyl group, a cycloalkyl group, an aryl group, a heteroaryl group and the like and are optionally further substituted.

The term ester group refers to a functional group to which an alkyl group, a cycloalkyl group, an aryl group, a heteroaryl group or the like, for example, is bonded through an ester bond, and this substituent is operationally further substituted. The carbon number of the ester group is not particularly limited but is preferably in the range of 1 to 20 inclusive. More specifically, a methyl ester group such as a methoxycarbonyl group, an ethyl ester group such as an ethoxycarbonyl group, a propyl ester group such as a propoxycarbonyl group, a butyl ester group such as a butoxycarbonyl group, an isopropyl ester group such as an isopropoxy methoxycarbonyl group, a hexyl ester group such as a hexyloxy carbonyl group, or a phenyl ester group such as a phenoxycarbonyl group may be given as examples of the ester group.

The term amide group refers to a functional group to which a substituent such as, for example, an alkyl group, a cycloalkyl group, an aryl group, or a heteroaryl group is bonded through an amide bond, and the substituent is further optionally substituted. The carbon number of the amide group is not particularly limited but is favorably in the range of 1 to 20 inclusive. More specifically, a methyl amide group, an ethyl amide group, a propyl amide group, a butyl amide group, an isopropyl amide group, a hexyl amide group, or a phenyl amide group may be given as examples of the amide group.

The term amino group refers to a substituted or unsubstituted amino group. The amino group optionally has a substituent, examples of which include an aryl group, a heteroaryl group, a linear alkyl group, and a branched alkyl group. The aryl group and the heteroaryl group are preferably a phenyl group, a naphthyl group, a pyridyl group, or a quinolinyl group. These substituents are optionally further substituted. The carbon number is not particularly limited but is preferably in the range of 2 to 50 inclusive, more preferably 6 to 40 inclusive, and particularly preferably 6 to 30 inclusive.

The term silyl group refers to an alkylsilyl group such as a trimethylsilyl group, a triethylsilyl group, a tert-butyldimethylsilyl group, a propyldimethylsilyl group, or a vinyldimethylsilyl group, or an arylsilyl group such as a phenyldimethylsilyl group, a tert-butyldiphenylsilyl group, a triphenylsilyl group, or a trinaphthylsilyl group. The substituent on the silicon is optionally further substituted. The carbon number of the silyl group is not particularly limited but is preferably in the range of 1 to 30 inclusive.

The term siloxanyl group refers to a silicon compound group bonding through an ether bond such as a trimethyl siloxanyl group. The substituent on the silicon is optionally further substituted. The term boryl group refers to a substituted or unsubstituted boryl group. The boryl group optionally has a substituent, examples of which include an aryl group, a heteroaryl group, a linear alkyl group, a branched alkyl group, an aryl ether group, an alkoxy group, and a hydroxy group, for example, and among these, the aryl group and the aryl ether group are preferable. The term phosphine oxide group is a group represented by —P(=O)$R^{10}R^{11}$, where $R^{10}$ and $R^{11}$ are selected from the same groups as those for $R^1$ to $R^9$.

The term acyl group refers to a functional group to which a substituent such as, for example, an alkyl group, a cycloalkyl group, an aryl group, or a heteroaryl group is bonded through a carbonyl bond, and the substituent is optionally further substituted. The carbon number of the acyl group is not particularly limited but is favorably in the range of 1 to 20 inclusive. In further detail, an acetyl group, a propionyl group, a benzoyl group, an acrylyl group or the like may be given as examples of the acyl group.

The term sulfonyl group refers to a functional group to which a substituent such as, for example, an alkyl group, a cycloalkyl group, an aryl group, or a heteroaryl group is bonded through an —S(=O)$_2$— bond, and the substituent is optionally further substituted.

The arylene group refers to a bivalent or polyvalent group derived from an aromatic hydrocarbon group such as benzene, naphthalene, biphenyl, fluorene or phenanthrene, and optionally has a substituent. The arylene group is preferably bivalent or trivalent. More specifically, a phenylene group, a biphenylene group, and a naphthylene group may be given as examples of the arylene group.

The term heteroarylene group refers to a bivalent or polyvalent group derived from an aromatic group having one or more atoms other than carbon in the ring such as pyridine, quinoline, pyrimidine, pyrazine, triazine, quinoxaline, quinazoline, dibenzofuran, or dibenzothiophene, and optionally has a substituent. The heteroarylene group is preferably bivalent or trivalent. The carbon number of the heteroarylene group is not particularly limited but is favorably in the range of 2 to 30. More specifically, a 2,6-pyridylene group, a 2,5-pyridylene group, a 2,4-pyridylene group, a 3,5-pyridylene group, a 3,6-pyridylene group, a 2,4,6-pyridylene group, a 2,4-pyrimidinylene group, a 2,5-pyrimidinylene group, a 4,6-pyrimidinylene group, a 2,4,6-pyrimidinylene group, a 2,4,6-triazinylene group, a 4,6-dibenzofuranylene group, a 2,6-dibenzofuranylene group, a 2,8-dibenzofuranylene group, or a 3,7-dibenzofuranylene group may be given as examples of the heteroarylene group.

The compound represented by general formula (1) has a pyrromethene-boron complex skeleton. The pyrromethene-boron complex skeleton is rigid and has high planarity. Therefore, the compound with a pyrromethene-boron complex skeleton exhibits a high emission quantum yield, and the peak full width at half maximum of the light emission spectrum of the compound is small. Accordingly, the compound represented by general formula (1) can achieve efficient color conversion and high color purity.

The compound represented by general formula (1) necessarily has a group containing a fluorine atom in the pyrromethene-boron complex skeleton. The color conversion composition according to the present invention, that is, the color conversion composition having the compound (pyrromethene-boron complex) as a component carries out the color conversion of light when the contained pyrromethene-boron complex is excited by excitation light and light having a wavelength different from the excitation light is emitted.

If the compound represented by general formula (1) does not have a group containing a fluorine atom in the pyrromethene-boron complex skeleton, when the abovementioned cycle of the excitation and the light emission repeats, the pyrromethene-boron complex contained in the color conversion composition oxidizes and quenches light due to an interaction between the pyrromethene-boron complex and oxygen. Accordingly, oxidation of the pyrromethene-boron complex causes degradation in the durability of the compound. Because the fluorine atom has a strong electron-withdrawing property, the introduction of a group containing a fluorine atom into the pyrromethene-boron complex skeleton lowers the electron density of the pyrromethene-boron complex skeleton. Doing so improves the stability of the compound represented by general formula (1) against oxygen, resulting in improved durability of the compound.

In the light of the foregoing, the compound represented by general formula (1) has a pyrromethene-boron complex skeleton and a group containing a fluorine atom in the molecule, thereby making it possible to achieve efficient light emission (color conversion), high color purity, and high durability.

In general formula (1), at least one of $R^2$ and $R^5$ is not a substituted or unsubstituted aryl group or a substituted or unsubstituted heteroaryl group. That is, $R^2$ and $R^5$ are selected from the abovementioned groups other than a substituted or unsubstituted aryl group and a substituted or unsubstituted heteroaryl group.

The positions in the pyrromethene derivative where $R^2$ and $R^5$ are substituted in general formula (1) greatly affect the electron density of the pyrromethene-boron complex skeleton. The conjugation expands when aromatic groups are substituted at these positions, thereby widening the peak full width at half maximum of the light emission spectrum. When a film containing such a compound is used as a color conversion film in a display, the color reproducibility decreases.

Therefore, at least one of $R^2$ and $R^5$ in the pyrromethene-boron complex skeleton is not a substituted or unsubstituted aryl group or a substituted or unsubstituted heteroaryl group. With this restriction, it is possible to limit widening of the conjugation of the molecule overall in the pyrromethene-boron complex skeleton, resulting in a narrower peak full width at half maximum of the light emission spectrum. When a film containing such a compound is used as a color conversion film in a display, the color reproducibility can be enhanced.

In general formula (1), $R^2$ and $R^5$ are groups not containing a heteroaryl group with at least two condensed rings. A heteroaryl group with at least two condensed rings absorbs visible light. When a heteroaryl group with at least two condensed rings absorbs visible light and is excited, a portion of the skeleton contains a heteroatom, such that local electronic bias readily occurs in the conjugation in the excited state. When attempting to attain a high emission quantum yield, which is a characteristic of the pyrromethene-boron complex, the electron transition, that is, excitation and deactivation, is necessary within the pyrromethene-boron complex skeleton. However, when heteroaryl groups with at least two condensed rings are included at the $R^2$ and the $R^5$ positions, which greatly affect the conjugation of the pyrromethene-boron complex, the heteroaryl groups with at least two condensed rings absorb visible light and undergo excitation, so that electronic bias occurs in the heteroaryl group with at least two condensed rings. Therefore, an electron transfer occurs between the heteroaryl group and the pyrromethene-boron complex, which results in hindering electron transitions within the pyrromethene-boron complex skeleton, and therefore the emission quantum yield of the pyrromethene-boron complex decreases. Hence, when a film containing such a compound is used as a color conversion film in a display, the light emission efficiency decreases.

The drop in the emission quantum yield is a phenomenon that occurs when visible light is absorbed by substituents contained in $R^2$ and $R^5$ and an electron transfer occurs between the substituents and the pyrromethene-boron complex skeleton. If the substituents contained in $R^2$ and $R^5$ are monocyclic heteroaryl groups, the heteroaryl groups do not absorb visible light and therefore are not excited. Accordingly, no electron transfer occurs between the heteroaryl groups and the pyrromethene-boron complex skeleton, and as a result, no reduction is seen in the emission quantum yield.

In general formula (1), $R^1$ and $R^6$ are both preferably neither a fluorine-containing aryl group nor a fluorine-containing alkyl group. With these exclusions, the emission quantum yield can be increased. When a film containing such a compound is used; as a color conversion film in a display, the emission efficiency can be further enhanced.

The compound represented by general formula (1) exhibits a high emission quantum yield and the peak full width at half maximum of the light emission spectrum is small, so that both efficient color conversion and high color purity can be achieved. By introducing a suitable substituent at a suitable location, it is possible to adjust various characteristics and physical properties of the compound represented by general formula (1) such as the light emission efficiency, the color purity, the thermal stability, the photostability, the dispersibility, and others.

For example, at least two of $R^1$ to $R^6$ in general formula (1) are preferably groups containing a fluorine atom. The compound represented by general formula (1) has at least two groups containing a fluorine atom, making it possible to further reduce the electron density in the pyrromethene-boron complex skeleton. This improves the stability of the compound represented by general formula (1) against oxygen, resulting in improved durability.

In general formula (1), at least one of $R^2$ and $R^5$ preferably contains a fluorine atom. The reason is as indicated below. The positions $R^2$ and $R^5$ in general formula (1) are substitution positions that greatly affect the electron density of the pyrromethene-boron complex skeleton. The electron density of the pyrromethene-boron complex skeleton can be efficiently reduced by introducing a group containing a fluorine atom at $R^2$ and $R^5$. Doing so further improves the stability of the compound represented by general formula (1) against oxygen, resulting in further improved durability.

$R^2$ and $R^5$ are more favorably groups containing a fluorine atom. The reason for this is that this structure further improves the stability of the compound represented by general formula (1) against oxygen, resulting in a great improvement in the durability.

Examples of preferable groups with a fluorine atom that may be given include a fluorine atom, a fluorine-containing aryl group, a fluorine-containing heteroaryl group, a fluorine-containing alkyl group, a fluorine-containing acyl group, a fluorine-containing ester group, a fluorine-containing amide group, a fluorine-containing sulfonyl group, a fluorine-containing sulfonic acid ester group, and a fluorine-containing sulfonamide group. These groups can efficiently reduce the electron density of the pyrromethene-boron complex skeleton. This improves the stability of the compound represented by general formula (1) against oxygen, resulting in further improved durability. Therefore, these groups are preferable as groups containing a fluorine atom.

A linear fluoroalkyl group and a fluoroaryl group may be given as specific examples of the fluorine-containing aryl group, the fluorine-containing heteroaryl group, and the fluorine-containing alkyl group.

A trifluoromethyl group, a pentafluoroethyl group, a heptafluoropropyl group, a nonafluoropropyl group, a tridecafluorohexyl group, a nonadecafluorooctyl group, a 2,2,2-trifluoroethyl group, a 2,2,3,3,3-pentafluoropropyl group, a 2,2,3,3,4,4,5,5,5-nonafluoropentyl group, a 2,2,3,3,4,4,5,5,6,6,7,7-tridecafluoroheptyl group, a 2,2,3,3,4,4,5,5,6,6,7,7,8,8,9,9,9-hexadecafluorononyl group, a 3,3,3-trifluoropropyl group, a 3,3,4,4,4-pentafluorobutyl group, a 2,2,3,3,4,4,4-heptafluoro-1-butyl group, a 3,3,4,4,5,5,6,6,6-nonafluorohexyl group, a 3,3,4,4,5,5,6,6,7,7,8,8,8-tridecafluorooctyl group, a 3,3,4,4,5,5,6,6,7,7,8,8,9,9,10,10,10-heptadecafluorodecyl group, a 4,4,4-trifluorobutyl group, a 4,4,5,5,5-pentafluoropentyl group, a 4,4,5,5,6,6,7,7,7-nonafluoropentyl group, a 4,4,5,5,6,6,7,7,8,8,9,9,9-tridecafluorononyl group, a 5,5,5-trifluoropentyl group, a 5,5,6,6,6-pentafluorohexyl group, a 5,5,6,6,7,7,8,8,8-nonafluorooctyl group, a 5,5,6,6,7,7,8,8,9,9,10,10,10-tridecafluorodecyl group, a 6,6,6-trifluorohexyl group, a 6,6,7,7,7-pentafluoroheptyl group, a 6,6,7,7,8,8,9,9,9-nonafluorononyl group, a 7,7,7-trifluoroheptyl group, a 7,7,8,8,8-pentafluorooctyl group, a 7,7,8,8,9,9,10,10,10-nonafluorodecyl group, a 9,9,9-trifluorononyl group, a 9,9,10,10,10-pentafluorodecyl group, and the like may be given as examples of the linear fluoroalkyl group.

A pentafluorophenyl group, a 2,3,4,5-tetrafluorophenyl group, a 2,3,5,6-tetrafluorophenyl group, a 2,3,5-trifluorophenyl group, a 2,4,5-trifluorophenyl group, a 3,4,5-trifluorophenyl group, a 2,4,6-trifluorophenyl group, 2,4-difluorophenyl group, a 3,4-difluorophenyl group, a 3,5-difluorophenyl group, a 2-fluorophenyl group, a 3-fluorophenyl group, a 4-fluorophenyl group, a 3-trifluoromethylphenyl group, a 4-trifluoromethylphenyl group, a 2,3-bis(trifluoromethyl)phenyl group, a 2,4-bis(trifluoromethyl)phenyl group, a 2,5-bis(trifluoromethyl)phenyl group, a 2,6-di-bis(trifluoromethyl)phenyl group, a 3,5-bis(trifluoromethyl)phenyl group, a 2,3,4-tris(trifluoromethyl)phenyl group, a 2,3,5-tris(trifluoromethyl)phenyl group, a 2,4,5-tris(trifluoromethyl)phenyl group, a 2,4,6-tris(trifluoromethyl)phenyl group, a 2,3,4,5-tetrakis(trifluoromethyl)phenyl group, a 2,3,4,6-tetrakis(trifluoromethyl)phenyl group, a 2,3,5,6-tetrakis(trifluoromethyl)phenyl group, a 2,3,4,5,6-penta(trifluoromethyl)phenyl group, a 3-trifluoromethylnaphthyl group, a 4-trifluoromethylnaphthyl group, a 3,5-bis(trifluoromethyl)naphthyl group, and the like may be given as examples of the fluoroaryl group.

General formulas (3) to (8) may be given as specific examples of the fluorine-containing acyl group, the fluorine-containing ester group, the fluorine-containing amide group, the fluorine-containing sulfonyl group, the fluorine-containing sulfonic acid ester group, and the fluorine-containing sulfonamide group.

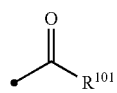
(3)

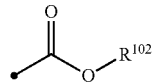
(4)

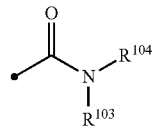
(5)

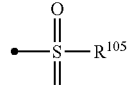
(6)

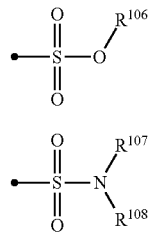
(7)

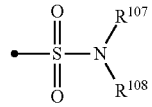
(8)

In general formulas (3) to (8), $R^{101}$ to $R^{108}$ are each independently a hydrogen, a substituted or unsubstituted alkyl group, a substituted or unsubstituted cycloalkyl group, a substituted or unsubstituted aryl group, or a substituted or unsubstituted heteroaryl group in which at least one oxygen is substituted by a fluorine atom.

A linear fluoroalkyl group, a fluoroaryl group and the like may be given as specific examples of $R^{101}$ to $R^{108}$.

A trifluoromethyl group, a pentafluoroethyl group, a heptafluoropropyl group, a nonafluorobutyl group, a tridecafluorohexyl group, a nonadecafluorooctyl group, a 2,2,2-trifluoroethyl group, a 2,2,3,3,3-pentafluoropropyl group, a 2,2,3,3,4,4,5,5,5-nonafluoropentyl group, a 2,2,3,3,4,4,5,5,6,6,7,7-tridecafluoroheptyl group, a 2,2,3,3,4,4,5,5,6,6,7,7,8,8,9,9,9-hexadecafluorononyl group, a 3,3,3-trifluoropropyl group, a 3,3,4,4,4-pentafluorobutyl group, a 2,2,3,3,4,4,4-heptafluoro-1-butyl group, a 3,3,4,4,5,5,6,6,6-nonafluorohexyl group, a 3,3,4,4,5,5,6,6,7,7,8,8,8-tridecafluorooctyl group, a 3,3,4,4,5,5,6,6,7,7,8,8,9,9,10,10,10-heptadecafluorodecyl group, a 4,4,4-trifluorobutyl group, a 4,4,5,5,5-pentafluoropentyl group, a 4,4,5,5,6,6,7,7,7-nonafluoroheptyl group, a 4,4,5,5,6,6,7,7,8,8,9,9,9-tridecafluorononyl group, a 5,5,5-trifluoropentyl group, a 5,5,6,6,6-pentafluorohexyl group, a 5,5,6,6,7,7,8,8,8-nonafluorooctyl group, a 5,5,6,6,7,7,8,8,9,9,10,10,10-tridecafluorodecyl group, a 6,6,6-trifluorohexyl group, a 6,6,7,7,7-pentafluoroheptyl group, a 6,6,7,7,8,8,9,9,9-nonafluorononyl group, a 7,7,7-trifluoroheptyl group, a 7,7,8,8,8-pentafluorooctyl group, a 7,7,8,8,9,9,10,10,10-nonafluorodecyl group, a 9,9,9-trifluorononyl group, a 9,9,10,10,10-pentafluorodecyl group and the like may be given as examples of the linear fluoroalkyl group.

A pentafluorophenyl group, a 2,3,4,5-tetrafluorophenyl group, a 2,3,5,6-tetrafluorophenyl group, a 2,3,5-trifluorophenyl group, a 2,4,5-trifluorophenyl group, a 3,4,5-trifluorophenyl group, a 2,4,6-trifluorophenyl group, a 2,4-difluorophenyl group, a 3,4-difluorophenyl group, a 3,5-difluorophenyl group, a 2-fluorophenyl group, a 3-fluorophenyl group, a 4-fluorophenyl group, a 3-trifluoromethylphenyl group, a 4-trifluoromethylphenyl group, a 2,3-bis(trifluoromethyl)phenyl group, a 2,4-bis(trifluoromethyl)phenyl group, a 2,5-bis(trifluoromethyl)phenyl group, a 2,6-di-bis(trifluoromethyl)phenyl group, a 3,5-bis(trifluoromethyl)phenyl group, a 2,3,4-tris(trifluoromethyl)phenyl group, a 2,3,5-tris(trifluoromethyl)phenyl group, a 2,4,5-tris (trifluoromethyl)phenyl group, a 2,4,6-tris(trifluoromethyl) phenyl group, a 2,3,4,5-tetrakis(trifluoromethyl)phenyl group, a 2,3,4,6-tetrakis(trifluoromethyl)phenyl group, a 2,3,5,6-tetrakis(trifluoromethyl)phenyl group, a 2,3,4,5,6-penta(trifluoromethyl)phenyl group, a 3-trifluoromethyl-naphthyl group, a 4-trifluoromethylnaphthyl group, and a 3,5-bis(trifluoromethyl)naphthyl group may be given as examples of the fluoroaryl group. More preferable is a 3,5-bis(trifluoromethyl)phenyl group.

There are preferably 1 to 30 fluorine atoms contained in the group containing fluorine atoms and more preferably 1 to 20.

Examples of preferable groups containing a fluorine atom are a fluorine-containing acyl group (general formula (3)), a fluorine-containing ester group (general formula (4)), a fluorine-containing amide group (general formula (5)), a fluorine-containing sulfonyl group (general formula (6)), a fluorine-containing sulfonic acid ester group (general formula (7)), and a fluorine-containing sulfonamide group (general formula (8)). These groups reduce the electron density of the pyrromethene-boron complex skeleton without expanding the conjugation thereof. Therefore, the durability can be improved in the compound represented by general formula (1) without loss in light emission efficiency or color purity. Hence, these groups more preferably contain a fluorine atom.

An example of a particularly preferable group containing a fluorine atom is a fluorine-containing ester group (general formula (4)). If the group containing a fluorine atom is a fluorine-containing ester group, it is possible to moderately reduce the electron density of the pyrromethene-boron complex skeleton without expanding the conjugation thereof. Therefore, it is possible to further improve the durability of the compound represented by general formula (1) without loss in light emission efficiency or color purity. Hence, a fluorine-containing ester group is particularly preferable as the group containing a fluorine atom.

In general formula (1), at least one of $R^1$, $R^3$, $R^4$, and $R^6$ is preferably a substituted or unsubstituted alkyl group, a substituted or unsubstituted aryl group, or a substituted or unsubstituted heteroaryl group. This is because if at least one of $R^1$, $R^3$, $R^4$, and $R^6$ is one of the abovementioned groups, the thermal stability and light stability exhibited by the compound represented by general formula (1) are better than if all of $R^1$, $R^3$, $R^4$, and $R^6$ are oxygen.

If at least one of $R^1$, $R^3$, $R^4$, and $R^6$ in general formula (1) is a substituted or unsubstituted alkyl group, light emission is obtained with superior color purity. In this case, the alkyl group is preferably a group with 1 to 6 carbon atoms, i.e., a methyl group, an ethyl group, an n-propyl group, an isopropyl group, an n-butyl group, a sec-butyl group, a tert-butyl group, a pentyl group, or a hexyl group. From the perspective of excellent thermal stability, the alkyl group is preferably a methyl group, an ethyl group, an n-propyl group, an isopropyl group, an n-butyl group, a sec-butyl group, or a tert-butyl group. From the perspectives of preventing concentration quenching and improving emission quantum yield, the alkyl group is preferably a sterically bulky tert-butyl group. From the perspectives of ease of synthesis and ease of procuring raw materials; a methyl group may be favorably used as the alkyl group.

Each of $R^1$, $R^3$, $R^4$, and $R^6$ in general formula (1) may be the same or different and is preferably a substituted or unsubstituted alkyl group because of favorable solubility in a binder resin and a solvent. From the perspectives of ease of synthesis and ease of procuring raw materials, the alkyl group is preferably a methyl group.

At least one of $R^1$, $R^3$, $R^4$, and $R^6$ in general formula (1) is preferably a substituted or unsubstituted aryl group, in which case, the light stability is further improved. The aryl group is preferably a phenyl group, a biphenyl group, a terphenyl group, or a naphthyl group, more preferably a phenyl group or a biphenyl group, and particularly preferably a phenyl group.

If at least one of $R^1$, $R^3$, $R^4$, and $R^6$ in general formula (1) is a substituted or unsubstituted heteroaryl group, the heteroaryl group is preferably a pyridyl group, a quinolinyl group, or a thienyl group, more preferably a pyridyl group or a quinolinyl group, and particularly preferably a pyridyl group.

Each of $R^1$, $R^3$, $R^4$, and $R^6$ in general formula (1) may be the same or different and is preferably a substituted or unsubstituted aryl group or a substituted or unsubstituted heteroaryl group because of the favorable thermal stability and light stability that are exhibited.

Although there are substituents that can improve a plurality of properties, the substituents that adequately exhibit all of the properties are limited. In particular, it is difficult to produce both high light emission efficiency and high color purity. Therefore, by introducing a plurality of types of substituents into the compound represented by general formula (1), it is possible to obtain a compound in which the light emission property, the color purity and the like are balanced.

In particular, each of $R^1$, $R^3$, $R^4$, and $R^6$ is the same or different and if one or more are a substituted or unsubstituted aryl group, a plurality of types of substituents are preferably introduced such that, for example, $R^1 \neq R^4$, $R^3 \neq R^6$, $R^1 \neq R^3$ or $R^4 \neq R^6$. Here, the "$\neq$" symbol indicates groups with different structures. For example, $R^1 \neq R^4$ indicates that $R^1$ and $R^4$ are groups with different structures. By introducing a plurality of types of substituents as described above, it is possible to simultaneously introduce an aryl group that affects the color purity and an aryl group that affects the light emission efficiency, thereby making fine adjustment possible.

Among these options, $R^1 \neq R^3$ or $R^4 \neq R^6$ is preferable from the perspective of improving the balance between light emission efficiency and color purity. In this case, it is possible to introduce at least one aryl group that affects the color purity at the pyrrole ring at each side of the compound represented by general formula (1) and introduce an aryl group that affects the light emission efficiency at other positions, so that both properties can be maximally improved. If $R^1 \neq R^3$ or $R^4 \neq R^6$, then it is preferable that $R^1 = R^4$ and $R^3 = R^6$ from the perspective of improving both the thermal resistance and the color purity.

The aryl group mainly affecting color purity is preferably an aryl group substituted with an electron donor group. An alkyl group, an alkoxy group, and the like may be given as examples of the electron donor group. In particular, an alkyl group with a carbon number of 1 to 8 or an alkoxy group with a carbon number of 1 to 8 is preferable, and a methyl group, an ethyl group, a tert-butyl group, or a methoxy group is more preferable. A tert-butyl group or a methoxy group is particularly preferable from the perspective of dispersibility, and if one of the groups is used as the abovementioned electron donor group, light quenching due to molecular aggregation can be prevented in the compound represented by general formula (1). The substitution position of the substituent is not particularly limited but is preferably at the meta position or the para position at the bonding position of the pyrromethene-boron complex skeleton because of the need to curb twisting of the bond in order to enhance the light stability of the compound represented by general formula (1). The aryl group affecting mainly the light emission efficiency is preferably an aryl group having a bulky substituent such as a tert-butyl group, an adamantyl group, or a methoxy group.

All of $R^1$, $R^3$, $R^4$, and $R^6$ are all the same or different and if they are substituted or unsubstituted aryl groups, the $R^1$, $R^3$, $R^4$, and $R^6$ are preferably each selected from Ar-1 to Ar-6 below. In this case, preferable combinations of $R^1$, $R^3$, $R^4$, and $R^6$ are listed in Tables 1-1 to 1-11 but are not limited thereto.

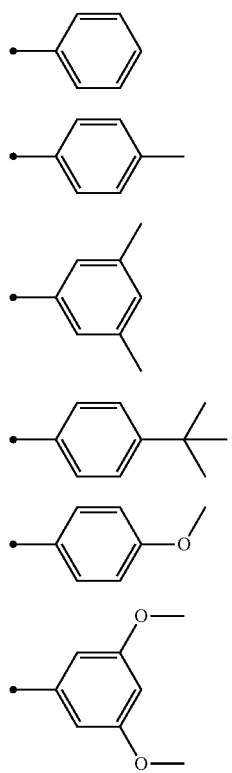

Ar-1

Ar-2

Ar-3

Ar-4

Ar-5

Ar-6

TABLE 1-1

| R1 | R3 | R4 | R6 |
|---|---|---|---|
| Ar-1 | Ar-1 | Ar-1 | Ar-1 |
| Ar-1 | Ar-1 | Ar-1 | Ar-2 |
| Ar-1 | Ar-1 | Ar-1 | Ar-3 |
| Ar-1 | Ar-1 | Ar-1 | Ar-4 |
| Ar-1 | Ar-1 | Ar-1 | Ar-5 |
| Ar-1 | Ar-1 | Ar-1 | Ar-6 |
| Ar-1 | Ar-1 | Ar-2 | Ar-1 |
| Ar-1 | Ar-1 | Ar-2 | Ar-2 |
| Ar-1 | Ar-1 | Ar-2 | Ar-3 |
| Ar-1 | Ar-1 | Ar-2 | Ar-4 |
| Ar-1 | Ar-1 | Ar-2 | Ar-5 |
| Ar-1 | Ar-1 | Ar-2 | Ar-6 |
| Ar-1 | Ar-1 | Ar-3 | Ar-1 |
| Ar-1 | Ar-1 | Ar-3 | Ar-2 |
| Ar-1 | Ar-1 | Ar-3 | Ar-3 |
| Ar-1 | Ar-1 | Ar-3 | Ar-4 |
| Ar-1 | Ar-1 | Ar-3 | Ar-5 |
| Ar-1 | Ar-1 | Ar-3 | Ar-6 |
| Ar-1 | Ar-1 | Ar-4 | Ar-1 |
| Ar-1 | Ar-1 | Ar-4 | Ar-2 |
| Ar-1 | Ar-1 | Ar-4 | Ar-3 |

TABLE 1-1-continued

| R1 | R3 | R4 | R6 |
|---|---|---|---|
| Ar-1 | Ar-1 | Ar-4 | Ar-4 |
| Ar-1 | Ar-1 | Ar-4 | Ar-5 |
| Ar-1 | Ar-1 | Ar-4 | Ar-6 |
| Ar-1 | Ar-1 | Ar-5 | Ar-1 |
| Ar-1 | Ar-1 | Ar-5 | Ar-2 |
| Ar-1 | Ar-1 | Ar-5 | Ar-3 |
| Ar-1 | Ar-1 | Ar-5 | Ar-4 |
| Ar-1 | Ar-1 | Ar-5 | Ar-5 |
| Ar-1 | Ar-1 | Ar-5 | Ar-6 |
| Ar-1 | Ar-1 | Ar-6 | Ar-1 |
| Ar-1 | Ar-1 | Ar-6 | Ar-2 |
| Ar-1 | Ar-1 | Ar-6 | Ar-3 |
| Ar-1 | Ar-1 | Ar-6 | Ar-4 |
| Ar-1 | Ar-1 | Ar-6 | Ar-5 |
| Ar-1 | Ar-1 | Ar-6 | Ar-6 |
| Ar-1 | Ar-2 | Ar-1 | Ar-2 |
| Ar-1 | Ar-2 | Ar-1 | Ar-3 |
| Ar-1 | Ar-2 | Ar-1 | Ar-4 |
| Ar-1 | Ar-2 | Ar-1 | Ar-5 |
| Ar-1 | Ar-2 | Ar-1 | Ar-6 |
| Ar-1 | Ar-2 | Ar-2 | Ar-1 |
| Ar-1 | Ar-2 | Ar-2 | Ar-2 |
| Ar-1 | Ar-2 | Ar-2 | Ar-3 |
| Ar-1 | Ar-2 | Ar-2 | Ar-4 |
| Ar-1 | Ar-2 | Ar-2 | Ar-5 |
| Ar-1 | Ar-2 | Ar-2 | Ar-6 |
| Ar-1 | Ar-2 | Ar-3 | Ar-1 |
| Ar-1 | Ar-2 | Ar-3 | Ar-2 |
| Ar-1 | Ar-2 | Ar-3 | Ar-3 |
| Ar-1 | Ar-2 | Ar-3 | Ar-4 |
| Ar-1 | Ar-2 | Ar-3 | Ar-5 |
| Ar-1 | Ar-2 | Ar-3 | Ar-6 |
| Ar-1 | Ar-2 | Ar-4 | Ar-1 |
| Ar-1 | Ar-2 | Ar-4 | Ar-2 |
| Ar-1 | Ar-2 | Ar-4 | Ar-3 |
| Ar-1 | Ar-2 | Ar-4 | Ar-4 |
| Ar-1 | Ar-2 | Ar-4 | Ar-5 |
| Ar-1 | Ar-2 | Ar-4 | Ar-6 |

TABLE 1-2

| R1 | R3 | R4 | R6 |
|---|---|---|---|
| Ar-1 | Ar-2 | Ar-5 | Ar-1 |
| Ar-1 | Ar-2 | Ar-5 | Ar-2 |
| Ar-1 | Ar-2 | Ar-5 | Ar-3 |
| Ar-1 | Ar-2 | Ar-5 | Ar-4 |
| Ar-1 | Ar-2 | Ar-5 | Ar-5 |
| Ar-1 | Ar-2 | Ar-5 | Ar-6 |
| Ar-1 | Ar-2 | Ar-6 | Ar-1 |
| Ar-1 | Ar-2 | Ar-6 | Ar-2 |
| Ar-1 | Ar-2 | Ar-6 | Ar-3 |
| Ar-1 | Ar-2 | Ar-6 | Ar-4 |
| Ar-1 | Ar-2 | Ar-6 | Ar-5 |
| Ar-1 | Ar-2 | Ar-6 | Ar-6 |
| Ar-1 | Ar-3 | Ar-1 | Ar-2 |
| Ar-1 | Ar-3 | Ar-1 | Ar-3 |
| Ar-1 | Ar-3 | Ar-1 | Ar-4 |
| Ar-1 | Ar-3 | Ar-1 | Ar-5 |
| Ar-1 | Ar-3 | Ar-1 | Ar-6 |
| Ar-1 | Ar-3 | Ar-2 | Ar-2 |
| Ar-1 | Ar-3 | Ar-2 | Ar-3 |
| Ar-1 | Ar-3 | Ar-2 | Ar-4 |
| Ar-1 | Ar-3 | Ar-2 | Ar-5 |
| Ar-1 | Ar-3 | Ar-2 | Ar-6 |
| Ar-1 | Ar-3 | Ar-3 | Ar-1 |
| Ar-1 | Ar-3 | Ar-3 | Ar-2 |
| Ar-1 | Ar-3 | Ar-3 | Ar-3 |
| Ar-1 | Ar-3 | Ar-3 | Ar-4 |
| Ar-1 | Ar-3 | Ar-3 | Ar-5 |
| Ar-1 | Ar-3 | Ar-3 | Ar-6 |
| Ar-1 | Ar-3 | Ar-4 | Ar-1 |
| Ar-1 | Ar-3 | Ar-4 | Ar-2 |
| Ar-1 | Ar-3 | Ar-4 | Ar-3 |
| Ar-1 | Ar-3 | Ar-4 | Ar-4 |

TABLE 1-2-continued

| R1 | R3 | R4 | R6 |
| --- | --- | --- | --- |
| Ar-1 | Ar-3 | Ar-4 | Ar-5 |
| Ar-1 | Ar-3 | Ar-4 | Ar-6 |
| Ar-1 | Ar-3 | Ar-5 | Ar-1 |
| Ar-1 | Ar-3 | Ar-5 | Ar-2 |
| Ar-1 | Ar-3 | Ar-5 | Ar-3 |
| Ar-1 | Ar-3 | Ar-5 | Ar-4 |
| Ar-1 | Ar-3 | Ar-5 | Ar-5 |
| Ar-1 | Ar-3 | Ar-5 | Ar-6 |
| Ar-1 | Ar-3 | Ar-6 | Ar-1 |
| Ar-1 | Ar-3 | Ar-6 | Ar-2 |
| Ar-1 | Ar-3 | Ar-6 | Ar-3 |
| Ar-1 | Ar-3 | Ar-6 | Ar-4 |
| Ar-1 | Ar-3 | Ar-6 | Ar-5 |
| Ar-1 | Ar-3 | Ar-6 | Ar-6 |
| Ar-1 | Ar-4 | Ar-1 | Ar-2 |
| Ar-1 | Ar-4 | Ar-1 | Ar-3 |
| Ar-1 | Ar-4 | Ar-1 | Ar-4 |
| Ar-1 | Ar-4 | Ar-1 | Ar-5 |
| Ar-1 | Ar-4 | Ar-1 | Ar-6 |
| Ar-1 | Ar-4 | Ar-2 | Ar-2 |
| Ar-1 | Ar-4 | Ar-2 | Ar-3 |
| Ar-1 | Ar-4 | Ar-2 | Ar-4 |
| Ar-1 | Ar-4 | Ar-2 | Ar-5 |
| Ar-1 | Ar-4 | Ar-2 | Ar-6 |
| Ar-1 | Ar-4 | Ar-3 | Ar-2 |
| Ar-1 | Ar-4 | Ar-3 | Ar-3 |
| Ar-1 | Ar-4 | Ar-3 | Ar-4 |
| Ar-1 | Ar-4 | Ar-3 | Ar-5 |
| Ar-1 | Ar-4 | Ar-3 | Ar-6 |

TABLE 1-3

| R1 | R3 | R4 | R6 |
| --- | --- | --- | --- |
| Ar-1 | Ar-4 | Ar-4 | Ar-1 |
| Ar-1 | Ar-4 | Ar-4 | Ar-2 |
| Ar-1 | Ar-4 | Ar-4 | Ar-3 |
| Ar-1 | Ar-4 | Ar-4 | Ar-4 |
| Ar-1 | Ar-4 | Ar-4 | Ar-5 |
| Ar-1 | Ar-4 | Ar-4 | Ar-6 |
| Ar-1 | Ar-4 | Ar-5 | Ar-1 |
| Ar-1 | Ar-4 | Ar-5 | Ar-2 |
| Ar-1 | Ar-4 | Ar-5 | Ar-3 |
| Ar-1 | Ar-4 | Ar-5 | Ar-4 |
| Ar-1 | Ar-4 | Ar-5 | Ar-5 |
| Ar-1 | Ar-4 | Ar-5 | Ar-6 |
| Ar-1 | Ar-4 | Ar-6 | Ar-1 |
| Ar-1 | Ar-4 | Ar-6 | Ar-2 |
| Ar-1 | Ar-4 | Ar-6 | Ar-3 |
| Ar-1 | Ar-4 | Ar-6 | Ar-4 |
| Ar-1 | Ar-4 | Ar-6 | Ar-5 |
| Ar-1 | Ar-4 | Ar-6 | Ar-6 |
| Ar-1 | Ar-5 | Ar-1 | Ar-2 |
| Ar-1 | Ar-5 | Ar-1 | Ar-3 |
| Ar-1 | Ar-5 | Ar-1 | Ar-4 |
| Ar-1 | Ar-5 | Ar-1 | Ar-5 |
| Ar-1 | Ar-5 | Ar-1 | Ar-6 |
| Ar-1 | Ar-5 | Ar-2 | Ar-2 |
| Ar-1 | Ar-5 | Ar-2 | Ar-3 |
| Ar-1 | Ar-5 | Ar-2 | Ar-4 |
| Ar-1 | Ar-5 | Ar-2 | Ar-5 |
| Ar-1 | Ar-5 | Ar-2 | Ar-6 |
| Ar-1 | Ar-5 | Ar-3 | Ar-2 |
| Ar-1 | Ar-5 | Ar-3 | Ar-3 |
| Ar-1 | Ar-5 | Ar-3 | Ar-4 |
| Ar-1 | Ar-5 | Ar-3 | Ar-5 |
| Ar-1 | Ar-5 | Ar-3 | Ar-6 |
| Ar-1 | Ar-5 | Ar-4 | Ar-2 |
| Ar-1 | Ar-5 | Ar-4 | Ar-3 |
| Ar-1 | Ar-5 | Ar-4 | Ar-4 |
| Ar-1 | Ar-5 | Ar-4 | Ar-5 |
| Ar-1 | Ar-5 | Ar-4 | Ar-6 |
| Ar-1 | Ar-5 | Ar-5 | Ar-1 |
| Ar-1 | Ar-5 | Ar-5 | Ar-2 |
| Ar-1 | Ar-5 | Ar-5 | Ar-3 |

TABLE 1-3-continued

| R1 | R3 | R4 | R6 |
| --- | --- | --- | --- |
| Ar-1 | Ar-5 | Ar-5 | Ar-4 |
| Ar-1 | Ar-5 | Ar-5 | Ar-5 |
| Ar-1 | Ar-5 | Ar-5 | Ar-6 |
| Ar-1 | Ar-5 | Ar-6 | Ar-1 |
| Ar-1 | Ar-5 | Ar-6 | Ar-2 |
| Ar-1 | Ar-5 | Ar-6 | Ar-3 |
| Ar-1 | Ar-5 | Ar-6 | Ar-4 |
| Ar-1 | Ar-5 | Ar-6 | Ar-5 |
| Ar-1 | Ar-5 | Ar-6 | Ar-6 |
| Ar-1 | Ar-6 | Ar-1 | Ar-2 |
| Ar-1 | Ar-6 | Ar-1 | Ar-3 |
| Ar-1 | Ar-6 | Ar-1 | Ar-4 |
| Ar-1 | Ar-6 | Ar-1 | Ar-5 |
| Ar-1 | Ar-6 | Ar-1 | Ar-6 |
| Ar-1 | Ar-6 | Ar-2 | Ar-2 |
| Ar-1 | Ar-6 | Ar-2 | Ar-3 |
| Ar-1 | Ar-6 | Ar-2 | Ar-4 |
| Ar-1 | Ar-6 | Ar-2 | Ar-5 |
| Ar-1 | Ar-6 | Ar-2 | Ar-6 |

TABLE 1-4

| R1 | R3 | R4 | R6 |
| --- | --- | --- | --- |
| Ar-1 | Ar-6 | Ar-3 | Ar-2 |
| Ar-1 | Ar-6 | Ar-3 | Ar-3 |
| Ar-1 | Ar-6 | Ar-3 | Ar-4 |
| Ar-1 | Ar-6 | Ar-3 | Ar-5 |
| Ar-1 | Ar-6 | Ar-3 | Ar-6 |
| Ar-1 | Ar-6 | Ar-4 | Ar-2 |
| Ar-1 | Ar-6 | Ar-4 | Ar-3 |
| Ar-1 | Ar-6 | Ar-4 | Ar-4 |
| Ar-1 | Ar-6 | Ar-4 | Ar-5 |
| Ar-1 | Ar-6 | Ar-4 | Ar-6 |
| Ar-1 | Ar-6 | Ar-5 | Ar-2 |
| Ar-1 | Ar-6 | Ar-5 | Ar-3 |
| Ar-1 | Ar-6 | Ar-5 | Ar-4 |
| Ar-1 | Ar-6 | Ar-5 | Ar-5 |
| Ar-1 | Ar-6 | Ar-5 | Ar-6 |
| Ar-1 | Ar-6 | Ar-6 | Ar-1 |
| Ar-1 | Ar-6 | Ar-6 | Ar-2 |
| Ar-1 | Ar-6 | Ar-6 | Ar-3 |
| Ar-1 | Ar-6 | Ar-6 | Ar-4 |
| Ar-1 | Ar-6 | Ar-6 | Ar-5 |
| Ar-1 | Ar-6 | Ar-6 | Ar-6 |
| Ar-2 | Ar-1 | Ar-1 | Ar-2 |
| Ar-2 | Ar-1 | Ar-1 | Ar-3 |
| Ar-2 | Ar-1 | Ar-1 | Ar-4 |
| Ar-2 | Ar-1 | Ar-1 | Ar-5 |
| Ar-2 | Ar-1 | Ar-1 | Ar-6 |
| Ar-2 | Ar-1 | Ar-2 | Ar-2 |
| Ar-2 | Ar-1 | Ar-2 | Ar-3 |
| Ar-2 | Ar-1 | Ar-2 | Ar-4 |
| Ar-2 | Ar-1 | Ar-2 | Ar-5 |
| Ar-2 | Ar-1 | Ar-2 | Ar-6 |
| Ar-2 | Ar-1 | Ar-3 | Ar-2 |
| Ar-2 | Ar-1 | Ar-3 | Ar-3 |
| Ar-2 | Ar-1 | Ar-3 | Ar-4 |
| Ar-2 | Ar-1 | Ar-3 | Ar-5 |
| Ar-2 | Ar-1 | Ar-3 | Ar-6 |
| Ar-2 | Ar-1 | Ar-4 | Ar-2 |
| Ar-2 | Ar-1 | Ar-4 | Ar-3 |
| Ar-2 | Ar-1 | Ar-4 | Ar-4 |
| Ar-2 | Ar-1 | Ar-4 | Ar-5 |
| Ar-2 | Ar-1 | Ar-4 | Ar-6 |
| Ar-2 | Ar-1 | Ar-5 | Ar-2 |
| Ar-2 | Ar-1 | Ar-5 | Ar-3 |
| Ar-2 | Ar-1 | Ar-5 | Ar-4 |
| Ar-2 | Ar-1 | Ar-5 | Ar-5 |
| Ar-2 | Ar-1 | Ar-5 | Ar-6 |
| Ar-2 | Ar-1 | Ar-6 | Ar-2 |
| Ar-2 | Ar-1 | Ar-6 | Ar-3 |
| Ar-2 | Ar-1 | Ar-6 | Ar-4 |
| Ar-2 | Ar-1 | Ar-6 | Ar-5 |
| Ar-2 | Ar-1 | Ar-6 | Ar-6 |

TABLE 1-4-continued

| R1 | R3 | R4 | R6 |
|---|---|---|---|
| Ar-2 | Ar-2 | Ar-1 | Ar-3 |
| Ar-2 | Ar-2 | Ar-1 | Ar-4 |
| Ar-2 | Ar-2 | Ar-1 | Ar-5 |
| Ar-2 | Ar-2 | Ar-1 | Ar-6 |
| Ar-2 | Ar-2 | Ar-2 | Ar-2 |
| Ar-2 | Ar-2 | Ar-2 | Ar-3 |
| Ar-2 | Ar-2 | Ar-2 | Ar-4 |
| Ar-2 | Ar-2 | Ar-2 | Ar-5 |
| Ar-2 | Ar-2 | Ar-2 | Ar-6 |

TABLE 1-5

| R1 | R3 | R4 | R6 |
|---|---|---|---|
| Ar-2 | Ar-2 | Ar-3 | Ar-2 |
| Ar-2 | Ar-2 | Ar-3 | Ar-3 |
| Ar-2 | Ar-2 | Ar-3 | Ar-4 |
| Ar-2 | Ar-2 | Ar-3 | Ar-5 |
| Ar-2 | Ar-2 | Ar-3 | Ar-6 |
| Ar-2 | Ar-2 | Ar-4 | Ar-2 |
| Ar-2 | Ar-2 | Ar-4 | Ar-3 |
| Ar-2 | Ar-2 | Ar-4 | Ar-4 |
| Ar-2 | Ar-2 | Ar-4 | Ar-5 |
| Ar-2 | Ar-2 | Ar-4 | Ar-6 |
| Ar-2 | Ar-2 | Ar-5 | Ar-2 |
| Ar-2 | Ar-2 | Ar-5 | Ar-3 |
| Ar-2 | Ar-2 | Ar-5 | Ar-4 |
| Ar-2 | Ar-2 | Ar-5 | Ar-5 |
| Ar-2 | Ar-2 | Ar-5 | Ar-6 |
| Ar-2 | Ar-2 | Ar-6 | Ar-2 |
| Ar-2 | Ar-2 | Ar-6 | Ar-3 |
| Ar-2 | Ar-2 | Ar-6 | Ar-4 |
| Ar-2 | Ar-2 | Ar-6 | Ar-5 |
| Ar-2 | Ar-2 | Ar-6 | Ar-6 |
| Ar-2 | Ar-3 | Ar-1 | Ar-3 |
| Ar-2 | Ar-3 | Ar-1 | Ar-4 |
| Ar-2 | Ar-3 | Ar-1 | Ar-5 |
| Ar-2 | Ar-3 | Ar-1 | Ar-6 |
| Ar-2 | Ar-3 | Ar-2 | Ar-3 |
| Ar-2 | Ar-3 | Ar-2 | Ar-4 |
| Ar-2 | Ar-3 | Ar-2 | Ar-5 |
| Ar-2 | Ar-3 | Ar-2 | Ar-6 |
| Ar-2 | Ar-3 | Ar-3 | Ar-2 |
| Ar-2 | Ar-3 | Ar-3 | Ar-3 |
| Ar-2 | Ar-3 | Ar-3 | Ar-4 |
| Ar-2 | Ar-3 | Ar-3 | Ar-5 |
| Ar-2 | Ar-3 | Ar-3 | Ar-6 |
| Ar-2 | Ar-3 | Ar-4 | Ar-2 |
| Ar-2 | Ar-3 | Ar-4 | Ar-3 |
| Ar-2 | Ar-3 | Ar-4 | Ar-4 |
| Ar-2 | Ar-3 | Ar-4 | Ar-5 |
| Ar-2 | Ar-3 | Ar-4 | Ar-6 |
| Ar-2 | Ar-3 | Ar-5 | Ar-2 |
| Ar-2 | Ar-3 | Ar-5 | Ar-3 |
| Ar-2 | Ar-3 | Ar-5 | Ar-4 |
| Ar-2 | Ar-3 | Ar-5 | Ar-5 |
| Ar-2 | Ar-3 | Ar-5 | Ar-6 |
| Ar-2 | Ar-3 | Ar-6 | Ar-2 |
| Ar-2 | Ar-3 | Ar-6 | Ar-3 |
| Ar-2 | Ar-3 | Ar-6 | Ar-4 |
| Ar-2 | Ar-3 | Ar-6 | Ar-5 |
| Ar-2 | Ar-3 | Ar-6 | Ar-6 |
| Ar-2 | Ar-4 | Ar-1 | Ar-3 |
| Ar-2 | Ar-4 | Ar-1 | Ar-4 |
| Ar-2 | Ar-4 | Ar-1 | Ar-5 |
| Ar-2 | Ar-4 | Ar-1 | Ar-6 |
| Ar-2 | Ar-4 | Ar-2 | Ar-3 |
| Ar-2 | Ar-4 | Ar-2 | Ar-4 |
| Ar-2 | Ar-4 | Ar-2 | Ar-5 |
| Ar-2 | Ar-4 | Ar-2 | Ar-6 |
| Ar-2 | Ar-4 | Ar-3 | Ar-3 |
| Ar-2 | Ar-4 | Ar-3 | Ar-4 |
| Ar-2 | Ar-4 | Ar-3 | Ar-5 |
| Ar-2 | Ar-4 | Ar-3 | Ar-6 |

TABLE 1-6

| R1 | R3 | R4 | R6 |
|---|---|---|---|
| Ar-2 | Ar-4 | Ar-4 | Ar-2 |
| Ar-2 | Ar-4 | Ar-4 | Ar-3 |
| Ar-2 | Ar-4 | Ar-4 | Ar-4 |
| Ar-2 | Ar-4 | Ar-4 | Ar-5 |
| Ar-2 | Ar-4 | Ar-4 | Ar-6 |
| Ar-2 | Ar-4 | Ar-5 | Ar-2 |
| Ar-2 | Ar-4 | Ar-5 | Ar-3 |
| Ar-2 | Ar-4 | Ar-5 | Ar-4 |
| Ar-2 | Ar-4 | Ar-5 | Ar-5 |
| Ar-2 | Ar-4 | Ar-5 | Ar-6 |
| Ar-2 | Ar-4 | Ar-6 | Ar-2 |
| Ar-2 | Ar-4 | Ar-6 | Ar-3 |
| Ar-2 | Ar-4 | Ar-6 | Ar-4 |
| Ar-2 | Ar-4 | Ar-6 | Ar-5 |
| Ar-2 | Ar-4 | Ar-6 | Ar-6 |
| Ar-2 | Ar-5 | Ar-1 | Ar-3 |
| Ar-2 | Ar-5 | Ar-1 | Ar-4 |
| Ar-2 | Ar-5 | Ar-1 | Ar-5 |
| Ar-2 | Ar-5 | Ar-1 | Ar-6 |
| Ar-2 | Ar-5 | Ar-2 | Ar-3 |
| Ar-2 | Ar-5 | Ar-2 | Ar-4 |
| Ar-2 | Ar-5 | Ar-2 | Ar-5 |
| Ar-2 | Ar-5 | Ar-2 | Ar-6 |
| Ar-2 | Ar-5 | Ar-3 | Ar-3 |
| Ar-2 | Ar-5 | Ar-3 | Ar-4 |
| Ar-2 | Ar-5 | Ar-3 | Ar-5 |
| Ar-2 | Ar-5 | Ar-3 | Ar-6 |
| Ar-2 | Ar-5 | Ar-4 | Ar-3 |
| Ar-2 | Ar-5 | Ar-4 | Ar-4 |
| Ar-2 | Ar-5 | Ar-4 | Ar-5 |
| Ar-2 | Ar-5 | Ar-4 | Ar-6 |
| Ar-2 | Ar-5 | Ar-5 | Ar-2 |
| Ar-2 | Ar-5 | Ar-5 | Ar-3 |
| Ar-2 | Ar-5 | Ar-5 | Ar-4 |
| Ar-2 | Ar-5 | Ar-5 | Ar-5 |
| Ar-2 | Ar-5 | Ar-5 | Ar-6 |
| Ar-2 | Ar-5 | Ar-6 | Ar-2 |
| Ar-2 | Ar-5 | Ar-6 | Ar-3 |
| Ar-2 | Ar-5 | Ar-6 | Ar-4 |
| Ar-2 | Ar-5 | Ar-6 | Ar-5 |
| Ar-2 | Ar-5 | Ar-6 | Ar-6 |
| Ar-2 | Ar-6 | Ar-1 | Ar-3 |
| Ar-2 | Ar-6 | Ar-1 | Ar-4 |
| Ar-2 | Ar-6 | Ar-1 | Ar-5 |
| Ar-2 | Ar-6 | Ar-1 | Ar-6 |
| Ar-2 | Ar-6 | Ar-2 | Ar-3 |
| Ar-2 | Ar-6 | Ar-2 | Ar-4 |
| Ar-2 | Ar-6 | Ar-2 | Ar-5 |
| Ar-2 | Ar-6 | Ar-2 | Ar-6 |
| Ar-2 | Ar-6 | Ar-3 | Ar-3 |
| Ar-2 | Ar-6 | Ar-3 | Ar-4 |
| Ar-2 | Ar-6 | Ar-3 | Ar-5 |
| Ar-2 | Ar-6 | Ar-3 | Ar-6 |
| Ar-2 | Ar-6 | Ar-4 | Ar-3 |
| Ar-2 | Ar-6 | Ar-4 | Ar-4 |
| Ar-2 | Ar-6 | Ar-4 | Ar-5 |
| Ar-2 | Ar-6 | Ar-4 | Ar-6 |
| Ar-2 | Ar-6 | Ar-5 | Ar-3 |
| Ar-2 | Ar-6 | Ar-5 | Ar-4 |
| Ar-2 | Ar-6 | Ar-5 | Ar-5 |
| Ar-2 | Ar-6 | Ar-5 | Ar-6 |

TABLE 1-7

| R1 | R3 | R4 | R6 |
|---|---|---|---|
| Ar-2 | Ar-6 | Ar-6 | Ar-2 |
| Ar-2 | Ar-6 | Ar-6 | Ar-3 |
| Ar-2 | Ar-6 | Ar-6 | Ar-4 |
| Ar-2 | Ar-6 | Ar-6 | Ar-5 |
| Ar-2 | Ar-6 | Ar-6 | Ar-6 |
| Ar-3 | Ar-1 | Ar-1 | Ar-3 |
| Ar-3 | Ar-1 | Ar-1 | Ar-4 |
| Ar-3 | Ar-1 | Ar-1 | Ar-5 |
| Ar-3 | Ar-1 | Ar-1 | Ar-6 |

TABLE 1-7-continued

| R1 | R3 | R4 | R6 |
|---|---|---|---|
| Ar-3 | Ar-1 | Ar-2 | Ar-3 |
| Ar-3 | Ar-1 | Ar-2 | Ar-4 |
| Ar-3 | Ar-1 | Ar-2 | Ar-5 |
| Ar-3 | Ar-1 | Ar-2 | Ar-6 |
| Ar-3 | Ar-1 | Ar-3 | Ar-3 |
| Ar-3 | Ar-1 | Ar-3 | Ar-4 |
| Ar-3 | Ar-1 | Ar-3 | Ar-5 |
| Ar-3 | Ar-1 | Ar-3 | Ar-6 |
| Ar-3 | Ar-1 | Ar-4 | Ar-3 |
| Ar-3 | Ar-1 | Ar-4 | Ar-4 |
| Ar-3 | Ar-1 | Ar-4 | Ar-5 |
| Ar-3 | Ar-1 | Ar-4 | Ar-6 |
| Ar-3 | Ar-1 | Ar-5 | Ar-3 |
| Ar-3 | Ar-1 | Ar-5 | Ar-4 |
| Ar-3 | Ar-1 | Ar-5 | Ar-5 |
| Ar-3 | Ar-1 | Ar-5 | Ar-6 |
| Ar-3 | Ar-1 | Ar-6 | Ar-3 |
| Ar-3 | Ar-1 | Ar-6 | Ar-4 |
| Ar-3 | Ar-1 | Ar-6 | Ar-5 |
| Ar-3 | Ar-1 | Ar-6 | Ar-6 |
| Ar-3 | Ar-2 | Ar-1 | Ar-4 |
| Ar-3 | Ar-2 | Ar-1 | Ar-5 |
| Ar-3 | Ar-2 | Ar-1 | Ar-6 |
| Ar-3 | Ar-2 | Ar-2 | Ar-3 |
| Ar-3 | Ar-2 | Ar-2 | Ar-4 |
| Ar-3 | Ar-2 | Ar-2 | Ar-5 |
| Ar-3 | Ar-2 | Ar-2 | Ar-6 |
| Ar-3 | Ar-2 | Ar-3 | Ar-3 |
| Ar-3 | Ar-2 | Ar-3 | Ar-4 |
| Ar-3 | Ar-2 | Ar-3 | Ar-5 |
| Ar-3 | Ar-2 | Ar-3 | Ar-6 |
| Ar-3 | Ar-2 | Ar-4 | Ar-3 |
| Ar-3 | Ar-2 | Ar-4 | Ar-4 |
| Ar-3 | Ar-2 | Ar-4 | Ar-5 |
| Ar-3 | Ar-2 | Ar-4 | Ar-6 |
| Ar-3 | Ar-2 | Ar-5 | Ar-3 |
| Ar-3 | Ar-2 | Ar-5 | Ar-4 |
| Ar-3 | Ar-2 | Ar-5 | Ar-5 |
| Ar-3 | Ar-2 | Ar-5 | Ar-6 |
| Ar-3 | Ar-2 | Ar-6 | Ar-3 |
| Ar-3 | Ar-2 | Ar-6 | Ar-4 |
| Ar-3 | Ar-2 | Ar-6 | Ar-5 |
| Ar-3 | Ar-2 | Ar-6 | Ar-6 |
| Ar-3 | Ar-3 | Ar-1 | Ar-4 |
| Ar-3 | Ar-3 | Ar-1 | Ar-5 |
| Ar-3 | Ar-3 | Ar-1 | Ar-6 |
| Ar-3 | Ar-3 | Ar-2 | Ar-4 |
| Ar-3 | Ar-3 | Ar-2 | Ar-5 |
| Ar-3 | Ar-3 | Ar-2 | Ar-6 |
| Ar-3 | Ar-3 | Ar-3 | Ar-3 |
| Ar-3 | Ar-3 | Ar-3 | Ar-4 |
| Ar-3 | Ar-3 | Ar-3 | Ar-5 |

TABLE 1-8

| R1 | R3 | R4 | R6 |
|---|---|---|---|
| Ar-3 | Ar-3 | Ar-3 | Ar-6 |
| Ar-3 | Ar-3 | Ar-4 | Ar-3 |
| Ar-3 | Ar-3 | Ar-4 | Ar-4 |
| Ar-3 | Ar-3 | Ar-4 | Ar-5 |
| Ar-3 | Ar-3 | Ar-4 | Ar-6 |
| Ar-3 | Ar-3 | Ar-5 | Ar-3 |
| Ar-3 | Ar-3 | Ar-5 | Ar-4 |
| Ar-3 | Ar-3 | Ar-5 | Ar-5 |
| Ar-3 | Ar-3 | Ar-5 | Ar-6 |
| Ar-3 | Ar-3 | Ar-6 | Ar-3 |
| Ar-3 | Ar-3 | Ar-6 | Ar-4 |
| Ar-3 | Ar-3 | Ar-6 | Ar-5 |
| Ar-3 | Ar-3 | Ar-6 | Ar-6 |
| Ar-3 | Ar-4 | Ar-1 | Ar-4 |
| Ar-3 | Ar-4 | Ar-1 | Ar-5 |
| Ar-3 | Ar-4 | Ar-1 | Ar-6 |
| Ar-3 | Ar-4 | Ar-2 | Ar-4 |
| Ar-3 | Ar-4 | Ar-2 | Ar-5 |

TABLE 1-8-continued

| R1 | R3 | R4 | R6 |
|---|---|---|---|
| Ar-3 | Ar-4 | Ar-2 | Ar-6 |
| Ar-3 | Ar-4 | Ar-3 | Ar-4 |
| Ar-3 | Ar-4 | Ar-3 | Ar-5 |
| Ar-3 | Ar-4 | Ar-3 | Ar-6 |
| Ar-3 | Ar-4 | Ar-4 | Ar-3 |
| Ar-3 | Ar-4 | Ar-4 | Ar-4 |
| Ar-3 | Ar-4 | Ar-4 | Ar-5 |
| Ar-3 | Ar-4 | Ar-4 | Ar-6 |
| Ar-3 | Ar-4 | Ar-5 | Ar-3 |
| Ar-3 | Ar-4 | Ar-5 | Ar-4 |
| Ar-3 | Ar-4 | Ar-5 | Ar-5 |
| Ar-3 | Ar-4 | Ar-5 | Ar-6 |
| Ar-3 | Ar-4 | Ar-6 | Ar-3 |
| Ar-3 | Ar-4 | Ar-6 | Ar-4 |
| Ar-3 | Ar-4 | Ar-6 | Ar-5 |
| Ar-3 | Ar-4 | Ar-6 | Ar-6 |
| Ar-3 | Ar-5 | Ar-1 | Ar-4 |
| Ar-3 | Ar-5 | Ar-1 | Ar-5 |
| Ar-3 | Ar-5 | Ar-1 | Ar-6 |
| Ar-3 | Ar-5 | Ar-2 | Ar-4 |
| Ar-3 | Ar-5 | Ar-2 | Ar-5 |
| Ar-3 | Ar-5 | Ar-2 | Ar-6 |
| Ar-3 | Ar-5 | Ar-3 | Ar-4 |
| Ar-3 | Ar-5 | Ar-3 | Ar-5 |
| Ar-3 | Ar-5 | Ar-3 | Ar-6 |
| Ar-3 | Ar-5 | Ar-4 | Ar-4 |
| Ar-3 | Ar-5 | Ar-4 | Ar-5 |
| Ar-3 | Ar-5 | Ar-4 | Ar-6 |
| Ar-3 | Ar-5 | Ar-5 | Ar-3 |
| Ar-3 | Ar-5 | Ar-5 | Ar-4 |
| Ar-3 | Ar-5 | Ar-5 | Ar-5 |
| Ar-3 | Ar-5 | Ar-5 | Ar-6 |
| Ar-3 | Ar-5 | Ar-6 | Ar-3 |
| Ar-3 | Ar-5 | Ar-6 | Ar-4 |
| Ar-3 | Ar-5 | Ar-6 | Ar-5 |
| Ar-3 | Ar-5 | Ar-6 | Ar-6 |
| Ar-3 | Ar-6 | Ar-1 | Ar-4 |
| Ar-3 | Ar-6 | Ar-1 | Ar-5 |
| Ar-3 | Ar-6 | Ar-1 | Ar-6 |
| Ar-3 | Ar-6 | Ar-2 | Ar-4 |
| Ar-3 | Ar-6 | Ar-2 | Ar-5 |
| Ar-3 | Ar-6 | Ar-2 | Ar-6 |

TABLE 1-9

| R1 | R3 | R4 | R6 |
|---|---|---|---|
| Ar-3 | Ar-6 | Ar-3 | Ar-4 |
| Ar-3 | Ar-6 | Ar-3 | Ar-5 |
| Ar-3 | Ar-6 | Ar-3 | Ar-6 |
| Ar-3 | Ar-6 | Ar-4 | Ar-4 |
| Ar-3 | Ar-6 | Ar-4 | Ar-5 |
| Ar-3 | Ar-6 | Ar-4 | Ar-6 |
| Ar-3 | Ar-6 | Ar-5 | Ar-4 |
| Ar-3 | Ar-6 | Ar-5 | Ar-5 |
| Ar-3 | Ar-6 | Ar-5 | Ar-6 |
| Ar-3 | Ar-6 | Ar-6 | Ar-3 |
| Ar-3 | Ar-6 | Ar-6 | Ar-4 |
| Ar-3 | Ar-6 | Ar-6 | Ar-5 |
| Ar-3 | Ar-6 | Ar-6 | Ar-6 |
| Ar-4 | Ar-1 | Ar-1 | Ar-4 |
| Ar-4 | Ar-1 | Ar-1 | Ar-5 |
| Ar-4 | Ar-1 | Ar-1 | Ar-6 |
| Ar-4 | Ar-1 | Ar-2 | Ar-4 |
| Ar-4 | Ar-1 | Ar-2 | Ar-5 |
| Ar-4 | Ar-1 | Ar-2 | Ar-6 |
| Ar-4 | Ar-1 | Ar-3 | Ar-4 |
| Ar-4 | Ar-1 | Ar-3 | Ar-5 |
| Ar-4 | Ar-1 | Ar-3 | Ar-6 |
| Ar-4 | Ar-1 | Ar-4 | Ar-4 |
| Ar-4 | Ar-1 | Ar-4 | Ar-5 |
| Ar-4 | Ar-1 | Ar-4 | Ar-6 |
| Ar-4 | Ar-1 | Ar-5 | Ar-4 |
| Ar-4 | Ar-1 | Ar-5 | Ar-5 |
| Ar-4 | Ar-1 | Ar-5 | Ar-6 |

TABLE 1-9-continued

| R1 | R3 | R4 | R6 |
|---|---|---|---|
| Ar-4 | Ar-1 | Ar-6 | Ar-4 |
| Ar-4 | Ar-1 | Ar-6 | Ar-5 |
| Ar-4 | Ar-1 | Ar-6 | Ar-6 |
| Ar-4 | Ar-2 | Ar-1 | Ar-5 |
| Ar-4 | Ar-2 | Ar-1 | Ar-6 |
| Ar-4 | Ar-2 | Ar-2 | Ar-4 |
| Ar-4 | Ar-2 | Ar-2 | Ar-5 |
| Ar-4 | Ar-2 | Ar-2 | Ar-6 |
| Ar-4 | Ar-2 | Ar-3 | Ar-4 |
| Ar-4 | Ar-2 | Ar-3 | Ar-5 |
| Ar-4 | Ar-2 | Ar-3 | Ar-6 |
| Ar-4 | Ar-2 | Ar-4 | Ar-4 |
| Ar-4 | Ar-2 | Ar-4 | Ar-5 |
| Ar-A | Ar-2 | Ar-4 | Ar-6 |
| Ar-4 | Ar-2 | Ar-5 | Ar-4 |
| Ar-4 | Ar-2 | Ar-5 | Ar-5 |
| Ar-4 | Ar-2 | Ar-5 | Ar-6 |
| Ar-4 | Ar-2 | Ar-6 | Ar-4 |
| Ar-4 | Ar-2 | Ar-6 | Ar-5 |
| Ar-4 | Ar-2 | Ar-6 | Ar-6 |
| Ar-4 | Ar-3 | Ar-1 | Ar-5 |
| Ar-4 | Ar-3 | Ar-1 | Ar-6 |
| Ar-4 | Ar-3 | Ar-2 | Ar-5 |
| Ar-4 | Ar-3 | Ar-2 | Ar-6 |
| Ar-4 | Ar-3 | Ar-3 | Ar-4 |
| Ar-4 | Ar-3 | Ar-3 | Ar-5 |
| Ar-4 | Ar-3 | Ar-3 | Ar-6 |
| Ar-4 | Ar-3 | Ar-4 | Ar-4 |
| Ar-4 | Ar-3 | Ar-4 | Ar-5 |
| Ar-4 | Ar-3 | Ar-4 | Ar-6 |
| Ar-4 | Ar-3 | Ar-5 | Ar-4 |
| Ar-4 | Ar-3 | Ar-5 | Ar-5 |
| Ar-4 | Ar-3 | Ar-5 | Ar-6 |

TABLE 1-10

| R1 | R3 | R4 | R6 |
|---|---|---|---|
| Ar-4 | Ar-3 | Ar-6 | Ar-4 |
| Ar-4 | Ar-3 | Ar-6 | Ar-5 |
| Ar-4 | Ar-3 | Ar-6 | Ar-6 |
| Ar-4 | Ar-4 | Ar-1 | Ar-5 |
| Ar-4 | Ar-4 | Ar-1 | Ar-6 |
| Ar-4 | Ar-4 | Ar-2 | Ar-5 |
| Ar-4 | Ar-4 | Ar-2 | Ar-6 |
| Ar-4 | Ar-4 | Ar-3 | Ar-5 |
| Ar-4 | Ar-4 | Ar-3 | Ar-6 |
| Ar-4 | Ar-4 | Ar-4 | Ar-4 |
| Ar-4 | Ar-4 | Ar-4 | Ar-5 |
| Ar-4 | Ar-4 | Ar-4 | Ar-6 |
| Ar-4 | Ar-4 | Ar-5 | Ar-4 |
| Ar-4 | Ar-4 | Ar-5 | Ar-5 |
| Ar-4 | Ar-4 | Ar-5 | Ar-6 |
| Ar-4 | Ar-4 | Ar-6 | Ar-4 |
| Ar-4 | Ar-4 | Ar-6 | Ar-5 |
| Ar-4 | Ar-4 | Ar-6 | Ar-6 |
| Ar-4 | Ar-5 | Ar-1 | Ar-5 |
| Ar-4 | Ar-5 | Ar-1 | Ar-6 |
| Ar-4 | Ar-5 | Ar-2 | Ar-5 |
| Ar-4 | Ar-5 | Ar-2 | Ar-6 |
| Ar-4 | Ar-5 | Ar-3 | Ar-5 |
| Ar-4 | Ar-5 | Ar-3 | Ar-6 |
| Ar-4 | Ar-5 | Ar-4 | Ar-5 |
| Ar-4 | Ar-5 | Ar-4 | Ar-6 |
| Ar-4 | Ar-5 | Ar-5 | Ar-4 |
| Ar-4 | Ar-5 | Ar-5 | Ar-5 |
| Ar-4 | Ar-5 | Ar-5 | Ar-6 |
| Ar-4 | Ar-5 | Ar-6 | Ar-4 |
| Ar-4 | Ar-5 | Ar-6 | Ar-5 |
| Ar-4 | Ar-5 | Ar-6 | Ar-6 |
| Ar-4 | Ar-6 | Ar-1 | Ar-5 |
| Ar-4 | Ar-6 | Ar-1 | Ar-6 |
| Ar-4 | Ar-6 | Ar-2 | Ar-5 |
| Ar-4 | Ar-6 | Ar-2 | Ar-6 |
| Ar-4 | Ar-6 | Ar-3 | Ar-5 |

TABLE 1-10-continued

| R1 | R3 | R4 | R6 |
|---|---|---|---|
| Ar-4 | Ar-6 | Ar-3 | Ar-6 |
| Ar-4 | Ar-6 | Ar-4 | Ar-5 |
| Ar-4 | Ar-6 | Ar-4 | Ar-6 |
| Ar-4 | Ar-6 | Ar-5 | Ar-5 |
| Ar-4 | Ar-6 | Ar-5 | Ar-6 |
| Ar-4 | Ar-6 | Ar-6 | Ar-4 |
| Ar-4 | Ar-6 | Ar-6 | Ar-5 |
| Ar-4 | Ar-6 | Ar-6 | Ar-6 |
| Ar-5 | Ar-1 | Ar-1 | Ar-5 |
| Ar-5 | Ar-1 | Ar-1 | Ar-6 |
| Ar-5 | Ar-1 | Ar-2 | Ar-5 |
| Ar-5 | Ar-1 | Ar-2 | Ar-6 |
| Ar-5 | Ar-1 | Ar-3 | Ar-5 |
| Ar-5 | Ar-1 | Ar-3 | Ar-6 |
| Ar-5 | Ar-1 | Ar-4 | Ar-5 |
| Ar-5 | Ar-1 | Ar-4 | Ar-6 |
| Ar-5 | Ar-1 | Ar-5 | Ar-5 |
| Ar-5 | Ar-1 | Ar-5 | Ar-6 |
| Ar-5 | Ar-1 | Ar-6 | Ar-5 |
| Ar-5 | Ar-1 | Ar-6 | Ar-6 |
| Ar-5 | Ar-2 | Ar-1 | Ar-6 |
| Ar-5 | Ar-2 | Ar-2 | Ar-5 |
| Ar-5 | Ar-2 | Ar-2 | Ar-6 |
| Ar-5 | Ar-2 | Ar-3 | Ar-5 |
| Ar-5 | Ar-2 | Ar-3 | Ar-6 |

TABLE 1-11

| R1 | R3 | R4 | R6 |
|---|---|---|---|
| Ar-5 | Ar-2 | Ar-4 | Ar-5 |
| Ar-5 | Ar-2 | Ar-4 | Ar-6 |
| Ar-5 | Ar-2 | Ar-5 | Ar-5 |
| Ar-5 | Ar-2 | Ar-5 | Ar-6 |
| Ar-5 | Ar-2 | Ar-6 | Ar-5 |
| Ar-5 | Ar-2 | Ar-6 | Ar-6 |
| Ar-5 | Ar-3 | Ar-1 | Ar-6 |
| Ar-5 | Ar-3 | Ar-2 | Ar-6 |
| Ar-5 | Ar-3 | Ar-3 | Ar-5 |
| Ar-5 | Ar-3 | Ar-3 | Ar-6 |
| Ar-5 | Ar-3 | Ar-4 | Ar-5 |
| Ar-5 | Ar-3 | Ar-4 | Ar-6 |
| Ar-5 | Ar-3 | Ar-5 | Ar-5 |
| Ar-5 | Ar-3 | Ar-5 | Ar-6 |
| Ar-5 | Ar-3 | Ar-6 | Ar-5 |
| Ar-5 | Ar-3 | Ar-6 | Ar-6 |
| Ar-5 | Ar-4 | Ar-1 | Ar-6 |
| Ar-5 | Ar-4 | Ar-2 | Ar-6 |
| Ar-5 | Ar-4 | Ar-3 | Ar-6 |
| Ar-5 | Ar-4 | Ar-4 | Ar-5 |
| Ar-5 | Ar-4 | Ar-4 | Ar-6 |
| Ar-5 | Ar-4 | Ar-5 | Ar-5 |
| Ar-5 | Ar-4 | Ar-5 | Ar-6 |
| Ar-5 | Ar-4 | Ar-6 | Ar-5 |
| Ar-5 | Ar-4 | Ar-6 | Ar-6 |
| Ar-5 | Ar-5 | Ar-1 | Ar-6 |
| Ar-5 | Ar-5 | Ar-2 | Ar-6 |
| Ar-5 | Ar-5 | Ar-3 | Ar-6 |
| Ar-5 | Ar-5 | Ar-4 | Ar-6 |
| Ar-5 | Ar-5 | Ar-5 | Ar-5 |
| Ar-5 | Ar-5 | Ar-5 | Ar-6 |
| Ar-5 | Ar-5 | Ar-6 | Ar-5 |
| Ar-5 | Ar-5 | Ar-6 | Ar-6 |
| Ar-5 | Ar-6 | Ar-1 | Ar-6 |
| Ar-5 | Ar-6 | Ar-2 | Ar-6 |
| Ar-5 | Ar-6 | Ar-3 | Ar-6 |
| Ar-5 | Ar-6 | Ar-4 | Ar-6 |
| Ar-5 | Ar-6 | Ar-5 | Ar-6 |
| Ar-5 | Ar-6 | Ar-6 | Ar-5 |
| Ar-5 | Ar-6 | Ar-6 | Ar-6 |
| Ar-6 | Ar-1 | Ar-2 | Ar-6 |
| Ar-6 | Ar-1 | Ar-3 | Ar-6 |
| Ar-6 | Ar-1 | Ar-4 | Ar-6 |
| Ar-6 | Ar-1 | Ar-5 | Ar-6 |

TABLE 1-11-continued

| R1 | R3 | R4 | R6 |
|---|---|---|---|
| Ar-6 | Ar-1 | Ar-6 | Ar-6 |
| Ar-6 | Ar-2 | Ar-2 | Ar-6 |
| Ar-6 | Ar-2 | Ar-3 | Ar-6 |
| Ar-6 | Ar-2 | Ar-4 | Ar-6 |
| Ar-6 | Ar-2 | Ar-5 | Ar-6 |
| Ar-6 | Ar-2 | Ar-6 | Ar-6 |
| Ar-6 | Ar-3 | Ar-3 | Ar-6 |
| Ar-6 | Ar-3 | Ar-4 | Ar-6 |
| Ar-6 | Ar-3 | Ar-5 | Ar-6 |
| Ar-6 | Ar-3 | Ar-6 | Ar-6 |
| Ar-6 | Ar-4 | Ar-4 | Ar-6 |
| Ar-6 | Ar-4 | Ar-5 | Ar-6 |
| Ar-6 | Ar-4 | Ar-6 | Ar-6 |
| Ar-6 | Ar-5 | Ar-5 | Ar-6 |
| Ar-6 | Ar-5 | Ar-6 | Ar-6 |
| Ar-6 | Ar-6 | Ar-6 | Ar-6 |

If X is C—$R^7$ in general formula (1), the substituent $R^7$ has a large effect of reducing the durability of the compound represented by general formula (1), that is, reducing the light emission strength of the compound over time. More specifically, if $R^7$ is hydrogen, the hydrogen easily reacts with moisture and oxygen in the air due to the high reactivity of the hydrogen. This causes the decomposition of the compound represented by general formula (1). If $R^7$ is a substituent with a high degree of freedom of movement in the molecular chain such as, for example, an alkyl group, then the reactivity certainly drops, although the compounds aggregate in the color conversion composition over time, which invites a reduction in the light emission strength due to concentration quenching. Accordingly, $R^7$ is preferably a rigid group with little freedom of movement and does hot easily aggregate. $R^7$ is preferably one of, for example, a substituted or unsubstituted alkyl group, a substituted or unsubstituted cycloalkyl group, a substituted or unsubstituted aryl group, or a substituted or unsubstituted heteroaryl group.

$R^7$ is preferably a substituted or unsubstituted aryl group from the perspective of light stability. If $R^7$ is a substituted or unsubstituted aryl group, molecular aggregation can be prevented without loss of light emission wavelength, thereby improving the durability of the compound represented by general formula (1). More specifically, $R^7$ is preferably a substituted or unsubstituted phenyl group, a substituted or unsubstituted biphenyl group, a substituted or unsubstituted terphenyl group, or a substituted or unsubstituted naphthyl group, and more preferably a substituted or unsubstituted phenyl group, a substituted or unsubstituted biphenyl group, or a substituted or unsubstituted terphenyl group.

If $R^7$ is substituted, from the perspectives of enhancing the solvent compatibility and improving the light emission efficiency, the substituent is preferably a substituted or unsubstituted alkyl group or a substituted or unsubstituted alkoxy group, more preferably a methyl group, an ethyl group, an isopropyl group, a tert-butyl group, or a methoxy group, and, from the perspective of dispersibility, particularly preferably a tert-butyl group or a methoxy group. The reason for this preference is to prevent light quenching due to molecular aggregation.

A substituted or unsubstituted phenyl group may be given as a particularly preferable example of $R^7$. More specifically, a phenyl group, a 2-tolyl group, a 3-tolyl group, a 4-tolyl group, a 2-methoxyphenyl group, a 3-methoxyphenyl group, a 4-methoxyphenyl group, a 4-ethyl phenyl group, a 4-n-propylphenyl group, a 4-isopropylphenyl group, a 4-n-butylphenyl group, a 4-t-butylphenyl group, a 2,4-xylyl group, a 3,5-xylyl group, a 2,6-xylyl group, a 2,4-dimethoxyphenyl group, a 3,5-dimethoxyphenyl group, a 2,6-dimethoxyphenyl group, a 2,4,6-trimethylphenyl group (mesityl group), a 2,4,6-trimethoxyphenyl group, and a fluorenyl group may be given as examples.

If $R^7$ is substituted, the substituent is preferably an electron-withdrawing group from the perspective of improving durability through improved stability of the compound represented by general formula (1) against oxygen. A fluorine, a fluorine-containing alkyl group, a substituted or unsubstituted acyl group, a substituted or unsubstituted ester group, a substituted or unsubstituted amide group, a substituted or unsubstituted sulfonyl group, a nitro group, a silyl group, a cyano group, an aromatic heterocyclic group, and the like may be given as preferable electron-withdrawing groups.

A fluorophenyl group, a trifluoromethylphenyl group, a carboxylate phenyl group, an acylphenyl group, an amide phenyl group, a sulfonyl phenyl group, a nitrophenyl group-, a silylphenyl group, and a benzonitrile group may be given as particularly preferable examples of $R^7$. More specifically, a 2-fluorophenyl group, a 3-fluorophenyl group, a 4-fluorophenyl group, a 2,3-difluorophenyl group, a 2,4-difluorophenyl group, a 2,5-difluorophenyl group, a 2,6-difluorophenyl group, a 3,5-difluorophenyl group, a 2,3,4-trifluorophenyl group, a 2,3,5-trifluorophenyl group, a 2,4,5-trifluorophenyl group, a 2,4,6-trifluorophenyl group, a 2,3,4,5-tetrafluorophenyl group, a 2,3,4,6-tetrafluorophenyl group, a 2,3,5,6-tetrafluorophenyl group, a 2,3,4,5,6-pentafluorophenyl group, a 2-trifluoromethylphenyl group, a 3-trifluoromethylphenyl group, a 4-trifluoromethylphenyl group, a 2,3-bis(trifluoromethyl)phenyl group, a 2,4-bis(trifluoromethyl)phenyl group, a 2,5-bis(trifluoromethyl)phenyl group, a 2,6-di-bis(trifluoromethyl)phenyl group, a 3,5-bis(trifluoromethyl)phenyl group, a 2,3,4-tris(trifluoromethyl)phenyl group, a 2,3,5-tris(trifluoromethyl)phenyl group, a 2,4,5-tris(trifluoromethyl)phenyl group, a 2,4,6-tris(trifluoromethyl)phenyl group, a 2,3,4,5-tetrakis(trifluoromethyl)phenyl group, a 2,3,4,6-tetrakis(trifluoromethyl)phenyl group, a 2,3,5,6-tetrakis(trifluoromethyl)phenyl group, a 2,3,4,5,6-penta(trifluoromethyl)phenyl group, a 2-methoxycarbonyl phenyl group, a 3-methoxycarbonyl phenyl group, a 4-methoxycarbonyl phenyl group, a 2,3,4-tris(trifluoromethyl)phenyl group, a 2,3,5-tris(trifluoromethyl)phenyl group, a 2,4,5-tris(trifluoromethyl)phenyl group, a 2,4,6-tris(trifluoromethyl)phenyl group, a 2,3,4,5-tetrakis(trifluoromethyl)phenyl group, a 2,3,4,6-tetrakis(trifluoromethyl)phenyl group, a 2,3,5,6-tetrakis(trifluoromethyl)phenyl group, a 2,3,4,5,6-penta(trifluoromethyl) phenyl group, a 3,5-bis(methoxycarbonyl)phenyl group, a 3,5-bis(methoxycarbonyl)phenyl group, a 4-nitrophenyl group, a 4-trimethylsilyl phenyl group, a 3,5-bis(trimethylsilyl)phenyl group, and a 4-benzonitrile group can be given as preferable examples. Among these, a 3-methoxycarbonyl phenyl group, a 4-methoxycarbonyl phenyl group, a 3,5-bis(methoxycarbonyl)phenyl group, a 3-trifluoromethylphenyl group, a 4-trifluoromethylphenyl group, and a 3,5-bis(trifluoromethyl)phenyl group are more preferable.

Compounds with the structure represented by general formula (2) below can be given as more favorable examples of the compound represented by general formula (1).

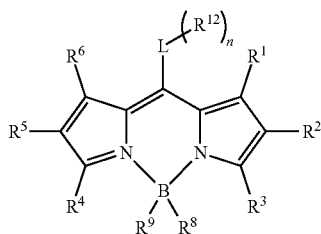

(2)

The same applies to $R^1$ to $R^6$, $R^8$, and $R^9$ in general formula (2) as applies in general formula (1). $R^{12}$ is a substituted or unsubstituted aryl group or a substituted or unsubstituted heteroaryl group. L is a substituted or unsubstituted arylene group or a substituted or unsubstituted heteroarylene group. n is an integer of 1 to 5. If n is between 2 and 5, n $R^{12}$s may be the same or different.

The compound represented by general formula (2) has a substituted or unsubstituted arylene group or a substituted or unsubstituted heteroarylene group in the pyrromethene-boron complex skeleton. By providing the substituted or unsubstituted arylene group or the substituted or unsubstituted heteroarylene group with suitable bulk, molecular aggregation can be prevented. This results in further improved light emission efficiency and durability in the compound represented by general formula (2).

L is preferably a substituted or unsubstituted arylene group in general formula (2) from the perspective of light stability. If L is a substituted or unsubstituted arylene group, it is possible to prevent molecular aggregation without a loss in light emission wavelength. As a result, the durability of the compound represented by general formula (2) can be improved. More specifically, the arylene group is preferably a phenylene group, a biphenylene group, or a naphthylene group.

If L is substituted, from the perspectives of enhancing the solvent compatibility and improving the light emission efficiency, the substituent is preferably a substituted or unsubstituted alkyl group or a substituted or unsubstituted alkoxy group, and more preferably a methyl group, an ethyl group, an isopropyl group, a tert-butyl group, or a methoxy group. The substituent is particularly preferably a tert-butyl group or a methoxy group from the perspective of dispersibility. The reason for this preference is because light quenching due to molecular aggregation can be prevented.

If L is substituted, the substituent is preferably an electron-withdrawing group from the perspective of improving durability through improved stability of the compound represented by general formula (2) against oxygen. The electron-withdrawing group is preferably fluorine, a fluorine-containing alkyl group, a substituted or unsubstituted acyl group, a substituted or unsubstituted ester group, a substituted or unsubstituted amide group, a substituted or unsubstituted sulfonyl group, a nitro group, a silyl group, a cyano group, an aromatic heterocyclic group, or the like.

$R^{12}$ is preferably a substituted or unsubstituted aryl group in general formula (2) from the perspective of light stability. If $R^{12}$ is a substituted or unsubstituted aryl group, molecular aggregation can be prevented without loss of light emission wavelength, thereby improving the durability of the compound represented by general formula (2). More specifically, the aryl group is preferably a substituted or unsubstituted phenyl group, a substituted or unsubstituted biphenyl group, a substituted or unsubstituted terphenyl group, or a substituted or unsubstituted naphthyl group, and more preferably a substituted or unsubstituted phenyl group, a substituted or unsubstituted biphenyl group, or a substituted or unsubstituted terphenyl group.

If $R^{12}$ is substituted, from the perspectives of enhancing the solvent compatibility and improving the light emission efficiency, the substituent is preferably a substituted or unsubstituted alkyl group or a substituted or unsubstituted alkoxy group, and more preferably a methyl group, an ethyl group, an isopropyl group, a tert-butyl group, or a methoxy group. The substituent is particularly preferably a tert-butyl group or a methoxy group from the perspective of dispersibility. The reason for this preference is to prevent light quenching due to molecular aggregation.

A substituted or unsubstituted phenyl group may be given as a particularly preferable example of $R^{12}$. More specifically, a phenyl group, a 2-tolyl group, a 3-tolyl group, a 4-tolyl group, a 2-methoxyphenyl group, a 3-methoxyphenyl group, a 4-methoxyphenyl group, a 4-ethyl phenyl group, a 4-n-propylphenyl group, a 4-isopropylphenyl group, a 4-n-butylphenyl group, a 4-t-butylphenyl group, a 2,4-xylyl group, a 3,5-xylyl group, a 2,6-xylyl group, a 2,4-dimethoxyphenyl group, a 3,5-dimethoxyphenyl group, a 2,6-dimethoxyphenyl group, a 2,4,6-trimethylphenyl group (mesityl group), a 2,4,6-trimethoxyphenyl group, and a fluorenyl group may be given as examples.

If $R^{12}$ is substituted, the substituent is preferably an electron-withdrawing group from the perspective of improving durability through improved stability of the compound represented by general formula (2) against oxygen. The electron-withdrawing group is preferably fluorine, a fluorine-containing alkyl group, a substituted or unsubstituted acyl group, a substituted or unsubstituted alkoxy carbonyl group, a substituted or unsubstituted aryl oxycarbonyl group, a substituted or unsubstituted ester group, a substituted or unsubstituted amide group, a substituted or unsubstituted sulfonyl group, a nitro group, a silyl group, a cyano group, an aromatic heterocyclic group, or the like, for example.

A fluorophenyl group, a trifluoromethylphenyl group, an alkoxycarbonylphenyl group, an aryloxycarbonylphenyl group, a carboxylate phenyl group, an acylphenyl group, an amide phenyl group, a sulfonyl phenyl group, a nitrophenyl group, a silylphenyl group, and a benzonitrile group may be given as particularly preferable examples of $R^{12}$. More specifically, a 2-fluorophenyl group, a 3-fluorophenyl group, a 4-fluorophenyl group, a 2,3-difluorophenyl group, a 2,4-difluorophenyl group, a 2,5-difluorophenyl group, a 2,6-difluorophenyl group, a 3,5-difluorophenyl group, a 2,3,4-trifluorophenyl group, a 2,3,5-trifluorophenyl group, a 2,4,5-trifluorophenyl group, a 2,4,6-trifluorophenyl group, a 2,3,4,5-tetrafluorophenyl group, a 2,3,4,6-tetrafluorophenyl group, a 2,3,5,6-tetrafluorophenyl group, a 2,3,4,5,6-pentafluorophenyl group, a 2-trifluoromethylphenyl group, a 3-trifluoromethylphenyl group, a 4-trifluoromethylphenyl group, a 2,3-bis(trifluoromethyl)phenyl group, a 2,4-bis(trifluoromethyl)phenyl group, a 2,5-bis(trifluoromethyl)phenyl group, a 2,6-di-bis(trifluoromethyl)phenyl group, a 3,5-bis(trifluoromethyl)phenyl group, a 2,3,4-tris(trifluoromethyl)phenyl group, a 2,3,5-tris(trifluoromethyl)phenyl group, a 2,4,5-tris(trifluoromethyl)phenyl group, a 2,4,6-tris(trifluoromethyl)phenyl group, a 2,3,4,5-tetrakis(trifluoromethyl)phenyl group, a 2,3,4,6-tetrakis(trifluoromethyl)phenyl group, a 2,3,5,6-tetrakis(trifluoromethyl)phenyl group, a 2,3,4,5,6-penta(trifluoromethyl)phenyl group, a 2-methoxycarbonyl phenyl group, a 3-methoxycarbonyl phenyl group, a 4-methoxycarbonyl phenyl group, a 3,5-bis(methoxycarbonyl)phenyl group, a 4-nitrophenyl group, a 4-trimethylsilyl phenyl group, a 3,5-bis(trimethylsilyl)phenyl group, and a 4-benzonitrile group can be given as examples. Among these, the 4-methoxycarbonyl phenyl group and the 3,5-bis(trifluoromethyl) group are more preferable.

From the perspectives of imparting a higher emission quantum yield, more resistance to thermal disintegration, and light stability, L in general formula (2) is preferably a substituted or unsubstituted phenylene group.

In general formula (2), the integer n is preferably 1 or 2. More specifically, the compound represented by general formula (2) preferably contains one or two $R^{12}$s. By providing the compound with one or two $R^{12}$s having a bulky substituent or an electron-withdrawing group, the durability of the compound represented by general formula (2) can be improved while maintaining the high emission quantum yield.

In general formula (2), n is preferably 2. More specifically, the compound represented by general formula (2) preferably contains two $R^{12}$s. By ensuring that the compound necessarily contains two $R^{12}$s having a bulky substituent or an electron-withdrawing group, the durability of the compound represented by general formula (2) can be improved while maintaining the high emission quantum yield. If n is 2, the two $R^{12}$s can be the same or different.

In general formulas (1) and (2), $R^8$ and $R^9$ are preferably an alkyl group, an aryl group, a heteroaryl group, an alkoxy group, an aryloxy group, fluorine, a fluorine-containing alkyl group, a fluorine-containing heteroaryl group, a fluorine-containing aryl group, a fluorine-containing alkoxy group, a fluorine-containing aryloxy group, or a cyano group, and, from the perspective of stability of the excitation light and a higher emission quantum yield, more preferably fluorine, a fluorine-containing alkyl group, a fluorine-containing alkoxy group, a fluorine-containing aryl group, or a cyano group. Among these, $R^8$ and $R^9$ are even more favorably fluorine or a cyano group from a perspective of ease of synthesis.

Here, the fluorine-containing aryl group is an aryl group containing fluorine. A fluorophenyl group, a trifluoromethylphenyl group, and a pentafluorophenyl group may be given as examples of the fluorine-containing aryl group. The term fluorine-containing heteroaryl group refers to a heteroaryl group containing fluorine. A fluoropyridyl group, a trifluoromethylpyridyl group, and a trifluoropyridyl group may be given as examples of the fluorine-containing heteroaryl group. The term fluorine-containing alkyl group refers to an alkyl group containing fluorine. A trifluoromethyl group and a pentafluoroethyl group may be given as examples of the fluorine-containing alkyl group.

In particular, either $R^8$ or $R^9$ is preferably a cyano group. Because a cyano group has a strong electron-withdrawing property, the introduction of a cyano group as a substituent on the boron in the pyrromethene-boron complex skeleton lowers the electron density thereof. Doing so improves the stability of the compound represented by general formula (1) or general formula (2) against oxygen, resulting in improved durability of the compound.

Further, $R^8$ and $R^9$ are both preferably cyano groups. The electron density of the pyrromethene-boron complex skeleton can be further lowered by introducing two cyano groups on the boron. Doing so further improves the stability of the compound represented by general formula (1) or general formula (2) against oxygen, resulting in a great improvement in durability of the compound.

Examples of the compound represented by general formula (1) are presented below, but the compound is not limited thereto.

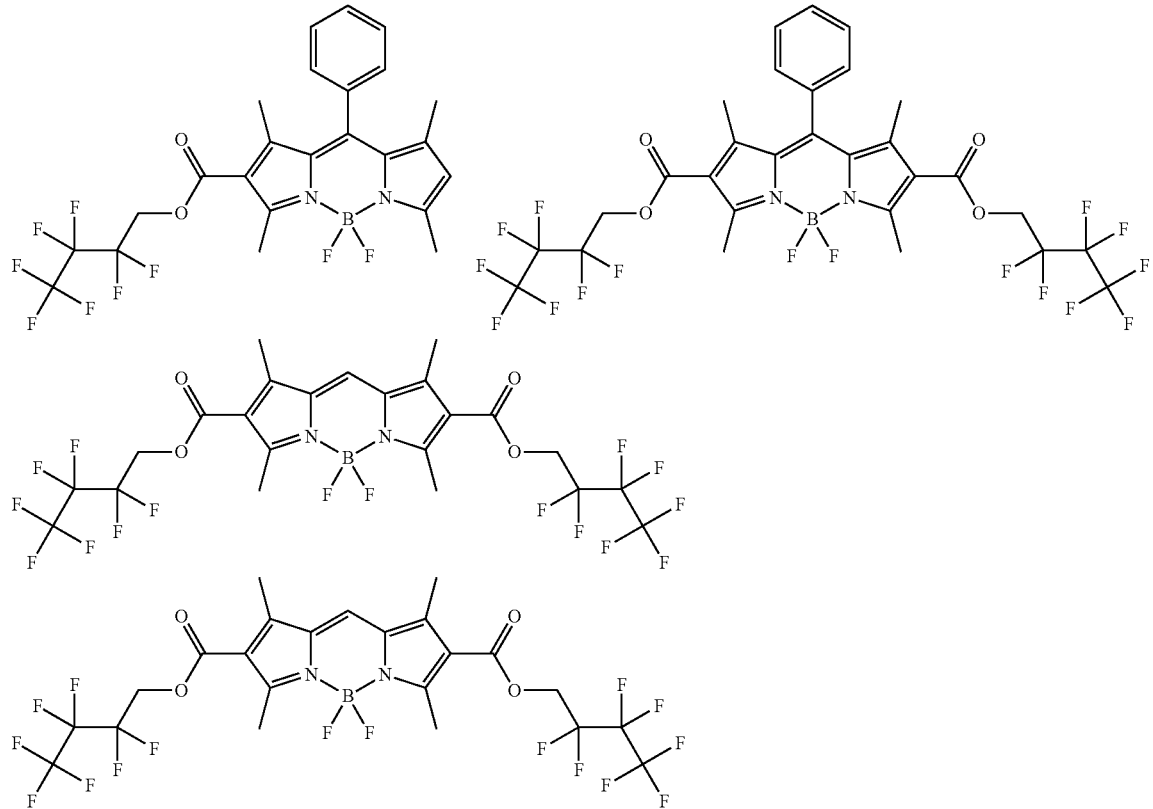

-continued
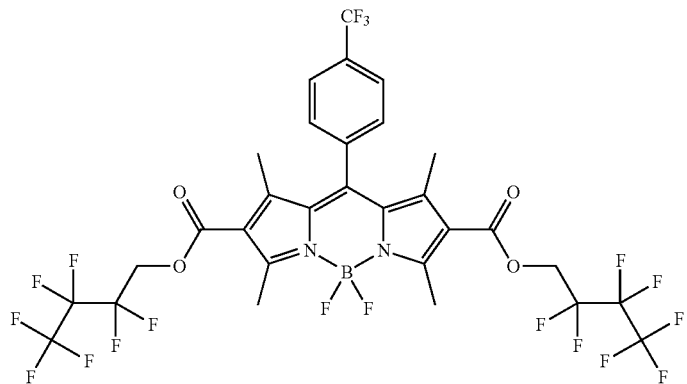
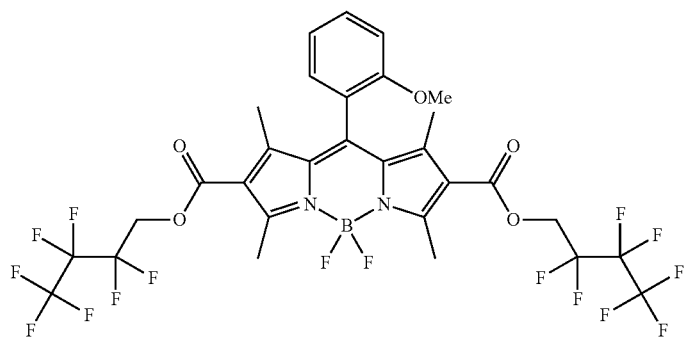
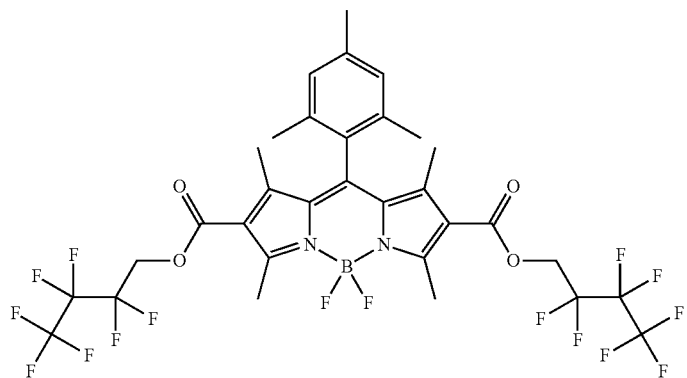
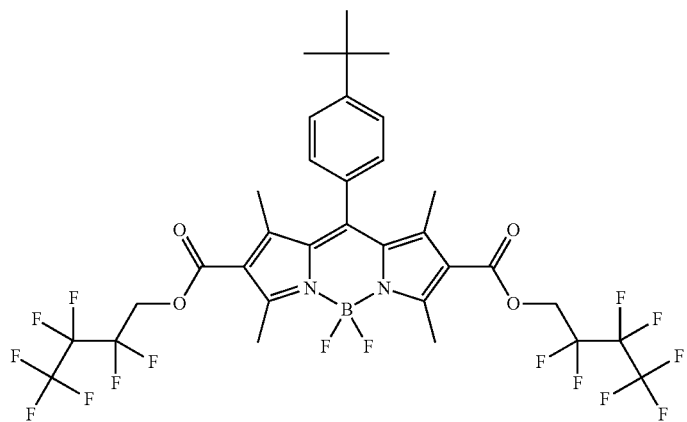

-continued
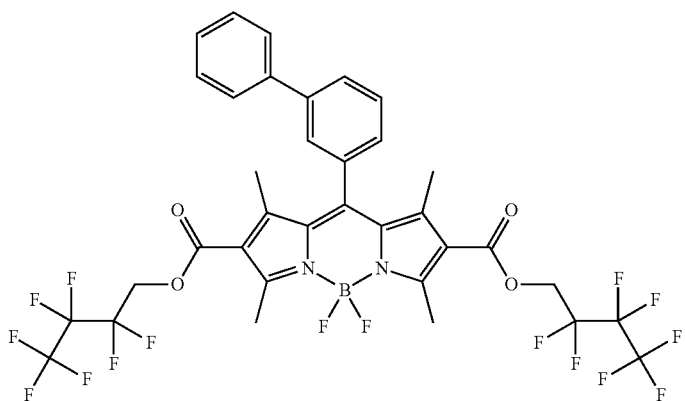
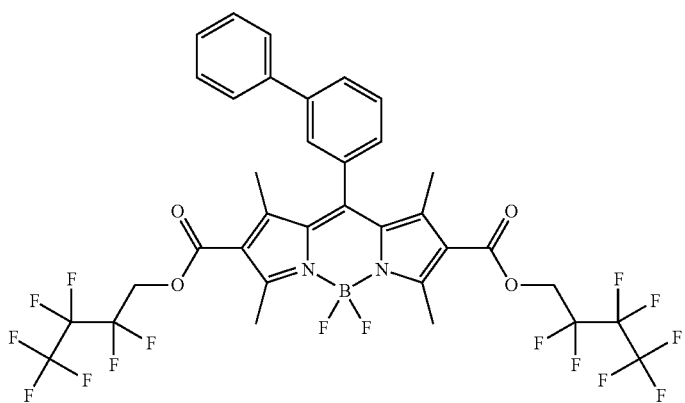
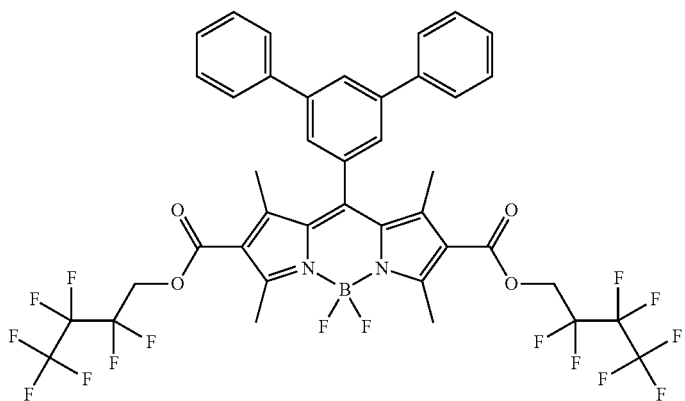
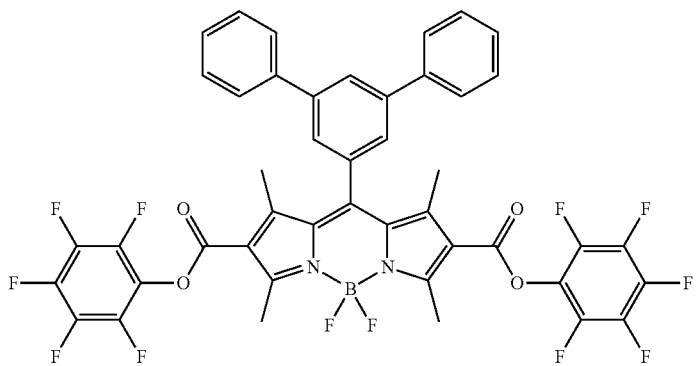

-continued
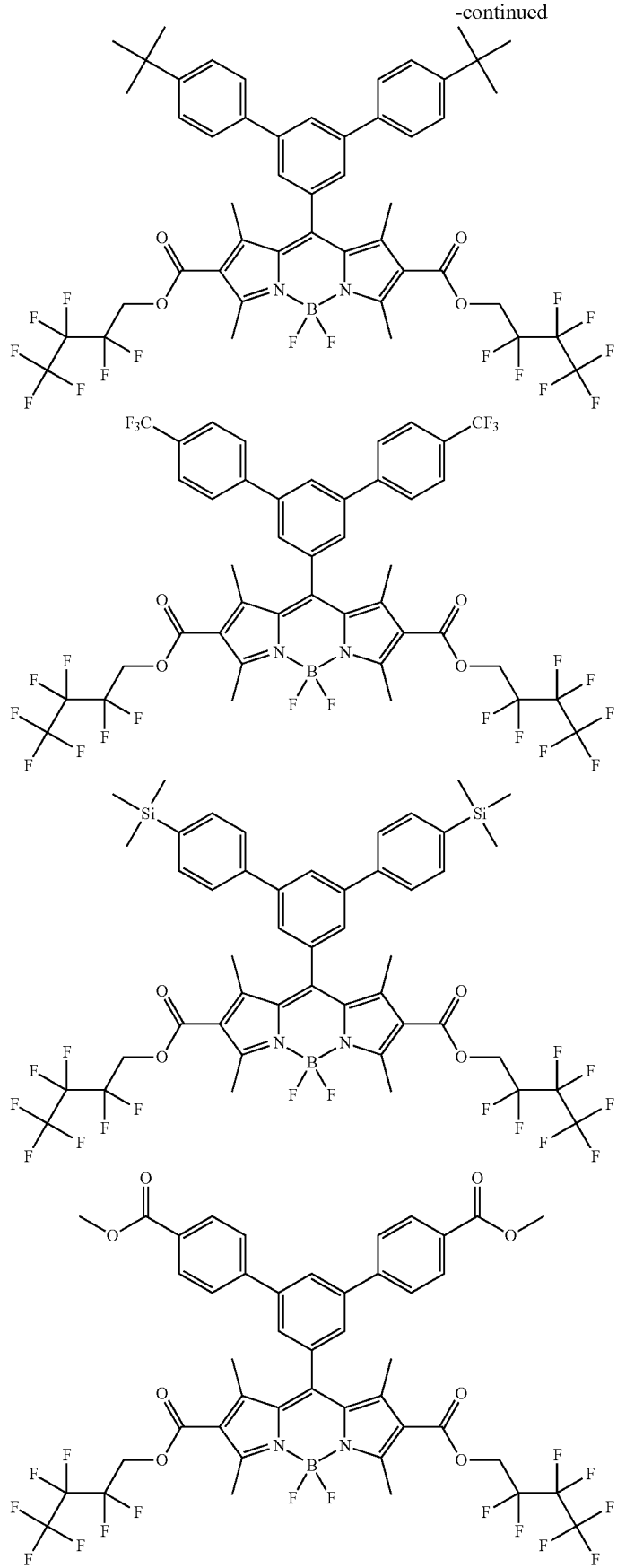

-continued
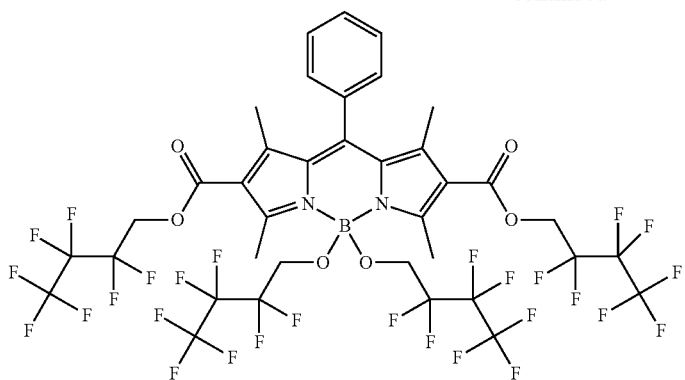
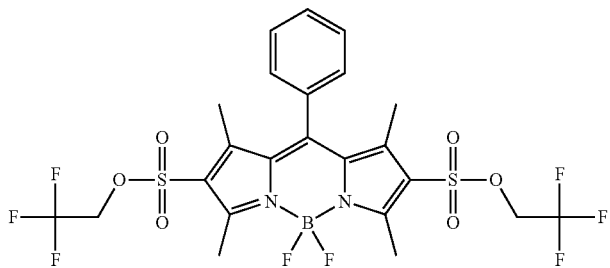
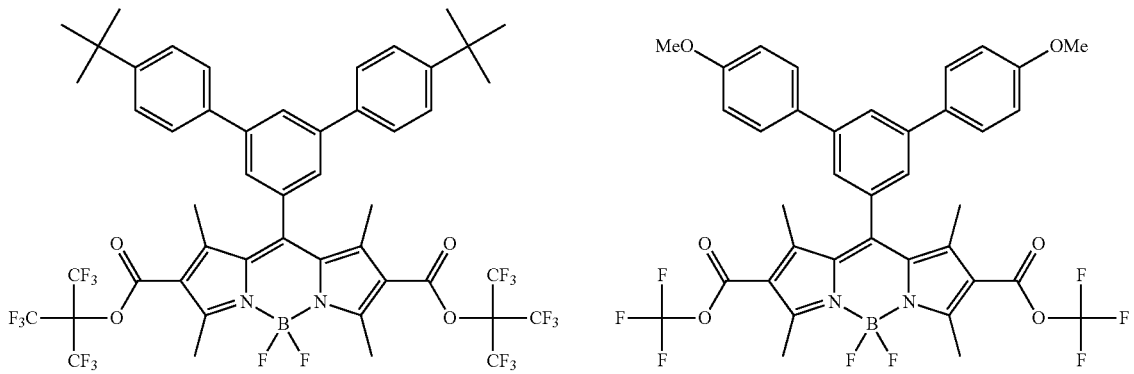
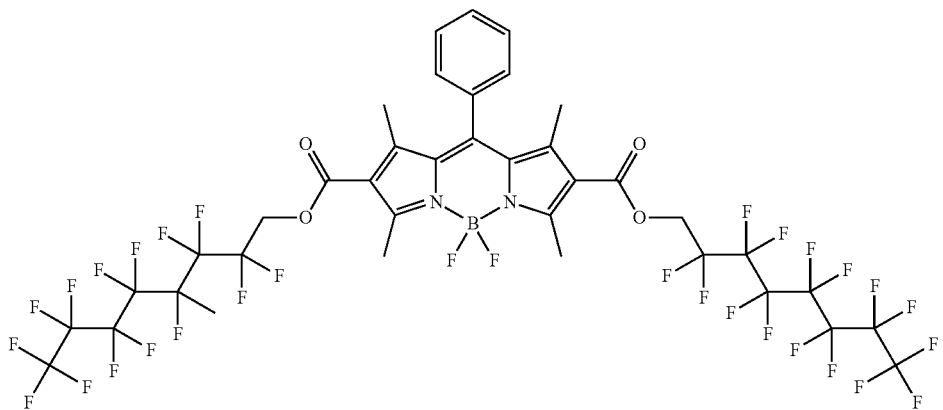

-continued
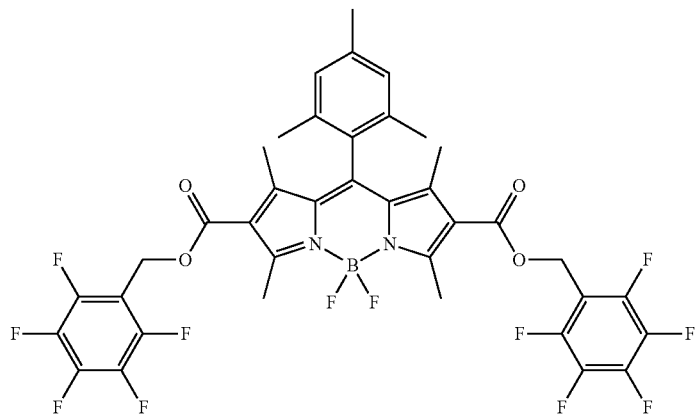
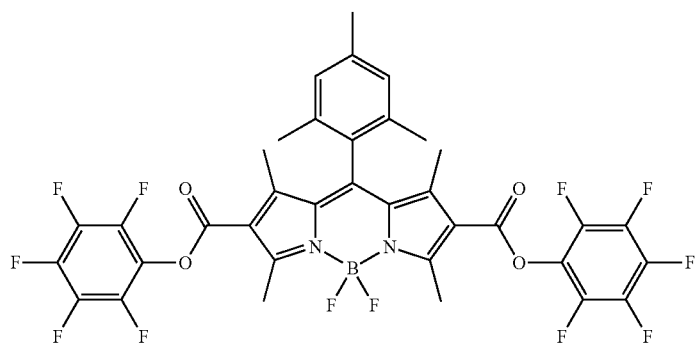
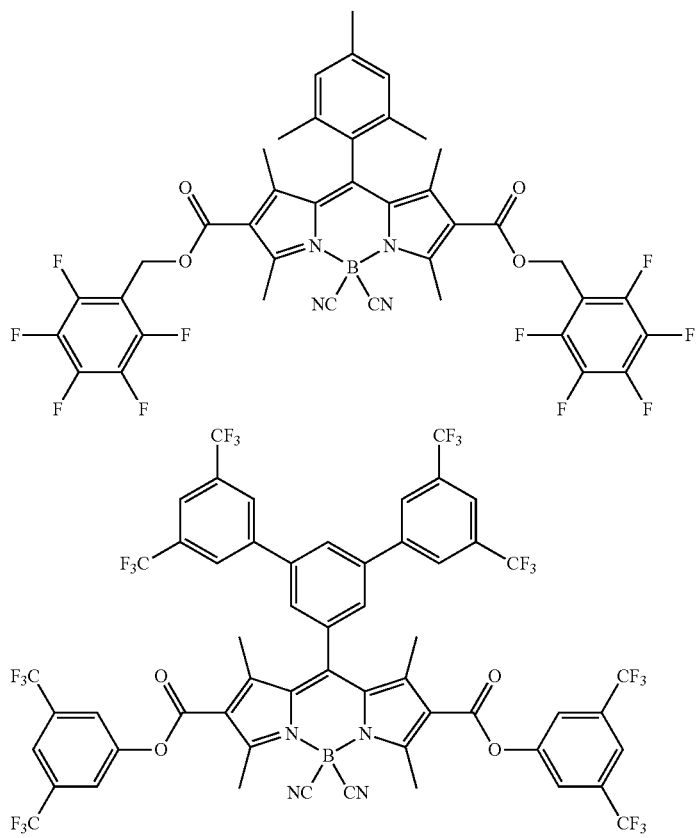

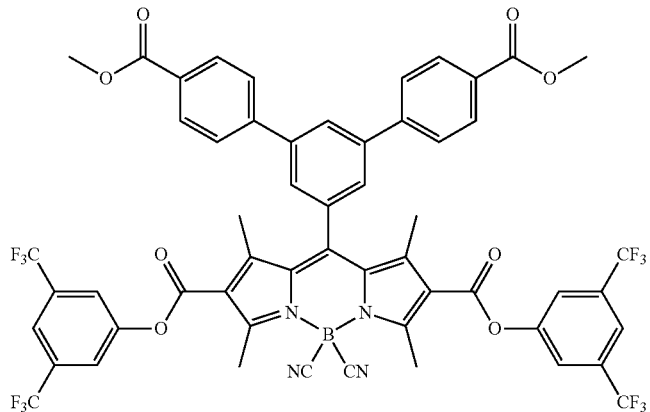
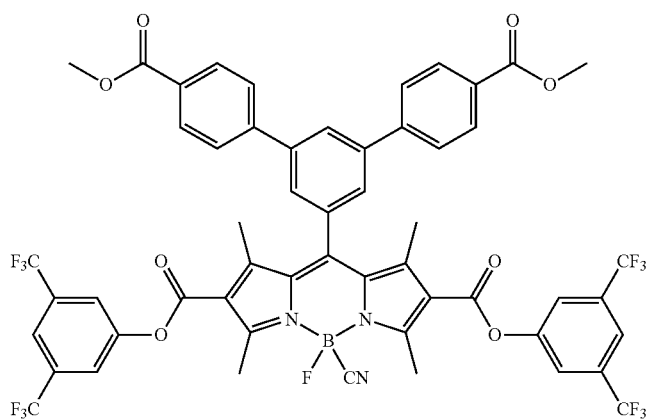
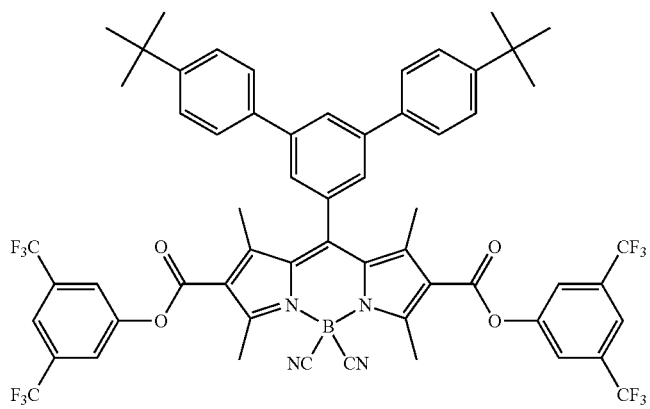

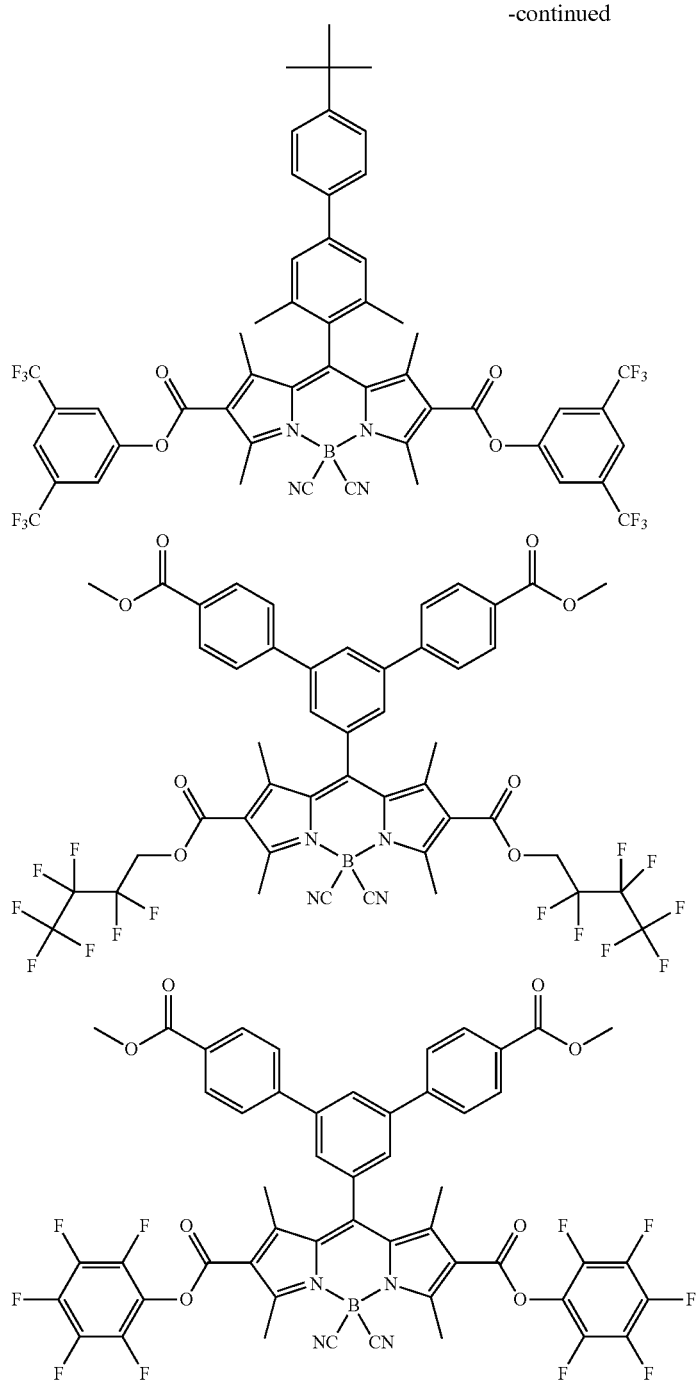

The compound represented by general formula (1) can be produced with the method described in, for example, Publication of Japanese Translation of PCT Application No. H8-509471 or Japanese Patent Application Laid-open No. 2000-208262. More specifically, a pyrromethene compound and a metal salt can be made to react in the presence of a base to obtain the object pyrromethene metal complex.

As for the synthesis of a pyrromethene-boron fluorine complex, the compound represented by general formula (1) can be synthesized with reference to methods such as described in J. Org. Chem., vol. 64, No. 21, pp. 7813-7819 (1999) and Angew. Chem., Int. Ed. Engl., vol. 36, pp. 1333-1335 (1997). For example, a method may be given in which the compound represented by general formula (9) and the compound represented by general formula (10) described below are heated in 1,2-dichloroethane in the presence of phosphorus oxychloride, then the compound represented by general formula (11) described below is made to react with the reaction mixture in 1,2-dichloroethane in the presence of triethylamine to obtain the compound represented by general formula (1). However, the present invention is not limited thereto. Here, $R^1$ to $R^9$ are as described above. J represents a halogen.

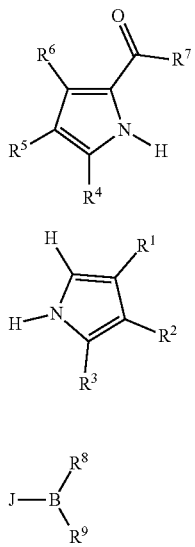

When introducing the aryl group or the heteroaryl group, an example of a method may be given in which a coupling reaction between a halogenated derivative and boronic acid or a derivative esterified therewith is used to produce a carbon-carbon bond, but the present invention is not limited thereto. Similarly, when introducing the amino group or the carbazolyl group, an example of a method may be given in which a coupling reaction between a halogenated derivative and an amine or a carbazolyl derivative under a metal catalyst such as palladium is used to produce a carbon-nitrogen bond, but the present invention is not limited thereto.

The compound represented by general formula (1) preferably emits, in response to excitation light, light having a peak wavelength observed in the region of 500 to 580 nm inclusive. Hereinafter, a light emission with the peak wavelength observed in the region of 500 to 580 nm inclusive is referred to as a "green light emission."

The compound represented by general formula (1) preferably exhibits a green light emission in response to the use of excitation light having a wavelength range of 430 to 500 nm inclusive. In general, the higher the energy of the excitation light is, the more easily the light-emitting material decomposes. However, excitation light with a wavelength range of 430 to 500 nm inclusive has a relatively low excitation energy. Therefore, a green light emission with favorable color purity can be obtained without inducing degradation in the light-emitting material in the color conversion composition.

The compound represented by general formula (1) preferably emits, in response to excitation light, light having a peak wavelength observed in the region of 580 to 750 nm inclusive. Hereinafter, a light emission with the peak wavelength observed in the region of 580 to 750 nm inclusive is referred to as a "red light emission."

The compound represented by general formula (1) preferably exhibits a red light emission in response to the use of excitation light having a wavelength range of 430 to 580 nm inclusive. In general, the higher the energy of the excitation light is, the more easily the light-emitting material decomposes. However, excitation light with a wavelength range of 430 to 580 nm inclusive has a relatively low excitation energy. Therefore, a red light emission with a favorable color purity can be obtained without incurring degradation in the light-emitting material in the color conversion composition.

The pyrromethene-boron complex according to the embodiments of the present invention achieves both the high light emission efficiency and the high durability described above, and therefore may be used as a color conversion filter in addition to as a coloring material such as the dye of a dye-sensitized solar cell, the photoelectric conversion dye of an organic solar cell or the like, the luminescent dye of an organic electroluminescence element, a dye laser or the like, a dye for an agrohorticultural film, a pigment and the like.

<Color Conversion Composition>

The color conversion composition according to the embodiments of the present invention is described in detail. The color conversion composition according to the embodiments of the present invention converts incident light from a light-emitting body such as a light source to light with a wavelength longer than a wavelength of the incident light, and preferably contains the compound (pyrromethene-boron complex) represented by general formula (1) and a binder resin.

The color conversion composition according to the embodiments of the present invention can contain, as appropriate, the compound represented by general formula (1) as well as other compounds as needed. For example, an assistant dopant such as rubrene may be included in order to further enhance the energy transfer efficiency from the excitation light to the compound represented by general formula (1). If the addition of emission light other than that of the compound represented by general formula (1) is desired, the desired organic light-emitting material, e.g., a coumarin derivative or a rhodamine derivative, may be added. Besides the organic light-emitting material, a known light-emitting material such as an inorganic phosphor, a fluorescent pigment, a fluorescent dye, quantum dots or the like may also be added in combination.

Examples of organic light-emitting materials other than the compound represented by general formula (1) are presented below but the present invention is not limited thereto.

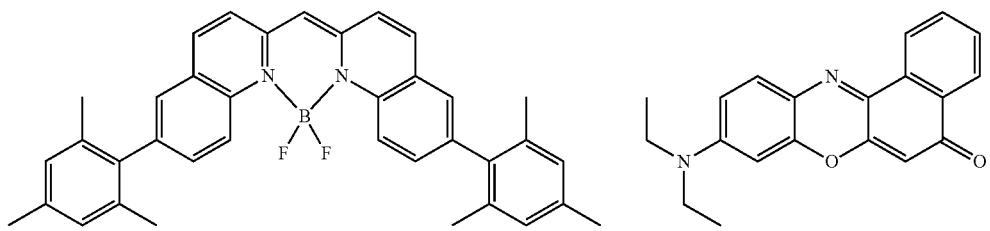

-continued
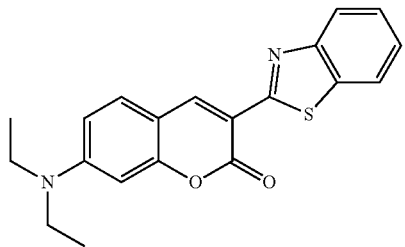
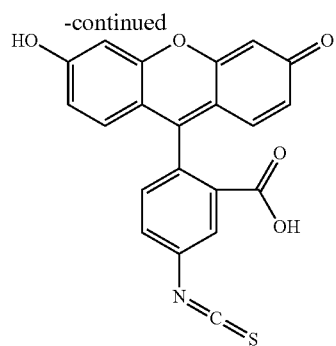
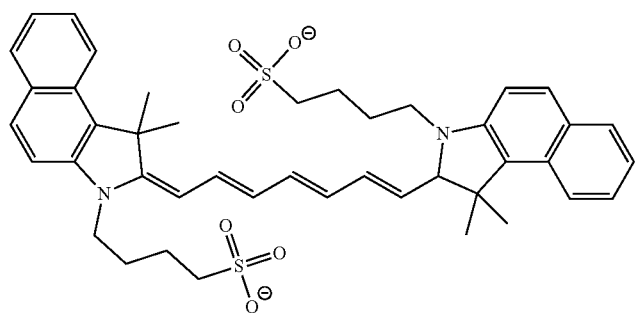
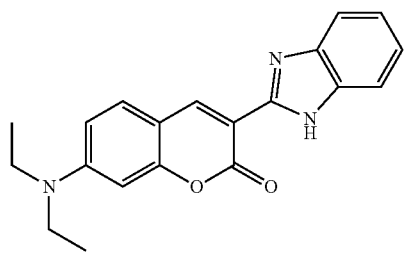
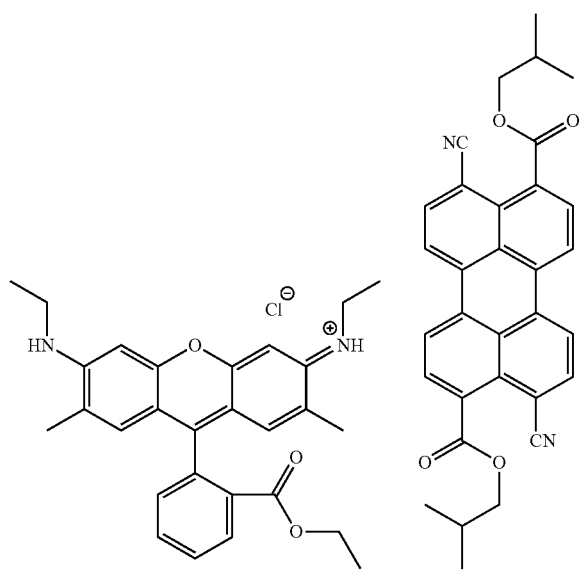
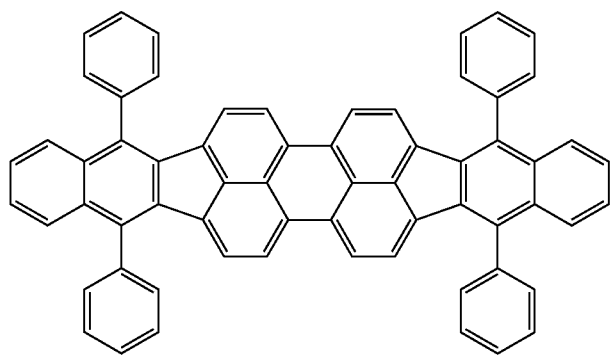

-continued
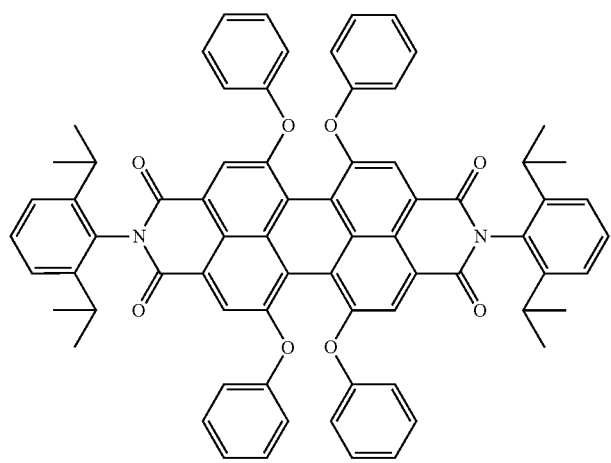
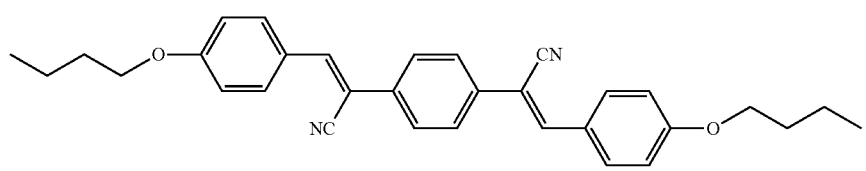
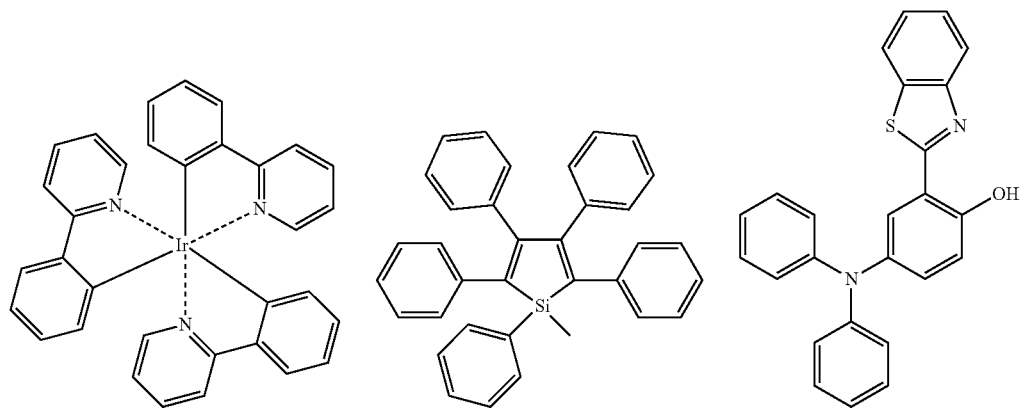
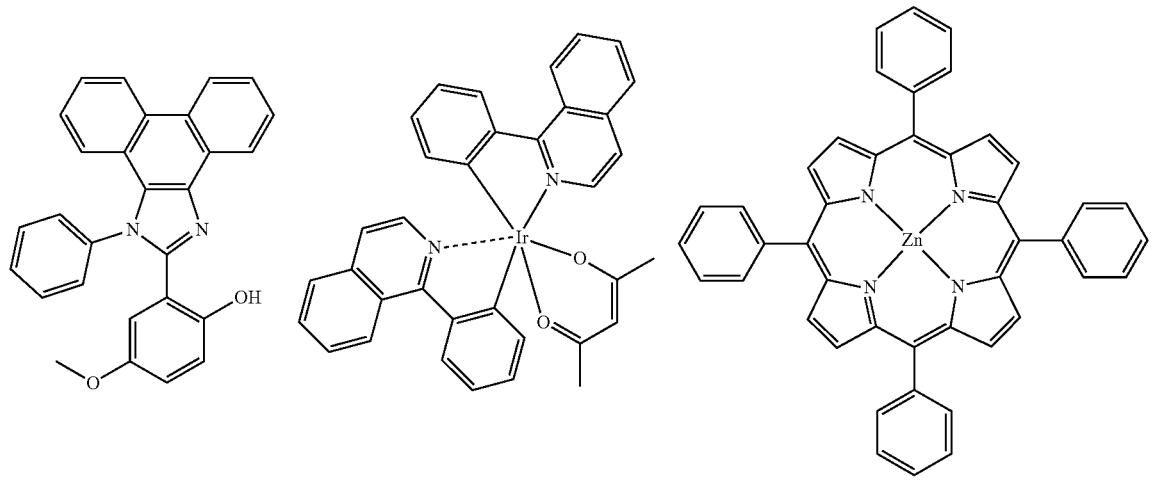

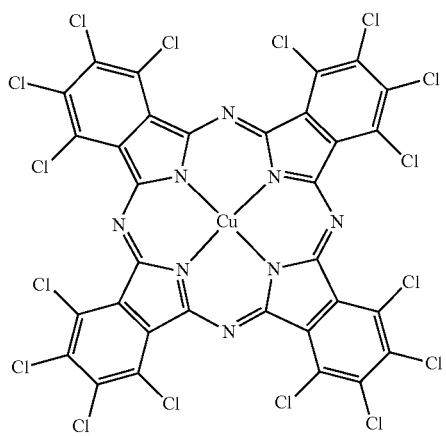

By using excitation light, the color conversion composition in the present invention preferably exhibits emission light with a peak wavelength observed in the region of 500 to 580 nm inclusive. The color conversion composition preferably emits, in response to the use of excitation light, light having a peak wavelength observed in the region of 580 to 750 nm inclusive.

In further detail, the color conversion composition according to the embodiments of the present invention preferably contains the below-mentioned light-emitting material (a) and light-emitting material (b). The light-emitting material (a) emits, in response to the use of excitation light, light having a peak wavelength observed in the range of 500 to 580 nm inclusive. The light-emitting material (b) emits, in response to excitation by at least one of excitation light and light emission from the light-emitting material (a), light having a peak wavelength observed in the region of 580 to 750 nm inclusive. At least one of the light-emitting material (a) and the light-emitting material (b) is preferably the compound (pyrromethene-boron complex) represented by general formula (1). The use of excitation light in the wavelength range of 430 to 500 nm inclusive is preferable as the abovementioned excited light.

A portion of the excitation light in the wavelength range of 430 to 500 nm inclusive is partially transmitted through the color conversion film according to the embodiments of the present invention, and therefore if a blue LED with a sharp light emission peak is used, sharply formed light emission spectra are indicated in each color, i.e., blue, green, and red, and white light with a favorable color purity can be obtained. As a result, a larger color gamut can be efficiently created that has more vivid colors particularly on a display. The light-emission properties particularly of the green region and the red region are improved in illumination uses over a white LED combining a blue LED and a yellow phosphor, which is currently mainstream, making it possible to obtain a preferable white light source with improved color rendering.

The light-emitting material (a) suitably includes, but is not particularly limited to, a coumarin derivative such as coumarin 6, coumarin 7, and coumarin 153; a cyanine derivative such as indocyanine green; a fluorescein derivative such as fluorescein, fluorescein isothiocyanate, and carboxy fluorescein diacetate; a phthalocyanine derivative such as phthalocyanine green; and a perylene derivative such as diisobutyl-4,10-dicyanoperylene-3,9-dicarboxylate; as well as a pyrromethene derivative, a stilbene derivative, an oxazine derivative, a naphthalimide derivative, a pyrazine derivative, a benzimidazole derivative, a benzoxazole derivative, a benzothiazole derivative, an imidazopyridine derivative, an azole derivative, a compound containing a condensed aryl ring such as anthracene or a derivative thereof, an aromatic amine derivative, an organic metal complex compound and the like. Among these compounds, a pyrromethene derivative imparts a high emission quantum yield and emits light with high color purity, and is therefore particularly suitable. Among pyrromethene derivatives, the compound represented by general formula (1) greatly improves durability and is therefore preferable.

The light-emitting material (b) suitably includes, but is not particularly limited to, a cyanine derivative such as 4-dicyanomethylene-2-methyl-6-(p-dimethylaminostyryl)-4H-pyran, a rhodamine derivative such as rhodamine B, rhodamine 6G, rhodamine 101, or sulforhodamine 101, a pyridine derivative such as 1-ethyl-2-(4-(p-dimethylaminophenyl)-1,3-butadienyl)-pyridinium-perchlorate, a perylene derivative such as N,N'-bis(2,6-diisopropylphenyl)-1,6,7,12-tetraphenoxyperylene-3,4:9,10-bisdicarboimide, a porphyrin derivative, a pyrromethene derivative, an oxazine derivative, a pyrazine derivative, a compound having a condensed aryl ring such as naphthacene or dibenzodiindenoperylene or a derivative thereof, and an organic metal complex compound. Among these compounds, the pyrromethene derivative imparts a high emission quantum yield and emits light with high color purity, and is therefore particularly suitable. Among the pyrromethene derivatives, the compound represented by general formula (1) markedly improves durability and is therefore preferable.

Both the light-emitting material (a) and the light-emitting material (b) are preferably compounds represented by general formula (1) since highly efficient light emission and high color purity can be attained as well as high durability.

The content of the compound represented by general formula (1) in the color conversion composition according to the embodiments of the present invention varies depending on the molar absorption coefficient, the emission quantum yield, and the absorption intensity at the excitation wavelength of the compound, and on the thickness and transmittance of the film produced, but is ordinarily $1.0 \times 10^{-4}$ to 30 parts by weight, preferably $1.0 \times 10^{-3}$ to 10 parts by weight and particularly preferably $1.0 \times 10^{-2}$ to 5 parts by weight per 100 parts by weight of the binder resin.

If the color conversion composition contains both the light-emitting material (a) exhibiting green light emission and the light-emitting material (b) exhibiting red light emission, a portion of the green light emission is converted to a red light emission, and therefore the content $w_a$ of the light-emitting material (a) and the content $w_b$ of the light-emitting material (b) preferably have the relation $w_a$ $w_b$. The content ratio of the light-emitting material (a) and the light-emitting material (b) is $w_a:w_b$=1000:1 to 1:1, preferably 500:1 to 2:1, and particularly preferably 200:1 to 3:1. Here the content $w_a$ and the content $w_b$ are weight percentages relative to the weight of the binder resin.

<Binder Resin>

The binder resin forms a continuous phase and should be a material with excellent moldability, transparency, heat resistance, and the like. Examples of the binder resin that may be given include known resins such as a photocurable resist material having a reactive vinyl group such as acrylic acid, methacrylic acid, polyvinyl cinnamate and cyclic rubber resins, an epoxy resin, a silicone resin (including a cured (crosslinked) organopolysiloxane such as silicone rubber and silicone gel), a urea resin, a fluororesin, a polycarbonate resin, an acryl resin, a urethane resin, a melamine resin, a polyvinyl resin, a polyamide resin, a phenol resin, a polyvinyl alcohol resin, a cellulose resin, an aliphatic ester resin, an aromatic ester resin, an aliphatic polyolefin resin, and an aromatic polyolefin resin. A copolymer resin thereof may also be used. By designing, as appropriate, these resins, a binder resin useful for the color conversion composition and the color conversion film according to the embodiments of the present invention may be obtained. Among these resins, a thermoplastic resin is more preferable due to the ease of the film-forming process. Among thermosetting resins, an epoxy resin, a silicone resin, an acryl resin, an ester resin, an olefin resin, or a mixture thereof may be suitably used from the perspectives of transparency, heat resistance and the like. Particularly favorable thermoplastic resins are an acrylic resin, an ester resin, and an olefin resin from the perspective of durability.

A dispersant, a levelling agent or the like for coating film stabilization may be added as an additive to the binder resin, and an adhesive adjuvant such as a silane coupling agent may be added as a film surface modifier. Silica particles, silicone fine particles or other inorganic particles as a color conversion material precipitation inhibitor may also be added to the binder resin.

The binder resin is particularly preferably a silicone resin from the perspective of heat resistance. Among silicone resins, an addition reaction-curing silicone composition is preferable. The addition reaction-curing silicone composition is cured by heating at room temperature of a temperature of 50 to 200° C. and has excellent transparency, heat resistance and adhesiveness. The addition reaction-curing silicone composition is formed, for example, from a hydrosilylation reaction between a compound containing an alkenyl group bonded to a silicon atom and a compound having a hydrogen atom bonded to a silicon atom. Among such materials, vinyltrimethoxysilane, vinyltriethoxysilane, aryltrimethoxysilane, propenyltrimethoxysilane, norbornenyltrimethoxysilane, octenyltrimethoxysilane, and the like may be given as examples of the "compound containing an alkenyl group bonded to a silicon atom". Methyl hydrogen polysiloxane, dimethylpolysiloxane-CO-methyl hydrogen polysiloxane, ethyl hydrogen polysiloxane, methyl hydrogen polysiloxane-CO-methyl phenyl polysiloxane, and the like may be given as examples of the "compound having a hydrogen atom bonded to a silicon atom". Known compounds such as those described in Japanese Patent Application Laid-open No. 2010-159411, for example, may be used as the addition reaction-curing silicone composition.

A commercially available silicone sealing material for general LED application, for example, may also be used as the addition reaction-curing silicone composition. Specific examples include OE-6630A/B and OE-6336A/B manufactured by Toray, SCR-1012A/B and SCR-1016A/B manufactured by Shin-Etsu Chemical Co., Ltd., and the like.

The binder resin in the color conversion composition for manufacturing the color conversion film according to the embodiments of the present invention is preferably mixed with, as another component, a hydrosilylation reaction retarder such as acetylene alcohol for suppressing setting at room temperature to extend the pot life. The binder resin may also be mixed, as needed, with a filler such as fumed silica, a glass powder, a quartz powder or other fine particles, titanium oxide, zirconium oxide, barium titanate, zinc oxide or another inorganic filler, a pigment, a flame retardant, a heat-resistant agent, an antioxidant, a dispersant, a solvent, or an adhesiveness-imparting agent such as a silane coupling agent or a titanium coupling agent within a scope such that the effect of the present invention is not lost.

In particular, adding a polydimethylsiloxane component with a low molecular weight, silicone oil or the like to the composition for manufacturing a color conversion film is preferable from the perspective of surface smoothness of the color conversion film. Such a component is preferably added at 100 to 2,000 ppm or more preferably 500 to 1,000 ppm to the entire composition.

<Other Components>

The color conversion composition according to the embodiments of the present invention may contain, in addition to the binder resin and the abovementioned compound represented by general formula (1), a photostabilizer, an antioxidant, a processing and heat stabilizer, a light-resistant stabilizer such as an ultraviolet absorber, silicone fine particles, a silane coupling agent and other such components (additives).

The photostabilizer includes, but is not particularly limited to, a tertiary amine, a catechol derivative, and a nickel compound, for example. These photostabilizers may be used alone or in combination.

The antioxidant includes, but is not particularly limited to, phenol antioxidants such as, for example, 2,6-di-tert-butyl-p-cresol and 2,6-di-tert-butyl-4-ethylphenol. These antioxidants may be used alone or in combination.

The processing and heat stabilizer includes, but is not particularly limited to, a phosphorus stabilizer such as, for example, tributyl phosphite, tricyclohexyl phosphite, triethylphosphine, and diphenylbutyl phosphine. These stabilizers may be used alone or in combination.

The light-resistant stabilizer includes, but is not particularly limited to, a benzotriazole such as, for example, 2-(5-methyl-2-hydroxyphenyl)benzotriazole and 2-[2-hydroxy-3,5-bis($\alpha,\alpha$-dimethylbenzyl)phenyl]-2H-benzotriazole. These light-resistant stabilizers may be used alone or in combination.

In the color conversion composition according to the embodiments of the present invention, the content of these additives depends on the molar absorption coefficient, the emission quantum yield, and the absorption intensity at the excitation wavelength of the compound and on the thickness and transmittance of the color conversion film produced, but the content is ordinarily preferably $1.0\times10^{-3}$ to 30 parts by weight inclusive, more preferably $1.0\times10^{-2}$ to 15 parts by weight inclusive, and particularly preferably $1.0\times10^{-1}$ to 10 parts by weight to 100 parts by weight of the binder resin.

<Solvents>

The color conversion composition according to the embodiments of the present invention may also contain a solvent. The solvent is not particularly limited as long as the solvent can adjust the viscosity of the resin in a fluid state and does not impart an excessive effect on the light emission and durability of the light-emitting substance. Such a solvent includes, for example, toluene, methyl ethyl ketone, methyl isobutyl ketone, hexane, acetone, terpineol, Texanol, methyl cellosolve, butyl carbitol, butyl carbitol acetate, propylene glycol monomethyl ether acetate, and the like. Two or more of these solvents may also be mixed together and used. Among these solvents, toluene is particularly suitable for use as it does not affect degradation of the compound represented by general formula (1) and leaves little residual solvent after drying.

<Method for Manufacturing the Color Conversion Composition>

An example of the method of manufacturing the color conversion composition according to the embodiments of the present invention is described below. In this manufacturing method, the prescribed quantities of the compound represented by the abovementioned general formula (1), the binder resin, the solvent and the like are mixed. After mixing the abovementioned components so as to obtain the prescribed composition, the composition is mixed and dispersed homogenously with a stirrer/kneader such as a homogenizer, a rotation-revolution stirrer, a three-roll mill, a ball mill, a planetary ball mill, or a bead mill to obtain a color conversion composition. After mixing/dispersing or during the process of mixing/dispersing, defoaming is also preferably carried out under a vacuum or reduced pressure. In addition, specific components may be mixed in advance or a treatment such as aging may be carried out. The solvent may be removed by an evaporator to obtain the desired solid content concentration.

<Method for Manufacturing the Color Conversion Film>

In the present invention, the configuration of the color conversion film is not limited as long as the film contains the abovementioned color conversion composition or a cured product thereof. In the color conversion film, the cured product of the color conversion composition is preferably contained as a layer obtained by curing the color conversion composition (a layer containing the cured product of the color conversion composition). Four representative structural examples of the color conversion film are provided below as examples.

FIG. 1 is a schematic cross-section view illustrating a first example of the color conversion film according to the embodiments of the present invention. A color conversion film 1A, which is the first example, is a single-layer film configured by a color conversion layer 11 as illustrated in FIG. 1. The color conversion layer 11 includes the abovementioned color conversion composition or cured product thereof.

Figure 2:
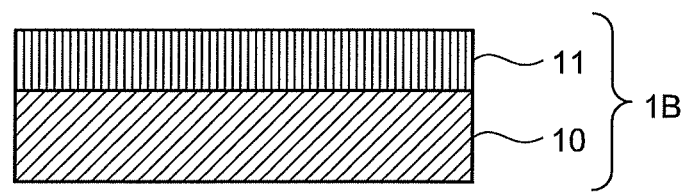
FIG. 2 is a schematic cross-section view illustrating a second example of the color conversion film according to the embodiments of the present invention.

FIG. 2 is a schematic cross-section view illustrating a second example of the color conversion film according to the embodiments of the present invention. A color conversion film 1B, which is the second example, is a laminate of a substrate layer 10 and the color conversion layer 11 as illustrated in FIG. 2. In the structural example of the color conversion film 1B, the color conversion layer 11 is laminated on the substrate layer 10.

Figure 3:
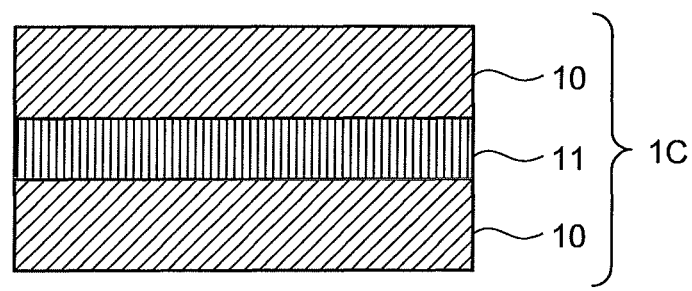
FIG. 3 is a schematic cross-section view illustrating a third example of the color conversion film according to the embodiments of the present invention.

FIG. 3 is a schematic cross-section view illustrating a third example of the color conversion film according to the embodiments of the present invention. A color conversion film 1C, which is the third example, is a laminate of a plurality of the substrate layers 10 and the color conversion layer 11 as illustrated in FIG. 3. In the structural example of the color conversion film 1C, the color conversion layer 11 is sandwiched by the plurality of substrate layers 10.

Figure 4:
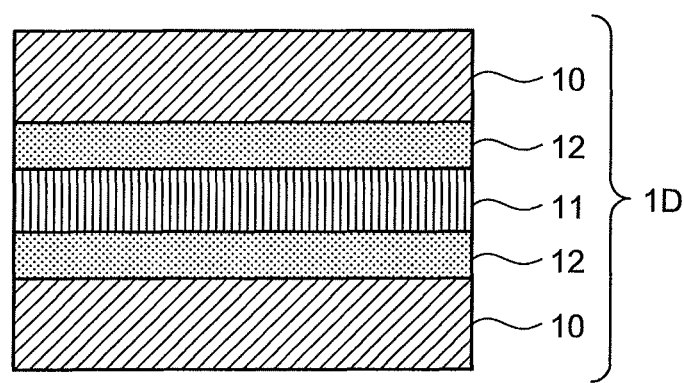
FIG. 4 is a schematic cross-section view illustrating a fourth example of the color conversion film according to the embodiments of the present invention.

FIG. 4 is a schematic cross-section view illustrating a fourth example of the color conversion film according to the embodiments of the present invention. A color conversion film 1D, which is the fourth example, is a laminate of a plurality of the substrate layers 10, the color conversion layer 11, and a plurality of barrier films 12 as illustrated in FIG. 4. In the structural example of the color conversion film 1D, the color conversion layer 11 is sandwiched by the plurality of barrier films 12, and a laminate of the color conversion layer 11 and the plurality of barrier films 12 is sandwiched by the plurality of substrate layers 10. That is, the color conversion film 1D may also have barrier films 12 as illustrated in FIG. 4 to prevent degradation of the color conversion layer 11 due to oxygen, moisture and heat.

(Substrate Layer)

A known metal, film, glass, ceramic, paper or the like may be used without any particular limitation as the substrate layer (e.g., the substrate layer(s) 10 illustrated in FIGS. 2 to 4). Specifically, the substrate layer includes a metal sheet or foil such as aluminum (including an aluminum alloy), zinc, copper or iron, a film of a plastic such as cellulose acetate, polyethylene terephthalate (PET), polyethylene, polyester, polyamide, polyimide, polyphenylene sulfide, polystyrene, polypropylene, polycarbonate, polyvinyl acetal, aramid, silicone, polyolefin or a thermoplastic fluororesin that is a copolymer of tetrafluoroethylene and ethylene (ETFE), a film of an α-polyolefin resin, a polycaprolactone resin, an acrylic resin, a silicone resin, or a plastic containing the resins copolymerized with ethylene, paper laminated with the aforementioned plastic, paper coated with the aforementioned plastic, paper laminated or vapor-deposited with the aforementioned metal, a plastic film laminated or vapor-deposited with the aforementioned metal, and the like. If the substrate layer is a metal sheet, the surface may be plated with chrome, nickel or the like or treated with ceramic.

Among these, the glass or the resin film may be preferably used in view of the ease of manufacturing and molding the color conversion film. When handling a film-like substrate layer, a high-strength film is preferable so as to avoid the risk of rupture or the like. A resin film is preferable in view of the required characteristics and economy, and among these, a plastic film selected from the group consisting of PET, polyphenylene sulfide, polycarbonate, and polypropylene is preferred in view of economy and easy of handling. If drying the color conversion film or if pressure bonding and molding the color conversion film with an extruder at a high temperature of at least 200° C., a polyimide film is preferred in view of heat resistance. The surface of the substrate layer may be subjected to a release treatment in advance in view of the ease of film separation.

The thickness of the substrate layer is not particularly limited but preferably has a lower limit of at least 25 μm and more preferably at least 38 μm and preferably has an upper limit of no more than 5,000 μm and more preferably no more than 3,000 μm.

(Color Conversion Layer)

One example of the method for manufacturing the color conversion layer of the color conversion film according to the embodiments of the present invention is next described. In this method for manufacturing the color conversion layer, the color conversion composition manufactured with the method described above is applied on the substrate layer or a substrate such as a barrier film and dried. The color conversion layer (e.g., the color conversion layer 11 illustrated in FIGS. 1 to 4) is formed in this manner. The application can be carried out with a reverse roll coater, a blade coater, a slit die coater, a direct gravure coater, an offset gravure coater, a kiss coater, a natural roll coater, an air knife coater, a roll blade coater, a reverse roll blade coater, a two-stream coater, a rod coater, a wire bar coater, an applicator, a dip coater, a curtain coater, a spin coater, a knife coater, or the like. In order to obtain thickness uniformity in the color conversion layer, application with a slit die coater is preferable.

The color conversion layer can be dried using a general heating apparatus such as a hot air drier or an infrared drier. The color conversion film can be heated using a general heating apparatus such as a hot air drier or an infrared drier. The heating conditions are ordinarily 40 to 250° C. for 1 minute to five hours, and preferably 60 to 200° C. for 2 minutes to four hours. Heating/curing can also be carried out incrementally such as with stepwise curing.

After the color conversion layer is manufactured, the substrate layer may be modified as needed. A simple method for doing so includes, but is not limited to, a method for relaminating using a hot plate and a method using a vacuum laminator or a dry film laminator, for example.

The thickness of the color conversion layer is not particularly limited but is preferably 10 to 1,000 µm. If the thickness of the color conversion layer is less than 10 µm, a problem arises in that the toughness of the color conversion film is low. If the thickness of the color conversion layer exceeds 1,000 µm, cracks occur easily and the color conversion film is difficult to mold. The thickness of the color conversion layer is more preferably 30 to 100 µm.

However, from the perspective of enhancing the heat resistance of the color conversion film, the thickness thereof is preferably 200 µm or less, more preferably 100 µm or less, and still more preferably 50 µm or less.

The thickness of the color conversion film in the present invention refers to the film thickness (average thickness) measured on the basis of thickness measurement method A using mechanical scanning in JIS K 7130 (1999) Method for Measuring Plastic Films and Sheets.

(Barrier Film)

A barrier film (e.g., the barrier films 12 illustrated in FIG. 4) may be used, as appropriate, such as when improving the gas barrier priority of the color conversion layer. Examples of the barrier film include a metal oxide thin film or metal nitride thin film including an inorganic oxide such as silicon oxide, aluminum oxide, titanium oxide, tantalum oxide, zinc oxide, tin oxide, indium oxide, yttrium oxide, and magnesium oxide, an inorganic nitride such as silicon nitride, aluminum nitride, titanium nitride and silicon carbide nitride, a mixture thereof, or same having another element added thereto, and a film containing various resins such as polyvinylidene chloride, an acrylic resin, a silicone resin, a melamine resin, a urethane resin, a fluorine resin, or a polyvinyl alcohol resin such as saponified vinyl acetate. Examples of a barrier film functioning as a barrier against water include a film containing various resins such as polyethylene, polypropylene, nylon, polyvinylidene chloride, a vinylidene chloride-vinyl chloride copolymer, a vinylidene chloride-acrylonitrile copolymer, a fluorine resin, and a polyvinyl alcohol resin such as saponified vinyl acetate.

The barrier film may be provided on both surfaces of the color conversion layer 11 such as the barrier film 12 illustrated in FIG. 4, or may be provided on only one surface of the color conversion layer 11. An auxiliary layer may be further provided having an antireflection function, an antiglare function, an antireflection-antiglare function, a hard coat function (anti-friction function), an antistatic function, an antifouling function, an electromagnetic wave shielding function, an infrared cutting function, an ultraviolet cutting function, a polarization function, or a toning function according to the function required in the color conversion film.

<Excitation Light>

Any type of excitation light can be used as long as the excitation light emits light in the wavelength region in which the mixed light-emitting substance, such as the compound represented by general formula (1), can absorb light. The excitation light from, for example, a fluorescent light source such as a hot cathode tube, a cold cathode tube, or an inorganic electroluminescence (EL) element, an organic EL element light source, an LED light source, an incandescent light source, or solar light can be used in principle. Light from an LED light source is a particularly preferable excitation light. Light from a blue LED light source having excitation light in the wavelength range of 430 to 500 nm is further preferable in display and illumination applications from the viewpoint of enhancing the blue light color purity.

The excitation light may have one or more types of light emission peaks, but one type of light emission peak is preferable in order to enhance the light purity. A plurality of different types of light emission peaks may also be optionally combined and used.

<Light Source Unit>

The light source unit according to the embodiments of the present invention is provided with at least a light source and the abovementioned color conversion film. The method for arranging the light source and the color conversion film is not particularly limited, and a configuration may be adopted in which the light source and the color conversion film adhere closely or a remote phosphor system may be adopted in which the light source and the color conversion film are separated. A configuration for the light source unit may be adopted in which a color filter is further provided with the object of enhancing the color purity.

As described above, the excitation light in the wavelength range of 430 to 500 nm is a relatively small excitation energy and decomposition of a light-emitting substance such as the compound represented by general formula (1) can be prevented. Accordingly, the light source used in the light source unit is preferably a light-emitting diode having a maximum light emission with a wavelength in the range of 430 to 500 nm inclusive and more preferably a wavelength in the range of 440 to 470 nm inclusive.

The light source is preferably a light-emitting diode having a light emission peak in the range of 430 to 470 nm and a light-emission wavelength region in the range of 400 to 500 nm, the light emission spectrum of the light-emitting diode satisfying mathematical expression (1).

$$1 > \beta/\alpha \geq 0.15$$

In mathematical expression (1), $\alpha$ is the light emission intensity at the light emission wavelength peak of the light emission spectrum, and $\beta$ is the light emission intensity at the wavelength of the light emission wavelength peak plus 15 nm.

The light source unit in the present invention can be used in a display, illumination, interiors, signs, signboards and other such applications, but is particularly suitable for use in a display or illumination application.

<Displays and Illumination Apparatus>

A display according to the embodiments of the present invention is provided with at least the abovementioned color conversion film. A light source unit having the abovementioned light source unit, and the color conversion film, and the like may be used as a backlight unit in a liquid display or other such display, for example. The illumination apparatus according to the embodiments of the present invention is provided with at least the abovementioned color conversion film. For example, the illumination apparatus is configured so as to emit white light by combining, a blue LED light source as the light source unit and a color conversion film which converts the blue light from the blue LED light source to light having a longer wavelength.

The present invention is described below with reference to the examples, but the present invention is not limited thereto. The compounds G-1 to G-51 and G-101 to G-106 in the examples and comparative examples are presented below.

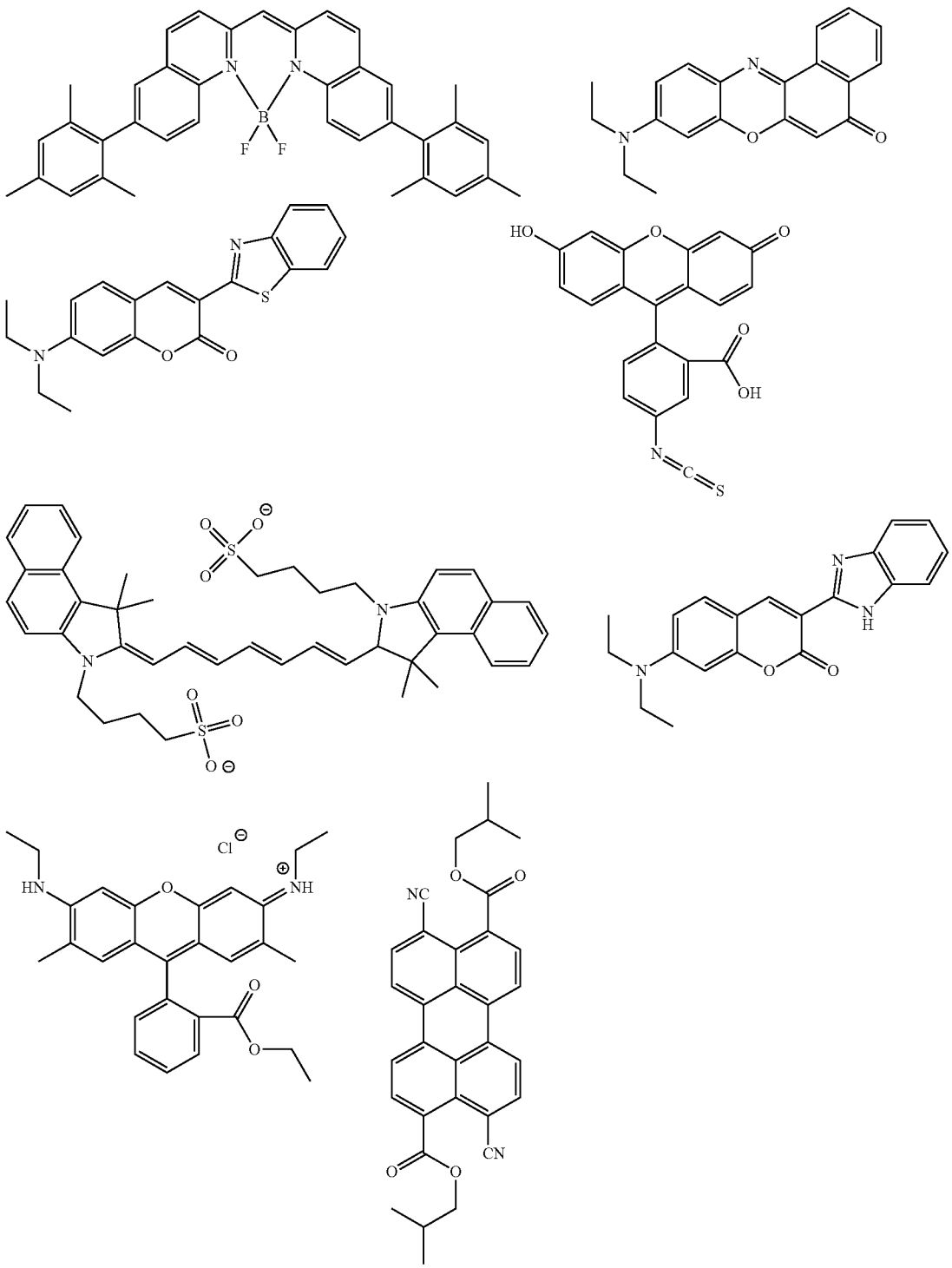

-continued
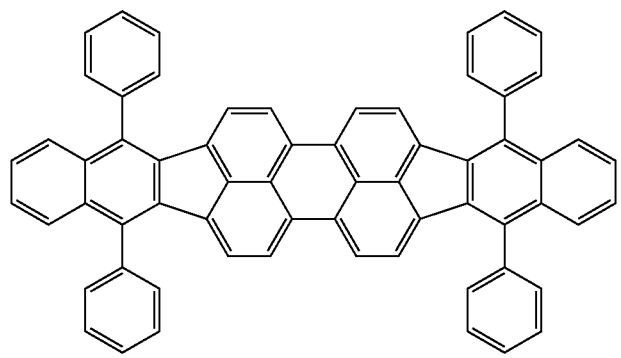
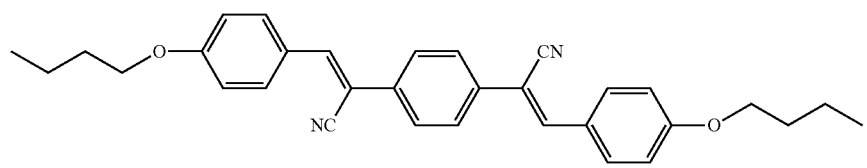
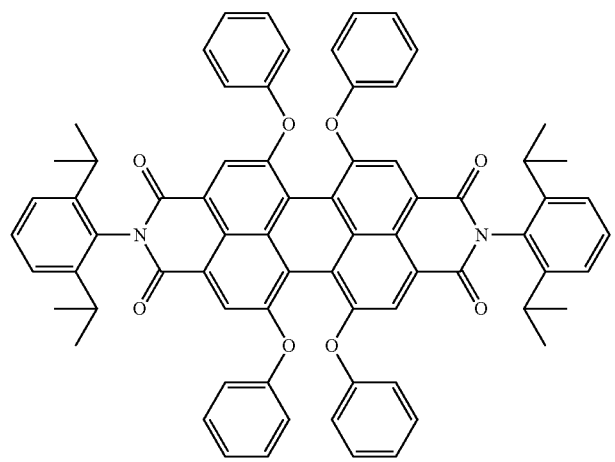
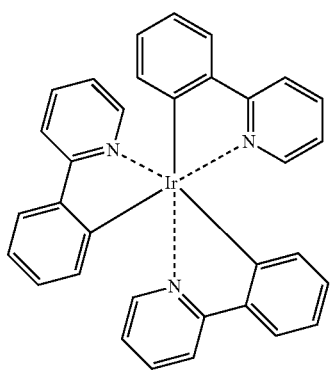
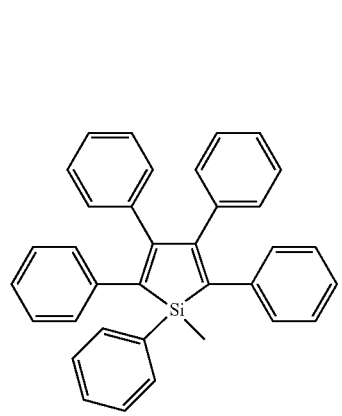
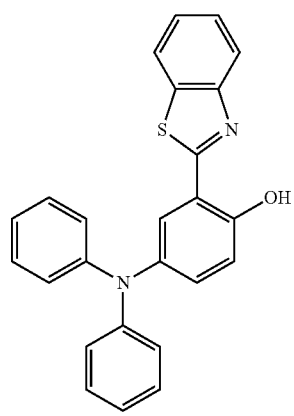
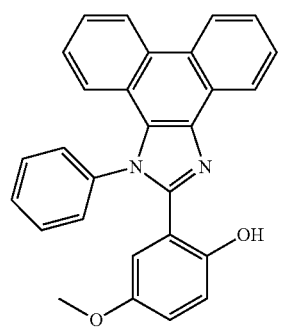

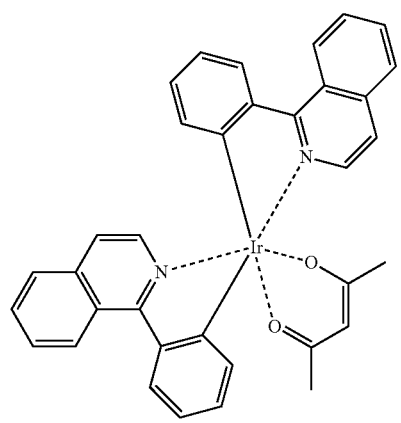
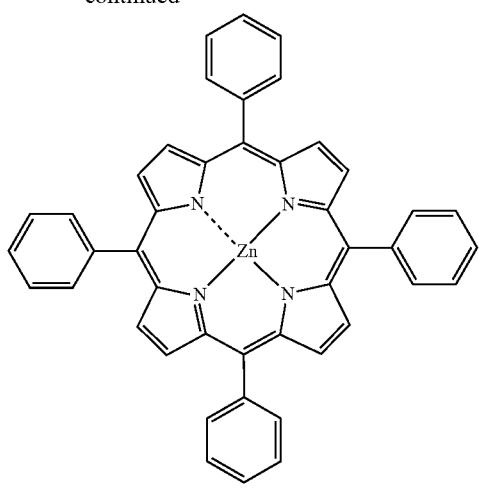
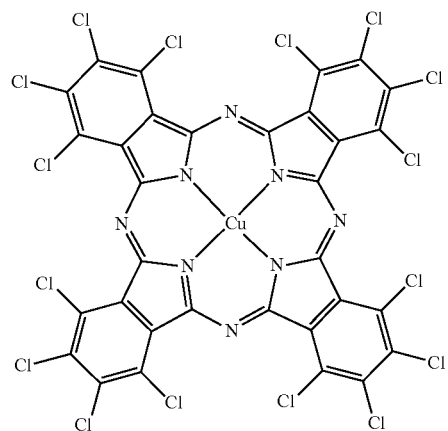
G-1
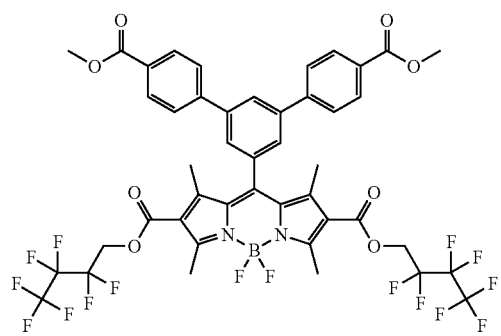
G-2
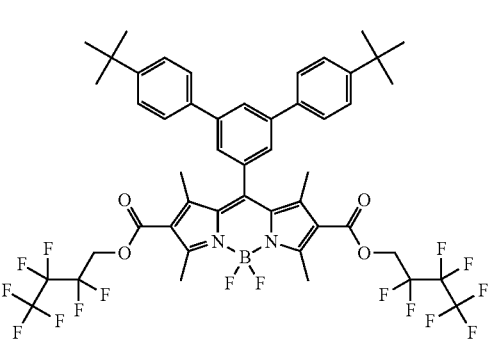
G-3
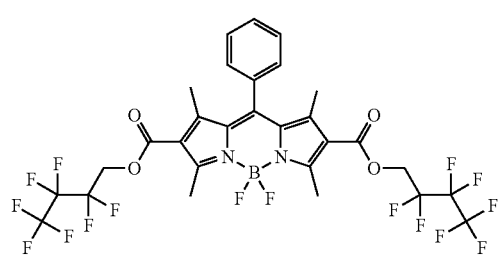
G-4
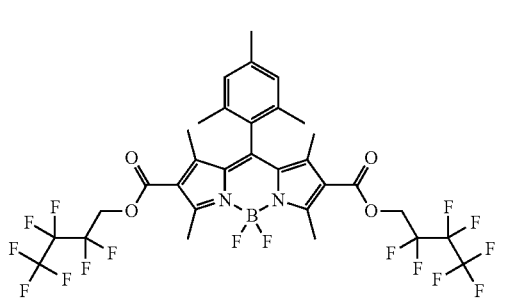

-continued
G-5
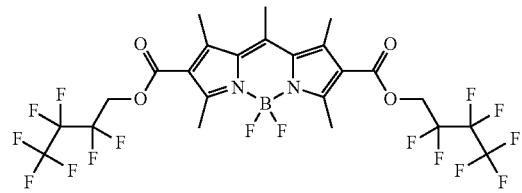
G-6
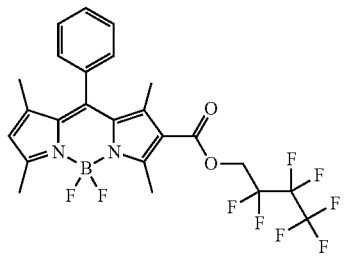
G-7
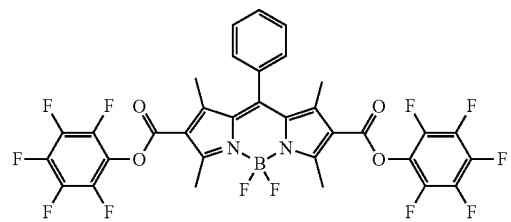
G-8
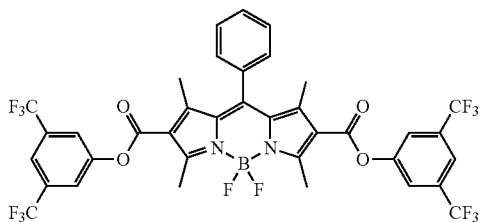
G-9
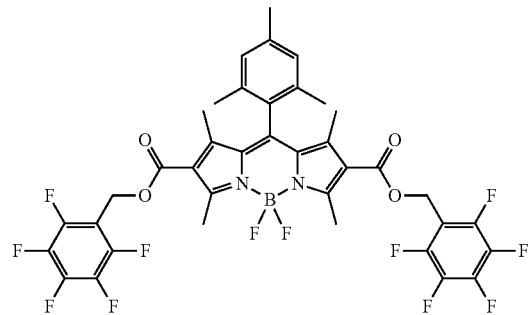
G-10
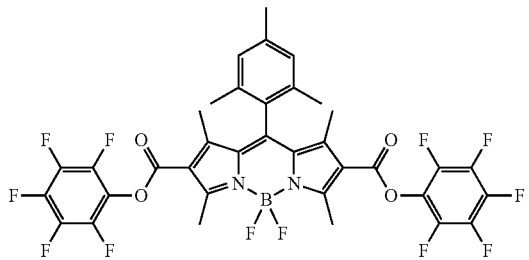
G-11
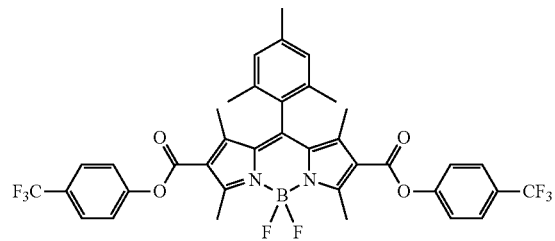
G-12
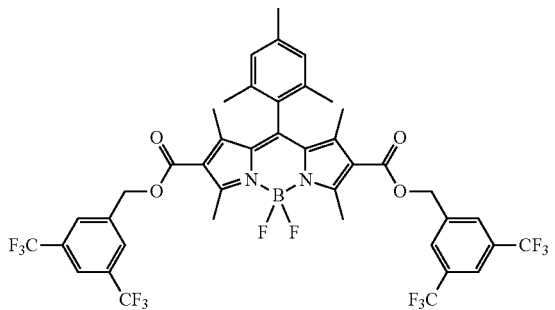
G-13
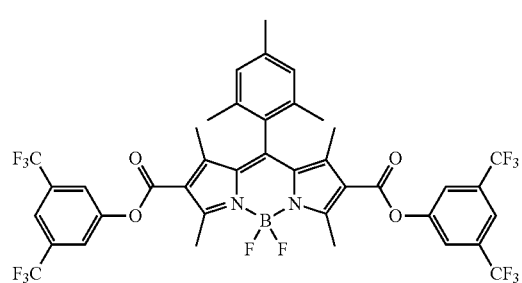
G-14
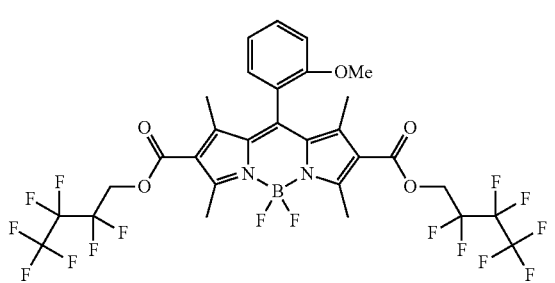

-continued
G-15
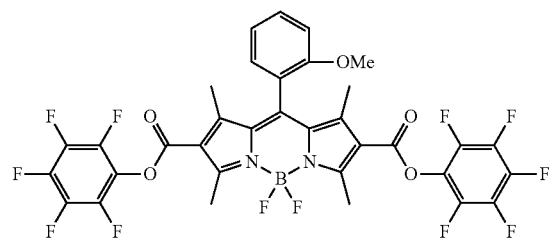
G-16
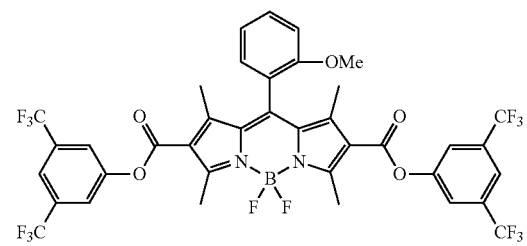
G-17
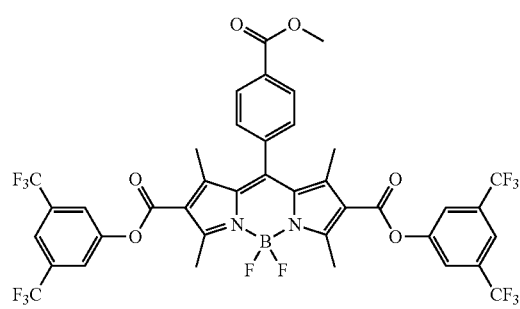
G-18
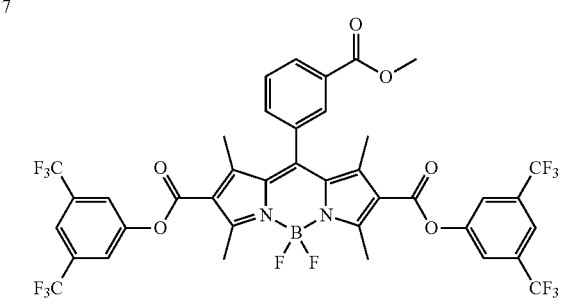
G-19
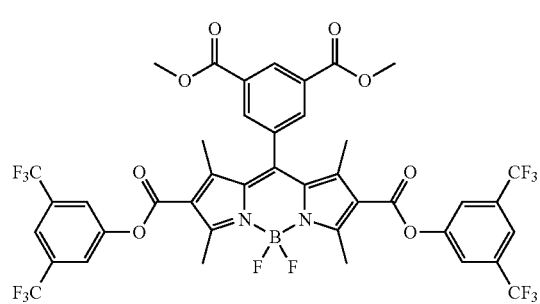
G-20
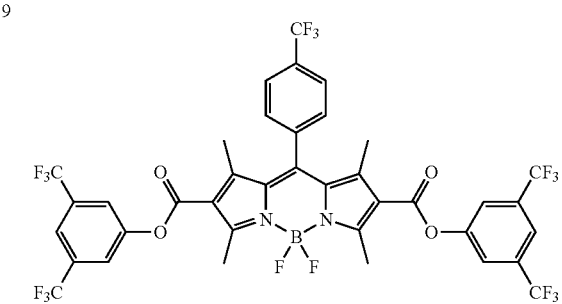
G-21
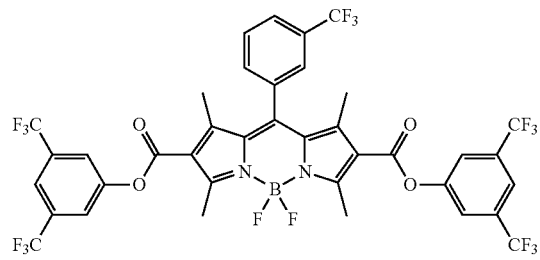
G-22
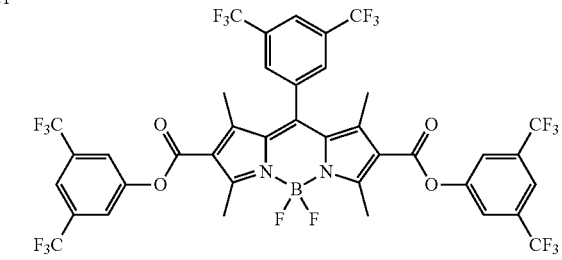
G-23
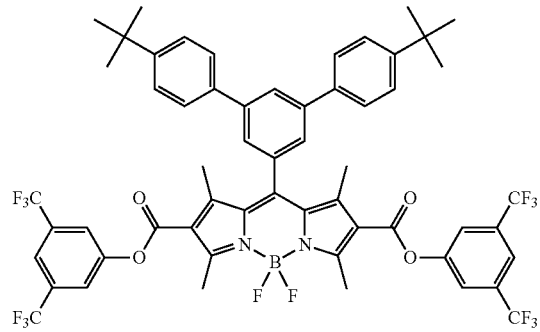
G-24
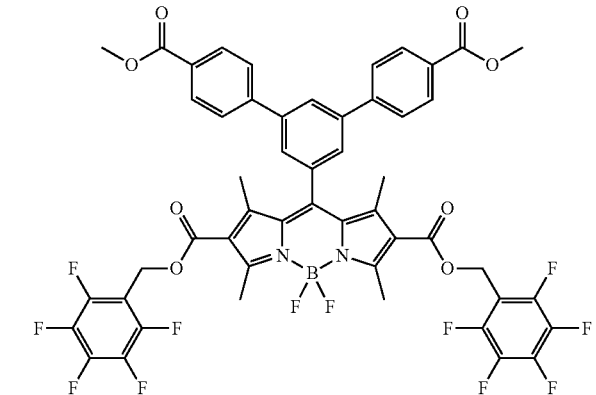

-continued
G-25
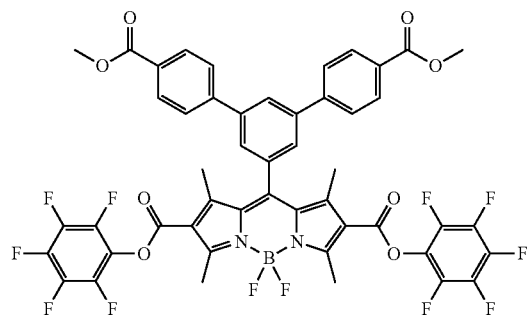
G-26
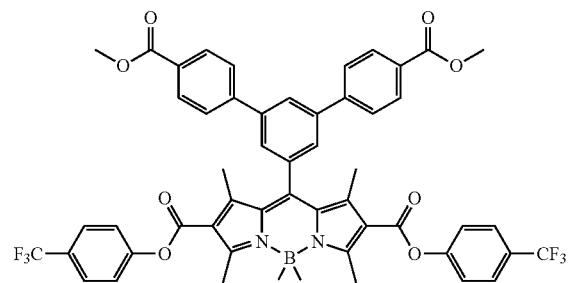
G-27
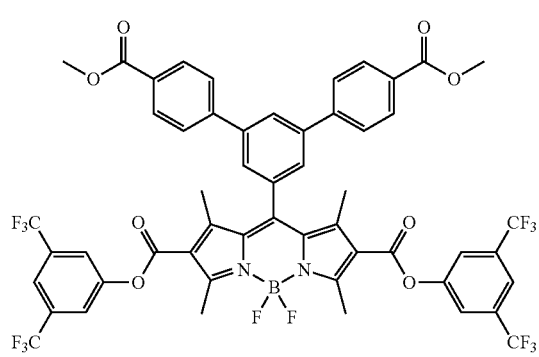
G-28
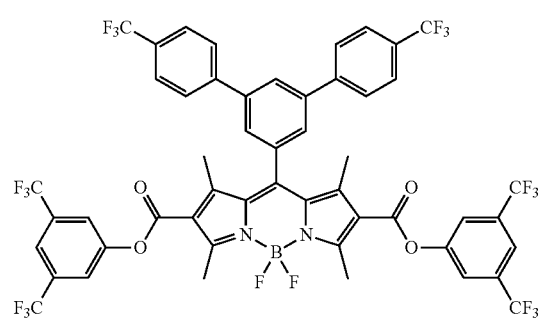
G-29
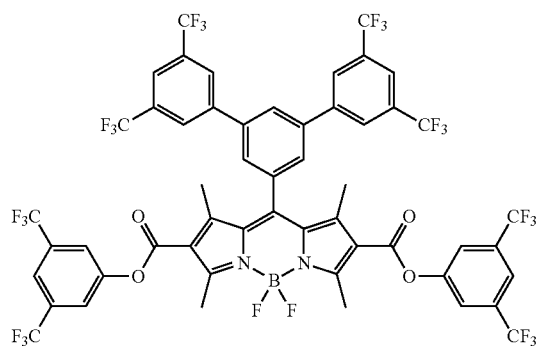
G-30
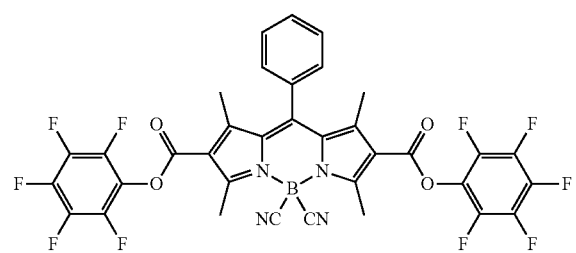
G-31
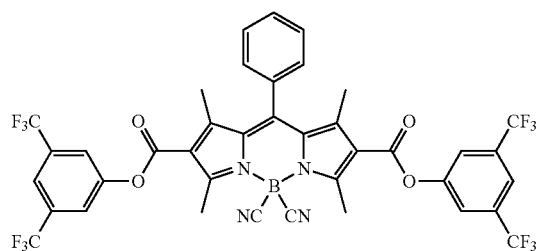
G-32
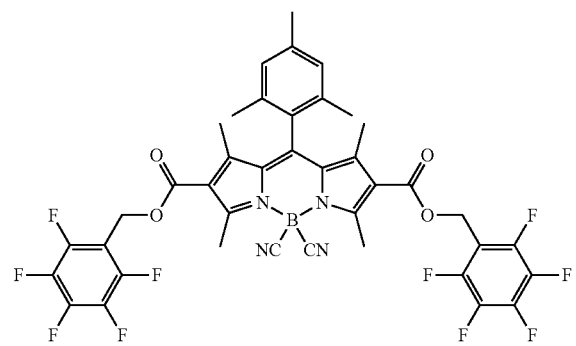

-continued
G-33
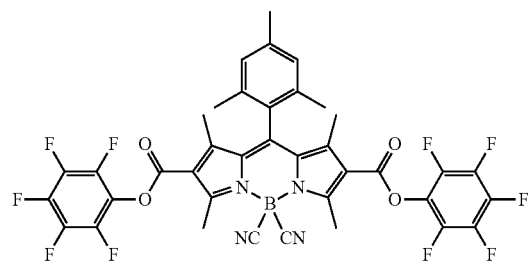
G-34
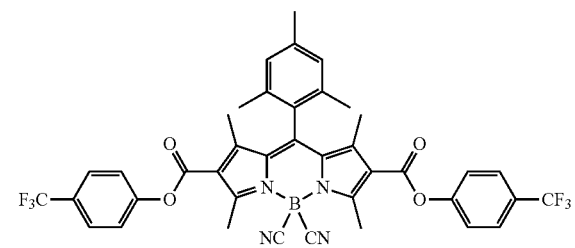
G-35
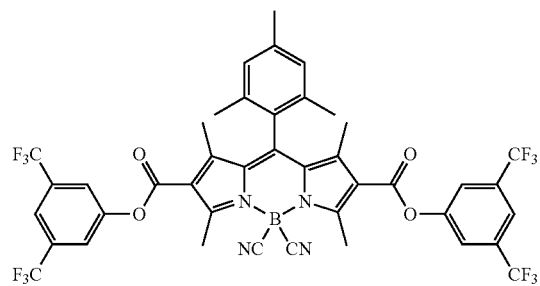
G-36
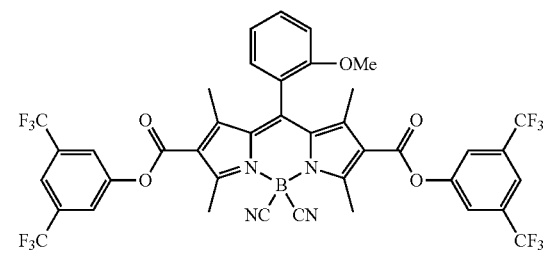
G-37
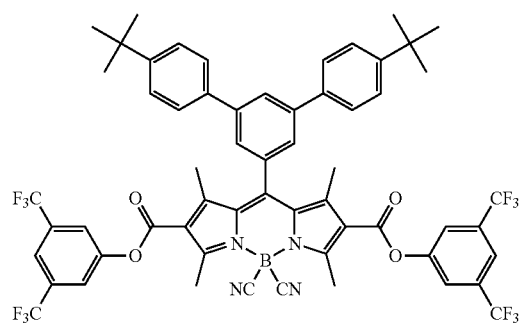
G-38
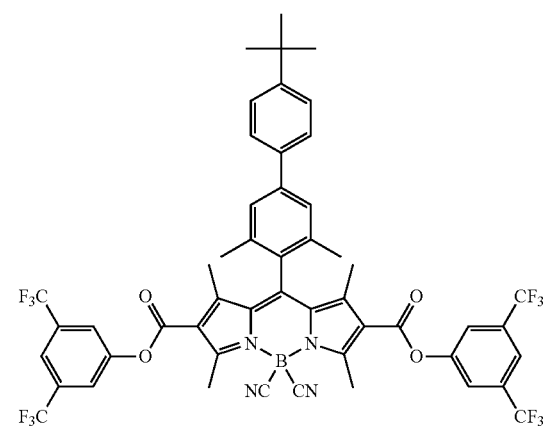
G-39
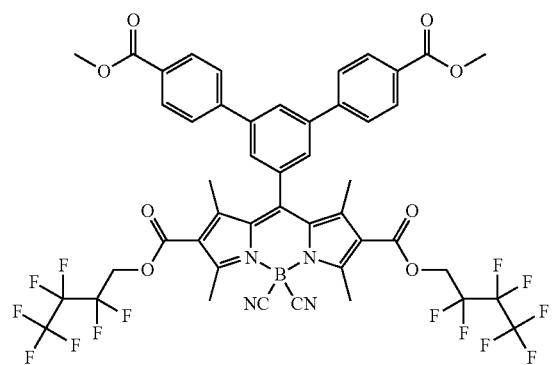
G-40
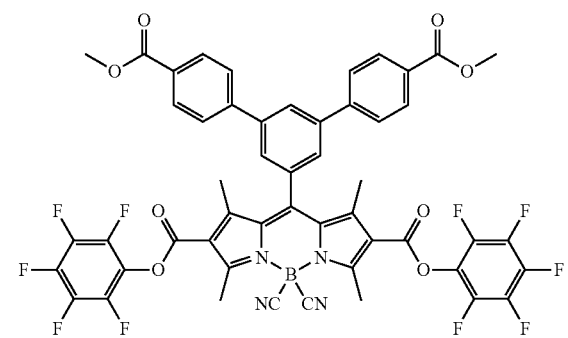

-continued
G-41
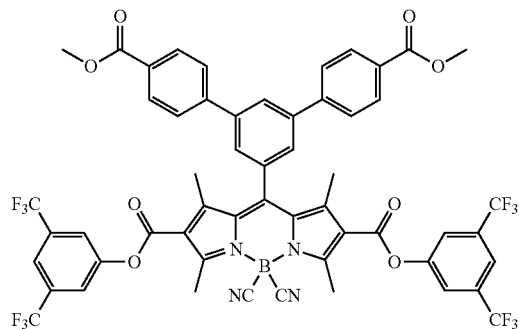
G-42
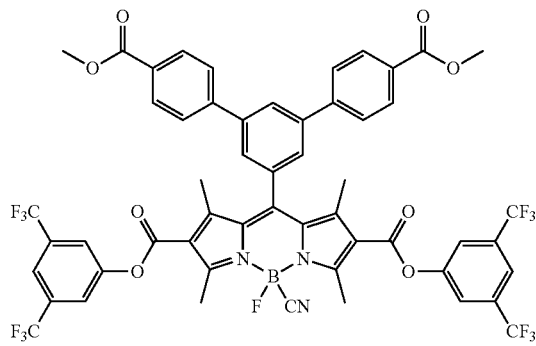
G-43
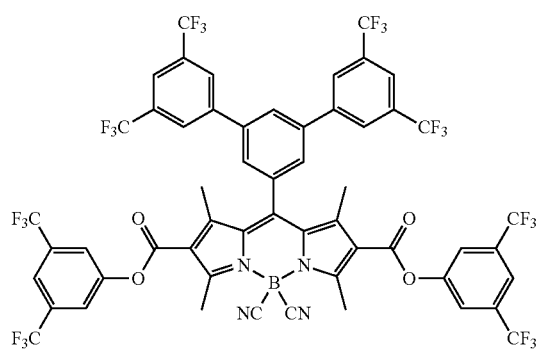
G-44
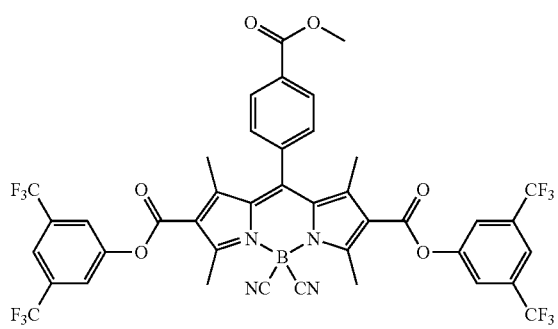
G-45
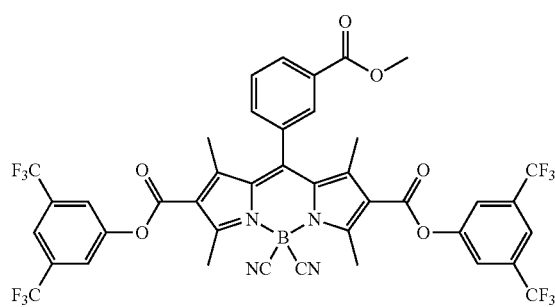
G-46
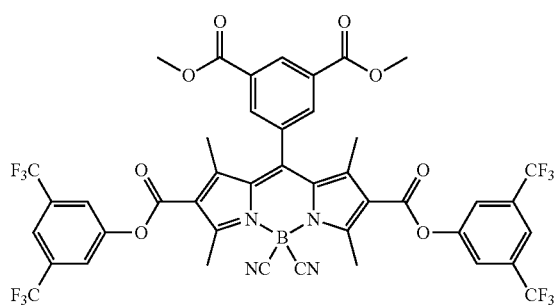
G-47
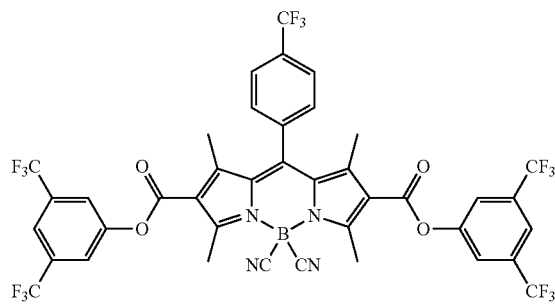
G-48
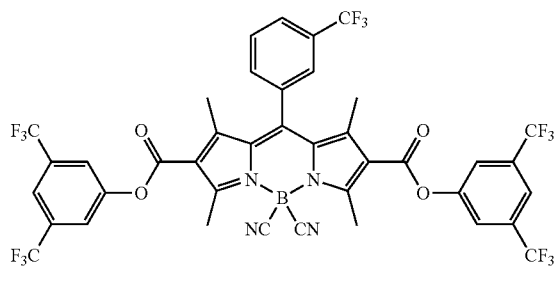

-continued
G-49
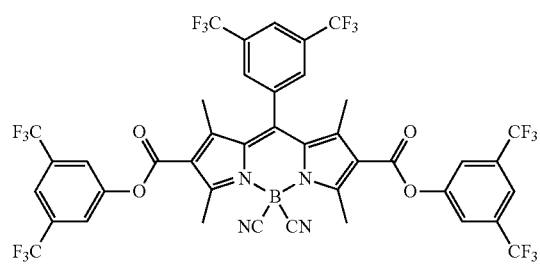
G-50
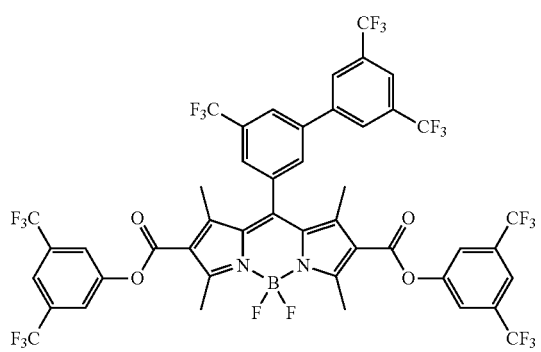
G-51
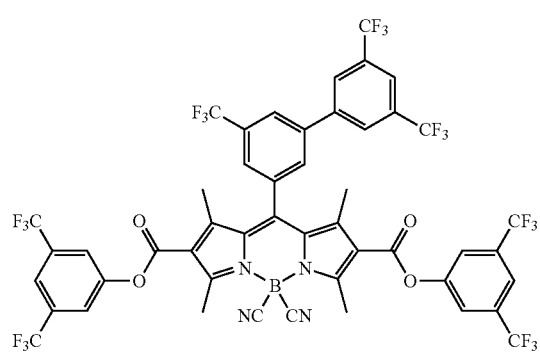
G-101
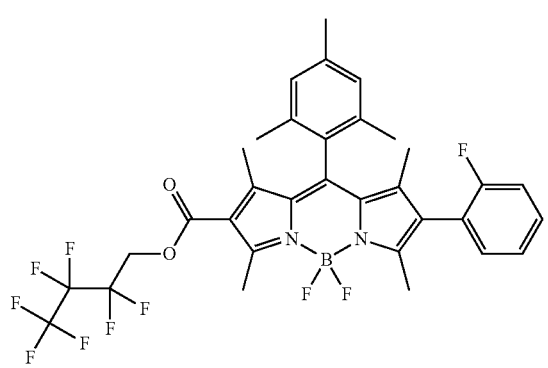
G-102
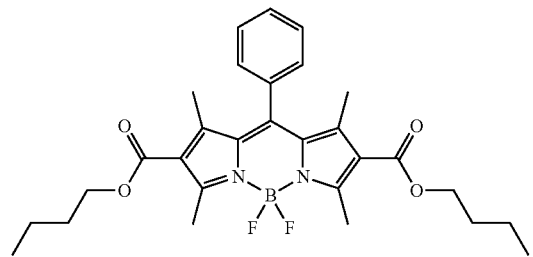
G-103
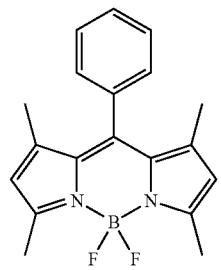
G-104
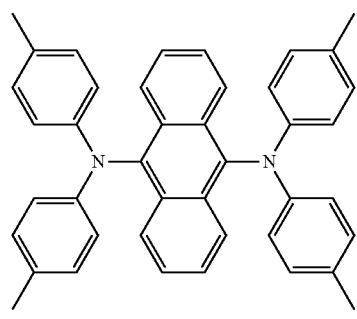
G-105
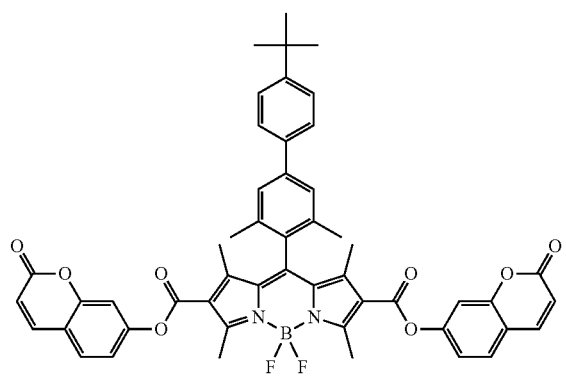

G-106

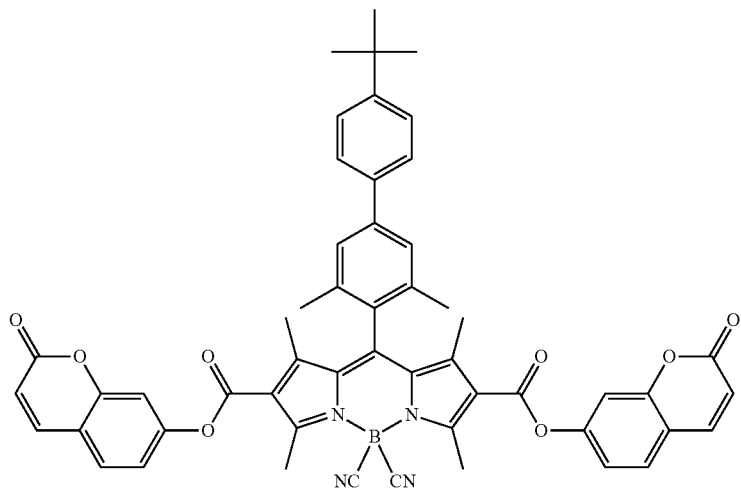

Synthesis Example 1

The method for synthesizing the compound G-1 of synthesis example 1 in the present invention is described below. In the method for synthesizing the compound G-1, potassium hydroxide (166 g) was dissolved in 2,4-dimethylpyrrole-3-carboxylic acid ethyl (100 g), methanol (522 mL), and water (261 mL) and the resulting aqueous solution was placed in a flask and refluxed for four hours. The methanol was distilled off and the solution after the methanol was distilled off was cooled in an ice bath to an internal temperature no greater than 10° C. Concentrated hydrochloric acid (247 mL) was dripped into the solution in an ice bath to adjust the solution pH to "1". A brown solid was thereby precipitated and filtered, the resulting brown solid was washed with water to obtain 2,4-dimethyl-pyrrole-3-carboxylic acid (74 g) as a light brown solid.

The resulting 2,4-dimethyl-pyrrole-3-carboxylic acid (30.3 g), 2,2,3,3,4,4,4-heptafluoro-1-butanol (56.5 g), DCC (44.9 g), DMAP (2.13 g), and ethyl acetate (725 mL) were placed in a flask and refluxed for two hours. The solution was cooled with an ice bath to an internal temperature no greater than 10° C., then filtered, water (500 mL) was added to the resulting liquid, the result was stirred for 10 minutes, and then the organic layer was separated. The resulting organic layer was washed twice with water (500 mL), dried with magnesium sulfate, and filtered, and then the solvent was distilled off. The resulting solid was dissolved in toluene (500 mL), purification was carried out with silica gel chromatography, and 2,4-dimethylpyrrole-3-carboxylic acid 2,2,3,3,4,4,4-heptafluoro-1-butyl (39.0 g) was obtained.

3,5-bis(4-methoxycarbonylphenyl)benzaldehyde (1.0 g) and the resulting 2,4-dimethylpyrrole-3-carboxylic acid 2,2,3,3,4,4,4-heptafluoro-1-butyl (3.6 g) were placed in a flask, dichloromethane (28 mL) and trifluoroacetic acid (1 drop) were added, and the result was stirred for 15 hours under a nitrogen atmosphere. 2,3-dichloro-5,6-dicyano-1,4-benzoquinone (2.5 g) was added, and the result was stirred for one hour. After completion of the reaction, a boron trifluoride-diethyl ether complex (2.1 mL) and diisopropylethylamine (3.2 mL) were added, the result was stirred for four hours, then water (100 mL) was added, the result was stirred, and the organic layer was separated. The organic layer was dried with magnesium sulfate and filtered, and then the solvent was distilled off. The resulting reaction product was purified with silica gel chromatography and a compound (1.1 g) was obtained. The results of $^1$H-NMR analysis of the resulting compound are as follows and confirmed that the compound was the compound G-1.

$^1$H-NMR (CDCl$_3$, ppm): 8.16 (d, 4H), 8.07 (s, 1H), 7.73 (d, 4H), 7.60 (s, 2H), 4.72 (t, 4H), 3.96 (s, 6H), 2.87 (s, 6H), 1.83 (s, 6H)

Synthesis Example 2

The method for synthesizing the compound G-27 of synthesis example 2 in the present invention is described below. In the method for synthesizing the compound G-27, 2,4-dimethylpyrrole-3-carboxylic acid (23.3 g), 3,5-bistrifluoromethylphenyl (50.0 g), DCC (34.5 g), DMAP (1.63 g), and toluene (550 mL) were placed in a flask and refluxed for two hours. The resulting solution was cooled with an ice bath to an internal temperature no greater than 10° C., then filtered, water (250 mL) was added to the filtrate, the result was stirred for 10 minutes, and then the organic layer was separated. The resulting organic layer was washed twice with water (250 mL), dried with magnesium sulfate, and filtered, and then the solvent was distilled off. The resulting solid was dissolved in toluene (250 mL), the result was purified with silica gel chromatography, and 2,4-dimethylpyrrole-3-carboxylic acid 3,5-bis(trifluoromethyl)phenyl (27.7 g) was obtained.

3,5-bis(4-methoxycarbonylphenyl)benzaldehyde (2.4 g) and the resulting 2,4-dimethylpyrrole-3-carboxylic acid 3,5-bis(trifluoromethyl)phenyl (5.0 g) were placed in a flask, dichloromethane (64 mL) and trifluoroacetic acid (5 drops) were added, and the result was stirred for 15 hours under a nitrogen atmosphere. 2,3-dichloro-5,6-dicyano-1,4-benzoquinone (1.75 g) was added, and the result was stirred for one hour. After completion of the reaction, a boron trifluoride-diethyl ether complex (3.2 mL) and diisopropylethylamine (4.6 mL) were added, the result was stirred for four hours, then water (100 mL) was added, the result was stirred, and the organic layer was separated. The organic layer was dried with magnesium sulfate and filtered, and then the solvent was distilled off. The resulting reaction product was purified with silica gel chromatography and a compound (1.95 g) was obtained. The results of $^1$H-NMR analysis of the resulting compound confirmed that the compound was the compound G-27.

Synthesis Example 3

The method for synthesizing the compound G-41 of synthesis example 3 in the present invention is described below. In the method for synthesizing the compound G-41, the compound G-27 (1.95 g) was placed in a flask, dichloromethane (25 mL), trimethylsilyl cyanide (3.5 mL), and a boron trifluoride-diethyl ether complex (0.75 mL) were added and the result was stirred for 18 hours. Then water (25 mL) was added, the result was stirred, and the organic layer was separated. The organic layer was dried with magnesium sulfate and filtered, and then the solvent was distilled off. The resulting reaction product was purified with silica gel chromatography and a compound (1.20 g) was obtained. The results of $^1$H-NMR analysis of the resulting compound are as follows and confirmed that the compound was the compound G-41.

$^1$H-NMR (CDCl$_3$, ppm): 8.16 (d, 4H), 8.07 (s, 1H), 7.77 (s, 2H), 7.73 (d, 4H), 7.64 (s, 4H) 7.60 (s, 2H), 3.97 (s, 6H), 3.19 (s, 6H), 1.99 (s, 6H)

Compounds other than those described above, i.e., G-2 to G-26, G-28 to G-40, G-42 to G-51, and G-101 to G-106 can be easily synthesized by changing the starting materials, such as the alcohol starting material and the aldehyde starting material.

In the examples and comparative examples below, a backlight unit was provided with color conversion films, a blue LED element (light emission peak wavelength: 445 nm), and a light guide, a color conversion film was laminated on one surface of the light guide, a prism sheet was laminated on the color conversion film, then a current was allowed to flow to light the blue LED element, and the initial light emission characteristics were measured with a spectral radiance meter (CS-1000 manufactured by Konica Minolta). The initial value at the time of the initial light emission characteristics measurement was set so that the brightness of light from the blue LED element was 800 cd/m$^2$ without the insertion of a color conversion film. Subsequently, light from the blue LED element was continuously irradiated at room temperature and the time until the light emission intensity dropped to a set amount was observed to evaluate the optical durability.

Example 1

In the example 1 of the present invention, an acrylic resin was used as the binder resin, and 0.25 parts by weight of the compound G-1 as the light-emitting material and 400 parts by weight of toluene as the solvent were mixed with 100 parts by weight of the acrylic resin. Subsequently, the mixture was stirred and defoamed at 300 rpm for 20 minutes with a planetary stirring/defoaming device, the "MAZERUSTAR KK-400" (manufactured by Kurabo Industries Ltd.), and the color conversion composition was obtained.

In the same manner, 300 parts by weight of toluene as the solvent was mixed with 100 parts by weight of the polyester resin as the binder resin. Subsequently, the solution was stirred and defoamed at 300 rpm for 20 minutes with a planetary stirring/defoaming device, the "MAZERUSTAR KK-400" (manufactured by Kurabo Industries Ltd.), and an adhesive composition was obtained.

The color conversion composition obtained as described above was applied with a slit die coater onto a "Lumirror" U48 (manufactured by Toray, thickness: 50 μm), which was the first substrate layer, the resultant was heated at 100° C. for 20 minutes and dried to form an (A) layer with an average thickness of 16 μm.

An adhesive composition obtained in the same manner was applied with a slit die coater to the PET substrate layer side of a "Chemical Matte" 125PW (manufactured by KIMOTO Co., Ltd., thickness: 138 μm), a light diffusion film that was the second substrate layer, the result was heated at 100° C. for 20 minutes and dried to form a (B) layer with an average thickness of 48 μm.

The two layers, i.e., the (A) layer and the (B) layer, were heat-laminated so that the color conversion layer of the (A) layer and the adhesion layer of the (B) layer were directly laminated to produce a color conversion film with a laminated configuration "first substrate layer/color conversion layer/adhesion layer/second substrate layer/light diffusion layer".

This color conversion film was used to color-convert the light (blue light) from the blue LED element, and when only the light-emission region of the green light was extracted, green emission light with a high color purity was obtained with a peak wavelength of 528 nm and a full width at half maximum of a light emission spectrum in the peak wavelength of 27 nm. The light emission intensity in the peak wavelength is a relative value with the light emission intensity in the comparative example 1 described below set to 1.00. The light emission intensity of the example 1 was 1.19. When light from the blue LED element was continuously irradiated at room temperature, the luminescence dropped 5% after 320 hours. The light emission material and the evaluation results of the example 1 are listed below in Table 2.

Examples 2 to 51 and Comparative Examples 1 to 6

In the examples 2 to 51 of the present invention and the comparative examples 1 to 6 contrasting to the present invention, a color conversion film was manufactured and evaluated the same was as in the example 1 for cases other than where the compounds (compounds G-2 to G-51 and G-101 to G-106) described in tables 2 to 4 were appropriately used as the light emission materials. The light emission material and the evaluation results of the examples 2 to 25 are listed below in Table 2. The light emission material and the evaluation results of the examples 26 to 51 are listed below in Table 3. The light emission material and the evaluation results of the comparative examples 1 to 6 are listed in Table 4. The light emission intensities (relative values) in the tables are at the peak wavelength and are relative values when the intensity in the comparative example 1 is set to 1.00 as in the example 1.

TABLE 2

| | Light-emitting material | Peak wavelength (nm) | Full width at half maximum (nm) | Light emission intensity (relative value) | Optical durability (h) |
|---|---|---|---|---|---|
| Example 1 | G-1 | 528 | 27 | 1.19 | 320 |
| Example 2 | G-2 | 527 | 28 | 1.22 | 300 |
| Example 3 | G-3 | 529 | 28 | 1.11 | 330 |
| Example 4 | G-4 | 528 | 28 | 1.15 | 320 |

TABLE 2-continued

| Light-emitting material | Peak wavelength (nm) | Full width at half maximum (nm) | Light emission intensity (relative value) | Optical durability (h) |
|---|---|---|---|---|
| Example 5 | G-5 | 527 | 27 | 1.01 | 330 |
| Example 6 | G-6 | 527 | 28 | 1.15 | 210 |
| Example 7 | G-7 | 527 | 28 | 1.10 | 330 |
| Example 8 | G-8 | 527 | 28 | 1.12 | 340 |
| Example 9 | G-9 | 528 | 28 | 1.14 | 300 |
| Example 10 | G-10 | 527 | 28 | 1.14 | 320 |
| Example 11 | G-11 | 529 | 27 | 1.14 | 310 |
| Example 12 | G-12 | 528 | 28 | 1.13 | 310 |
| Example 13 | G-13 | 527 | 27 | 1.15 | 330 |
| Example 14 | G-14 | 527 | 28 | 1.15 | 320 |
| Example 15 | G-15 | 529 | 28 | 1.15 | 320 |
| Example 16 | G-16 | 528 | 28 | 1.14 | 330 |
| Example 17 | G-17 | 527 | 27 | 1.14 | 340 |
| Example 18 | G-18 | 527 | 28 | 1.14 | 330 |
| Example 19 | G-19 | 529 | 28 | 1.13 | 350 |
| Example 20 | G-20 | 530 | 27 | 1.14 | 350 |
| Example 21 | G-21 | 530 | 28 | 1.14 | 340 |
| Example 22 | G-22 | 532 | 28 | 1.14 | 350 |
| Example 23 | G-23 | 527 | 28 | 1.20 | 320 |
| Example 24 | G-24 | 528 | 27 | 1.21 | 300 |
| Example 25 | G-25 | 527 | 28 | 1.20 | 350 |

TABLE 3

| Light-emitting material | Peak wavelength (nm) | Full width at half maximum (nm) | Light emission intensity (relative value) | Optical durability (h) |
|---|---|---|---|---|
| Example 26 | G-26 | 529 | 28 | 1.20 | 350 |
| Example 27 | G-27 | 528 | 27 | 1.21 | 360 |
| Example 28 | G-28 | 527 | 28 | 1.21 | 370 |
| Example 29 | G-29 | 527 | 28 | 1.22 | 380 |
| Example 30 | G-30 | 528 | 28 | 1.10 | 520 |
| Example 31 | G-31 | 527 | 28 | 1.11 | 540 |
| Example 32 | G-32 | 527 | 27 | 1.12 | 500 |
| Example 33 | G-33 | 527 | 28 | 1.11 | 520 |
| Example 34 | G-34 | 528 | 28 | 1.11 | 520 |
| Example 35 | G-35 | 527 | 28 | 1.12 | 530 |
| Example 36 | G-36 | 529 | 27 | 1.12 | 520 |
| Example 37 | G-37 | 528 | 27 | 1.21 | 520 |
| Example 38 | G-38 | 528 | 28 | 1.21 | 530 |
| Example 39 | G-39 | 527 | 28 | 1.22 | 570 |
| Example 40 | G-40 | 529 | 28 | 1.22 | 580 |
| Example 41 | G-41 | 528 | 27 | 1.23 | 650 |
| Example 42 | G-42 | 527 | 28 | 1.21 | 500 |
| Example 43 | G-43 | 527 | 28 | 1.23 | 660 |
| Example 44 | G-44 | 531 | 28 | 1.13 | 580 |
| Example 45 | G-45 | 530 | 28 | 1.14 | 570 |
| Example 46 | G-46 | 534 | 27 | 1.14 | 610 |
| Example 47 | G-47 | 534 | 28 | 1.13 | 660 |
| Example 48 | G-48 | 531 | 28 | 1.14 | 650 |
| Example 49 | G-49 | 539 | 27 | 1.14 | 660 |
| Example 50 | G-50 | 536 | 28 | 1.13 | 370 |
| Example 51 | G-51 | 536 | 28 | 1.13 | 650 |

TABLE 4

| Light-emitting material | Peak wavelength (nm) | Full width at half maximum (nm) | Light emission intensity (relative value) | Optical durability (h) |
|---|---|---|---|---|
| Comparative example 1 | G-101 | 535 | 40 | 1.00 | 100 |
| Comparative example 2 | G-102 | 528 | 28 | 1.13 | 100 |
| Comparative example 3 | G-103 | 527 | 27 | 1.13 | 10 |
| Comparative example 4 | G-104 | 540 | 58 | 1.13 | 20 |
| Comparative example 5 | G-105 | 529 | 29 | 0.89 | 110 |
| Comparative example 6 | G-106 | 530 | 30 | 0.88 | 120 |

INDUSTRIAL APPLICABILITY

As described above, the pyrromethene-boron complex, the color conversion composition, the color conversion film, the light source unit, the display, and the illumination apparatus according to the present invention are suitable for both improving color reproducibility and achieving high durability.

REFERENCE SIGNS LIST 1A, 1B, 1C, 1D color conversion film
10 substrate layer
11 color conversion layer
12 barrier film

The invention claimed is:
1. A pyrromethene-boron complex which is a compound represented by general formula (1),

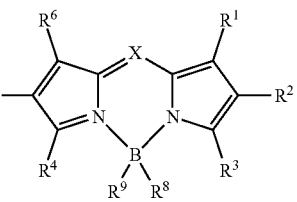

(1)

wherein in general formula (1), X is C—$R^7$ or N, $R^1$ to $R^7$ are each the same or different and are selected from among hydrogen, a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxy group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, a cyano group, an aldehyde group, a substituted or unsubstituted carbonyl group, a carboxy group, a substituted or unsubstituted oxycarbonyl group, a substituted or unsubstituted carbamoyl group, a substituted or unsubstituted ester group, a substituted or unsubstituted amide group, a substituted or unsubstituted acyl group, a substituted or unsubstituted sulfonyl group, a substituted or unsubstituted sulfonic acid ester group, a substituted or unsubstituted sulfonamide group, a nitro group, a substituted or unsubstituted silyl group, a substituted or unsubstituted siloxanyl group, a substituted or unsubstituted boryl group, and a substituted or unsubstituted phosphine oxide group, where $R^2$ and $R^5$ are selected from among the groups other than a substituted or unsubstituted aryl group and a substituted or unsubstituted heteroaryl group; $R^2$ and $R^5$ are groups not containing a heteroaryl group with at least two condensed rings; $R^8$ and $R^9$ are selected from among a substituted or unsubstituted alkyl group, a substituted or unsubstituted cycloalkyl group, a substituted or unsubstituted heterocyclic group, a substituted or unsubstituted alkenyl group, a substituted or unsubstituted cycloalkenyl group, a substituted or unsubstituted alkynyl group, a hydroxy group, a thiol group, a substituted or unsubstituted alkoxy group, a substituted or unsubstituted alkylthio group, a substituted or unsubstituted aryl ether group, a substituted or unsubstituted aryl thioether group, a substituted or unsubstituted aryl group, a substituted or unsubstituted heteroaryl group, a halogen, and a cyano group; and at least one of $R^1$ to $R^6$ is a group containing a fluorine atom.

2. The pyrromethene-boron complex according to claim 1, wherein at least two of $R^1$ to $R^6$ in the general formula (1) are groups containing a fluorine atom.

3. The pyrromethene-boron complex according to claim 1, wherein at least one of $R^2$ and $R^5$ in the general formula (1) is a group containing a fluorine atom.

4. The pyrromethene-boron complex according to claim 1, wherein $R^2$ and $R^5$ in the general formula (1) are groups containing a fluorine atom.

5. The pyrromethene-boron complex according to claim 1, wherein the group containing the fluorine atom in the general formula (1) is a fluorine-containing acyl group, a fluorine-containing ester group, a fluorine-containing amide group, a fluorine-containing sulfonyl group, a fluorine-containing sulfonic acid ester group, or a fluorine-containing sulfonamide group.

6. The pyrromethene-boron complex according to claim 1, wherein the group containing the fluorine atom in the general formula (1) is a fluorine-containing ester group.

7. The pyrromethene-boron complex according to claim 1, wherein at least one of $R^1$, $R^3$, $R^4$, and $R^6$ in the general formula (1) is a substituted or unsubstituted alkyl group, a substituted or unsubstituted aryl group, or a substituted or unsubstituted heteroaryl group.

8. The pyrromethene-boron complex according to claim 1, wherein $R^7$ in the general formula (1) is a substituted or unsubstituted aryl group, or a substituted or unsubstituted heteroaryl group.

9. The pyrromethene-boron complex according to claim 1, wherein the compound represented by the general formula (1) is a compound represented by general formula (2),

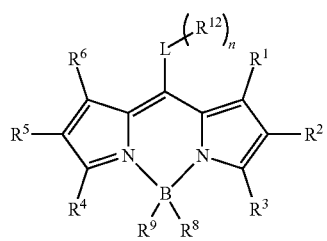

(2)

wherein in general formula (2), $R^1$ to $R^6$, $R^8$, and $R^9$ are the same as in the general formula (1), $R^{12}$ is a substituted or unsubstituted aryl group or a substituted or unsubstituted heteroaryl group, L is a substituted or unsubstituted arylene group or a substituted or unsubstituted heteroarylene group, and n is an integer of 1 to 5.

10. The pyrromethene-boron complex according to claim 1, wherein either $R^8$ or $R^9$ in the general formula (1) is a cyano group.

11. The pyrromethene-boron complex according to claim 1, wherein the compound represented by general formula (1) exhibits a light emission with a peak wavelength observed in a region of 500 nm to 580 nm inclusive, in response to excitation light.

12. A color conversion composition that converts incident light to light with a longer wavelength than a wavelength of the incident light, the color conversion composition comprising:
the pyrromethene-boron complex according to claim 1; and
a binder resin.

13. The color conversion composition according to claim 12, comprising:
a light-emitting material (a); and
a light-emitting material (b),
at least one of the light-emitting material (a) and the light-emitting material (b) being the pyrromethene-boron complex,
the light-emitting material (a) being a light-emitting material emitting, in response to excitation light, light having a peak wavelength observed in a region of 500 nm to 580 nm inclusive, and
the light-emitting material (b) being a light-emitting material emitting, in response to at least one of excitation by excitation light and light emission from the light-emitting material (a), light having a peak wavelength observed in a region of 580 nm to 750 nm inclusive.

14. The color conversion composition according to claim 13, wherein content $w_a$ of the light-emitting material (a) and content $w_b$ of the light-emitting material (b) have a relation $w_a \geq w_b$.

15. The color conversion composition according to claim 12, further comprising a solvent.

16. The color conversion composition according to claim 12, wherein the binder resin is a thermoplastic resin.

17. A color conversion film comprising a layer containing the color conversion composition according to claim 12 or a cured product thereof.

18. The color conversion film according to claim 17, further comprising a barrier film.

19. A light source unit comprising:
a light source; and
the color conversion film according to claim 17.

20. The light source unit according to claim 19, wherein the light source is a light-emitting diode having a maximum light emission in a wavelength range of 430 nm to 500 nm inclusive.

21. A display or an illumination apparatus comprising the color conversion film according to claim 17.

22. The pyrromethene-boron complex according to claim 1, wherein $R^1$ and $R^6$ in the general formula (1) are both neither a fluorine-containing aryl group nor a fluorine-containing alkyl group.

23. The pyrromethene-boron complex according to claim 1, wherein $R^8$ and $R^9$ in the general formula (1) are fluorine.

24. The pyrromethene-boron complex according to claim 1, wherein the pyrromethene-boron complex provides an optical durability more than 300 h to a color conversion film.

25. The pyrromethene-boron complex according to claim 1, wherein the pyrromethene-boron complex provides an optical durability in the range of 300 h to 660 h to a color conversion film.

* * * * *